US009818678B2

(12) United States Patent
Konno et al.

(10) Patent No.: US 9,818,678 B2
(45) Date of Patent: Nov. 14, 2017

(54) SEMICONDUCTOR DEVICE

(71) Applicant: Renesas Electronics Corporation, Kawasaki-shi, Kanagawa (JP)

(72) Inventors: Jumpei Konno, Kanagawa (JP); Takafumi Nishita, Kanagawa (JP); Nobuhiro Kinoshita, Kanagawa (JP); Kazunori Hasegawa, Kanagawa (JP); Michiaki Sugiyama, Kanagawa (JP)

(73) Assignee: Renesas Electronics Corporation, Tokyo (JP)

( * ) Notice: Subject to any disclaimer, the term of this patent is extended or adjusted under 35 U.S.C. 154(b) by 907 days.

(21) Appl. No.: 14/222,649

(22) Filed: Mar. 23, 2014

(65) Prior Publication Data
US 2014/0203431 A1 Jul. 24, 2014

Related U.S. Application Data

(60) Division of application No. 14/013,304, filed on Aug. 29, 2013, now Pat. No. 8,701,972, which is a (Continued)

(30) Foreign Application Priority Data

Jun. 30, 2011 (JP) ................................ 2011-145431

(51) Int. Cl.
H01L 21/48 (2006.01)
H01L 23/498 (2006.01)
(Continued)

(52) U.S. Cl.
CPC .... H01L 23/49811 (2013.01); H01L 21/4853 (2013.01); H01L 21/563 (2013.01);
(Continued)

(58) Field of Classification Search
CPC ...................... H01L 21/4853; H01L 23/49838
See application file for complete search history.

(56) References Cited

U.S. PATENT DOCUMENTS 6,229,711 B1 5/2001 Yoneda
6,281,567 B1 8/2001 Murayama et al.
(Continued)

FOREIGN PATENT DOCUMENTS

JP 07-211722 A 8/1995
JP 2000-003977 A 1/2000
(Continued)

OTHER PUBLICATIONS

Office Action dated May 24, 2016 in Japanese Patent Application No. 2015-153232.
(Continued)

*Primary Examiner* — Kevin E Yoon
(74) *Attorney, Agent, or Firm* — Shapiro, Gabor and Rosenberger, PLLC

(57) ABSTRACT

To improve reliability of a semiconductor device, in a flip-chip bonding step, a solder material that is attached to a tip end surface of a projecting electrode in advance and a solder material that is applied in advance over a terminal (bonding lead) are heated and thereby integrated and electrically connected to each other. The terminal includes a wide part (a first portion) with a first width W1 and a narrow part (a second portion) with a second width W2. When the solder material is heated, the thickness of the solder material arranged over the narrow part becomes smaller than the thickness of the solder material arranged in the wide part. Then, in the flip-chip bonding step, a projecting electrode is arranged over the narrow part and bonded onto the narrow part. Thus, the amount of protrusion of the solder material can be reduced.

19 Claims, 38 Drawing Sheets

Related U.S. Application Data continuation of application No. 13/531,566, filed on Jun. 24, 2012, now Pat. No. 8,534,532.

(51) Int. Cl.
    *H01L 23/00*     (2006.01)
    *H01L 21/683*     (2006.01)
    *H01L 21/56*     (2006.01)

(52) U.S. Cl.
    CPC .... *H01L 21/6836* (2013.01); *H01L 23/49816* (2013.01); *H01L 23/49838* (2013.01); *H01L 24/13* (2013.01); *H01L 24/16* (2013.01); *H01L 24/81* (2013.01); *H01L 24/85* (2013.01); *H01L 24/45* (2013.01); *H01L 2221/6834* (2013.01); *H01L 2221/68327* (2013.01); *H01L 2224/10175* (2013.01); *H01L 2224/1146* (2013.01); *H01L 2224/1147* (2013.01); *H01L 2224/11849* (2013.01); *H01L 2224/131* (2013.01); *H01L 2224/136* (2013.01); *H01L 2224/13082* (2013.01); *H01L 2224/13147* (2013.01); *H01L 2224/14153* (2013.01); *H01L 2224/14155* (2013.01); *H01L 2224/1601* (2013.01); *H01L 2224/16105* (2013.01); *H01L 2224/16225* (2013.01); *H01L 2224/16227* (2013.01); *H01L 2224/32225* (2013.01); *H01L 2224/45144* (2013.01); *H01L 2224/73204* (2013.01); *H01L 2224/814* (2013.01); *H01L 2224/81193* (2013.01); *H01L 2224/81194* (2013.01); *H01L 2224/81385* (2013.01); *H01L 2224/81444* (2013.01); *H01L 2224/83102* (2013.01); *H01L 2224/85* (2013.01); *H01L 2224/85203* (2013.01); *H01L 2224/94* (2013.01); *H01L 2924/00014* (2013.01); *H01L 2924/12042* (2013.01); *H01L 2924/15311* (2013.01); *H01L 2924/181* (2013.01)

(56) References Cited

U.S. PATENT DOCUMENTS

| | | | |
|---|---|---|---|
| 8,354,599 | B2 | 1/2013 | Ebe et al. |
| 8,534,532 | B2 | 9/2013 | Konno et al. |
| 8,698,296 | B2 | 4/2014 | Taoka et al. |

FOREIGN PATENT DOCUMENTS

| | | | |
|---|---|---|---|
| JP | 2000-77471 | A | 3/2000 |
| JP | 2005-259844 | A | 9/2005 |
| JP | 2005-268346 | A | 9/2005 |
| JP | 2008-060159 | A | 3/2008 |
| JP | 2009-016451 | A | 1/2009 |
| JP | 2010-278318 | A | 12/2010 |

OTHER PUBLICATIONS

Office Action dated Mar. 14, 2016, in Chinese Patent Application No. 201210229643.4.

Office Action dated Jan. 27, 2015, in Japanese Patent Application No. 2011-145431.

FIG. 13
(S1)
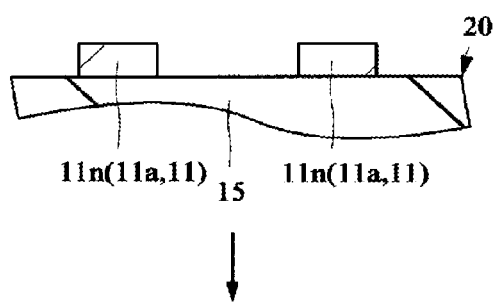
(S2)
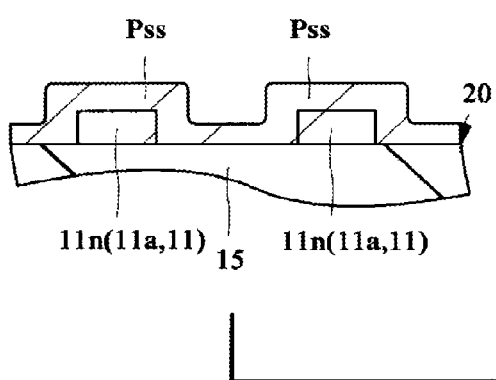
(S3)
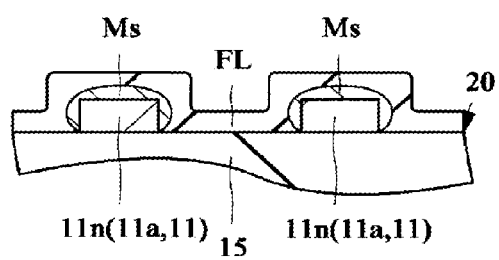
(S4)
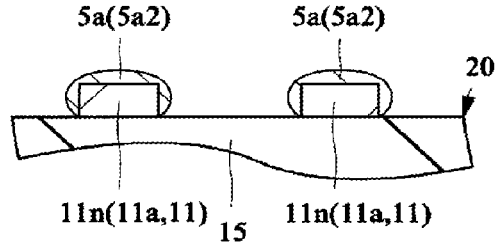

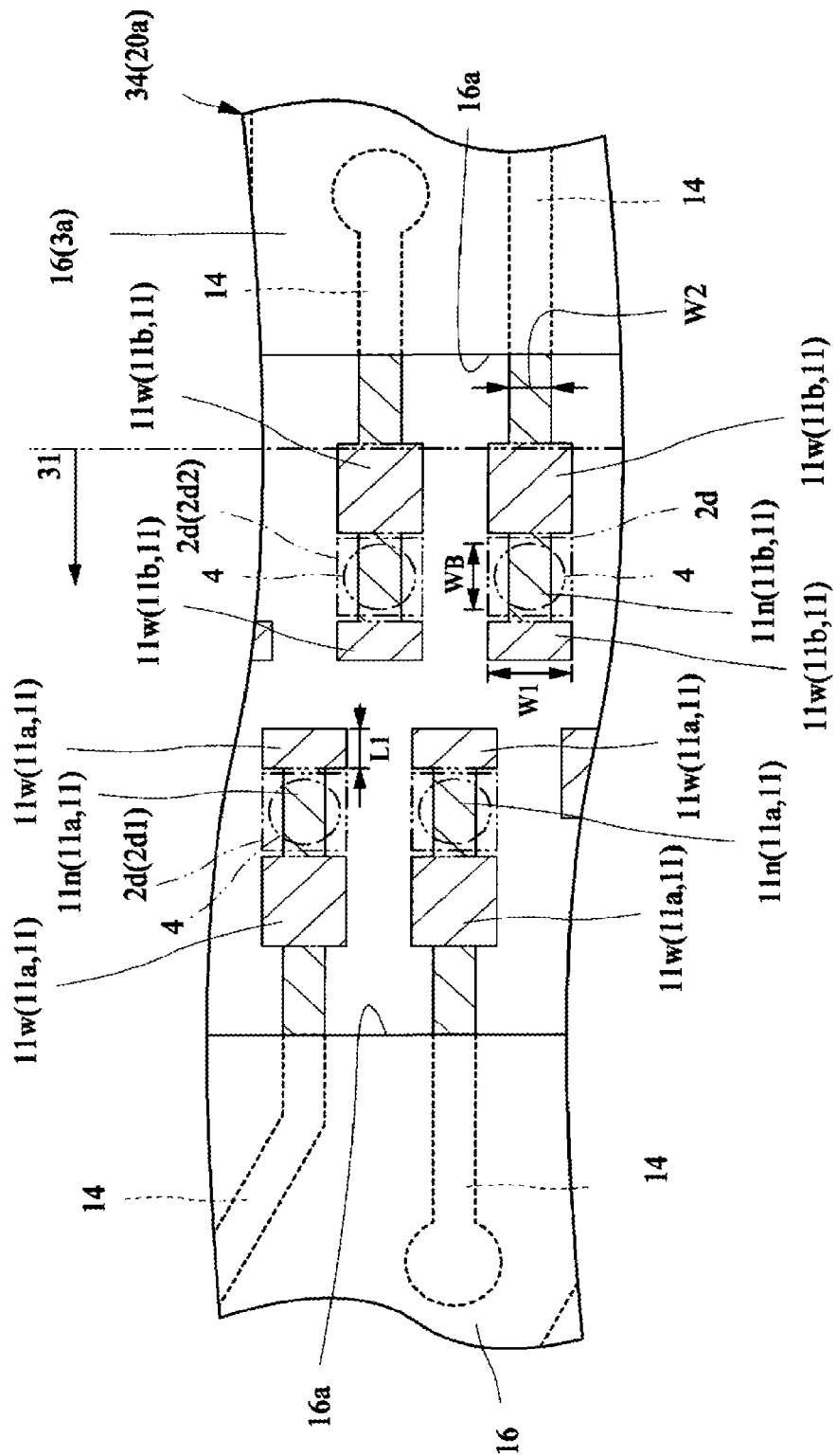

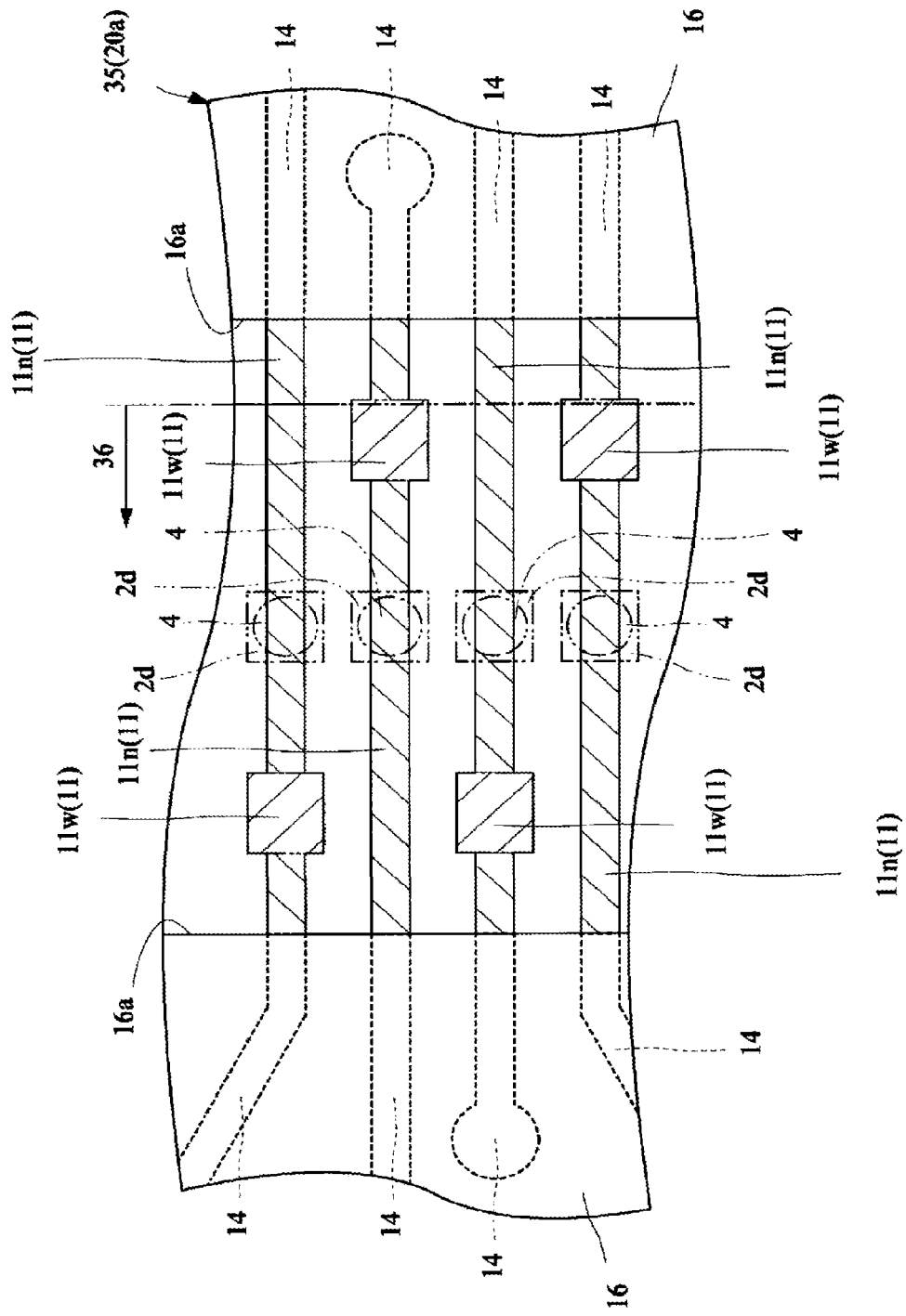

SEMICONDUCTOR DEVICE

CROSS-REFERENCE TO RELATED APPLICATION

The disclosure of Japanese Patent Application No. 2011-145431 filed on Jun. 30, 2011 including the specification, drawings and abstract is incorporated herein by reference in its entirety.

BACKGROUND

The present invention relates to technologies for manufacturing semiconductor devices, and in particular relates to a technology effectively applied to a semiconductor device in which a bump electrode of semiconductor chip is connected to a terminal of a substrate via a solder material.

Japanese Patent Laid-Open No. 2000-77471 (Patent Document 1) discloses a mounting method (a flip-chip mounting method), in which a bump electrode provided in a semiconductor chip and containing gold is connected to a bonding pad of a wiring substrate via a solder material.

SUMMARY

In the flip-chip mounting method, a projecting electrode (a bump electrode, a bump) is formed over a plurality of electrode pads of a semiconductor chip, respectively. Then, the projecting electrode is connected to a terminal on a wiring substrate side via, for example, a solder material so as to connect the semiconductor chip to the wiring substrate electrically. This projecting electrode is formed by a ball-bonding method that applies a wire-bonding technique, for example. Here, a metallic material containing gold (Au) as a principal component is used (e.g., see Patent Document 1). The present inventor has been studying the techniques for reducing the manufacturing cost of the semiconductor device that is manufactured by flip-chip bonding. As a part of that effort, the present inventor has studied a technology, in which the material of a projecting electrode is changed to a metallic material containing copper (Cu), for example, less expensive than gold (Au), as a principal component, and as a result has found the following problems.

In the flip-chip mounting method using a solder material, the solder material is applied onto a terminal on a wiring substrate side in advance, and then a projecting electrode and the solder material are brought into contact with each other and subjected to a reflow process (heat-treatment), thereby bonding the projecting electrode and the solder material. Here, when the material of the projecting electrode is copper (Cu), an oxide film is more likely formed in the surface of the projecting electrode than in the case of gold (Au). Therefore, in a bonding method, in which a solder material is simply applied onto a terminal on a wiring substrate side, the bonding strength decreases as compared with the case of the projecting electrode containing gold. Then, the present inventor has studied a bonding method, in which a solder material is applied in advance onto a terminal on a wiring substrate side and to the surface of the projecting electrode, respectively.

In the case of the bonding method, in which a solder material is applied in advance to the surface of a projecting electrode, because the oxidation of the surface of the projecting electrode containing copper (Cu), for example, can be prevented or suppressed by the solder material, a decrease in the bonding strength between the solder material and the projecting electrode can be suppressed. However, it has been found that if the solder material is applied in advance onto the terminal on a wiring substrate side and to the surface of a projecting electrode, respectively, the quantity of the solder material between the projecting electrode and the terminal will increase and the solder material will protrude into the periphery of the bonding region between the projecting electrode and the terminal. If the solder material protrudes into the periphery of the bonding region in this manner, then depending on a distance between the adjacent terminals (or between the projecting electrodes), the adjacent terminals may be electrically connected to each other via the protruded solder material and be shorted. That is, this causes degradation in the reliability of the semiconductor device. In other words, the prevention of the adjacent terminals (or the projecting electrodes) from being shorted even if the solder material protrudes results in a limiting factor in reducing the distances between a large number of terminals and improving the integration level of the terminals. That is, this results in a limiting factor in achieving the enhanced functionality (or miniaturization) of the semiconductor device.

The present invention has been made in view of the above-described problems, and provides a technology of improving the reliability of a semiconductor device.

Moreover, another object of the present invention is to provide a technology capable of reducing the manufacturing cost of a semiconductor device.

The other objects and the novel features of the present invention will become clear from the description of the present specification and the accompanying drawings.

The following explains briefly the outline of a typical invention among the present inventions disclosed in the present application.

That is, a method of manufacturing a semiconductor device according to an aspect of the present invention includes a flip-chip bonding step of electrically connecting, via a solder material, a plurality of projecting electrodes formed over the surface of the semiconductor chip and each having a first solder material attached to a tip end surface thereof, and a plurality of bonding leads of a wiring substrate. Here, the bonding leads each include a first portion having a first width in a plan view and a second portion integrally formed with the first portion and having a second width smaller than the first width in a plan view. Moreover, a plurality of second solder materials is applied to the bonding leads of the wiring substrate in advance. Then, in the flip-chip bonding step, the semiconductor chip is disposed over the wiring substrate so that the projecting electrodes overlap with the second portions of the bonding leads. Moreover, in the flip-chip bonding step, the second solder material is melted by applying heat to the second solder material.

The following explains briefly the effects obtained by the typical invention among the present inventions disclosed in the present application.

That is, according to an aspect of the present invention, the reliability of a semiconductor device can be improved.

BRIEF DESCRIPTION OF THE DRAWINGS

FIG. 13 is an explanatory view schematically showing an example of the method of forming a solder material shown in FIG. 12;

FIG. 41 is an enlarged plan view showing a variant of the wiring substrate shown in FIG. 39; and FIG. 42 is an enlarged plan view showing another variant of FIG. 39.

DETAILED DESCRIPTION

Figure 1:
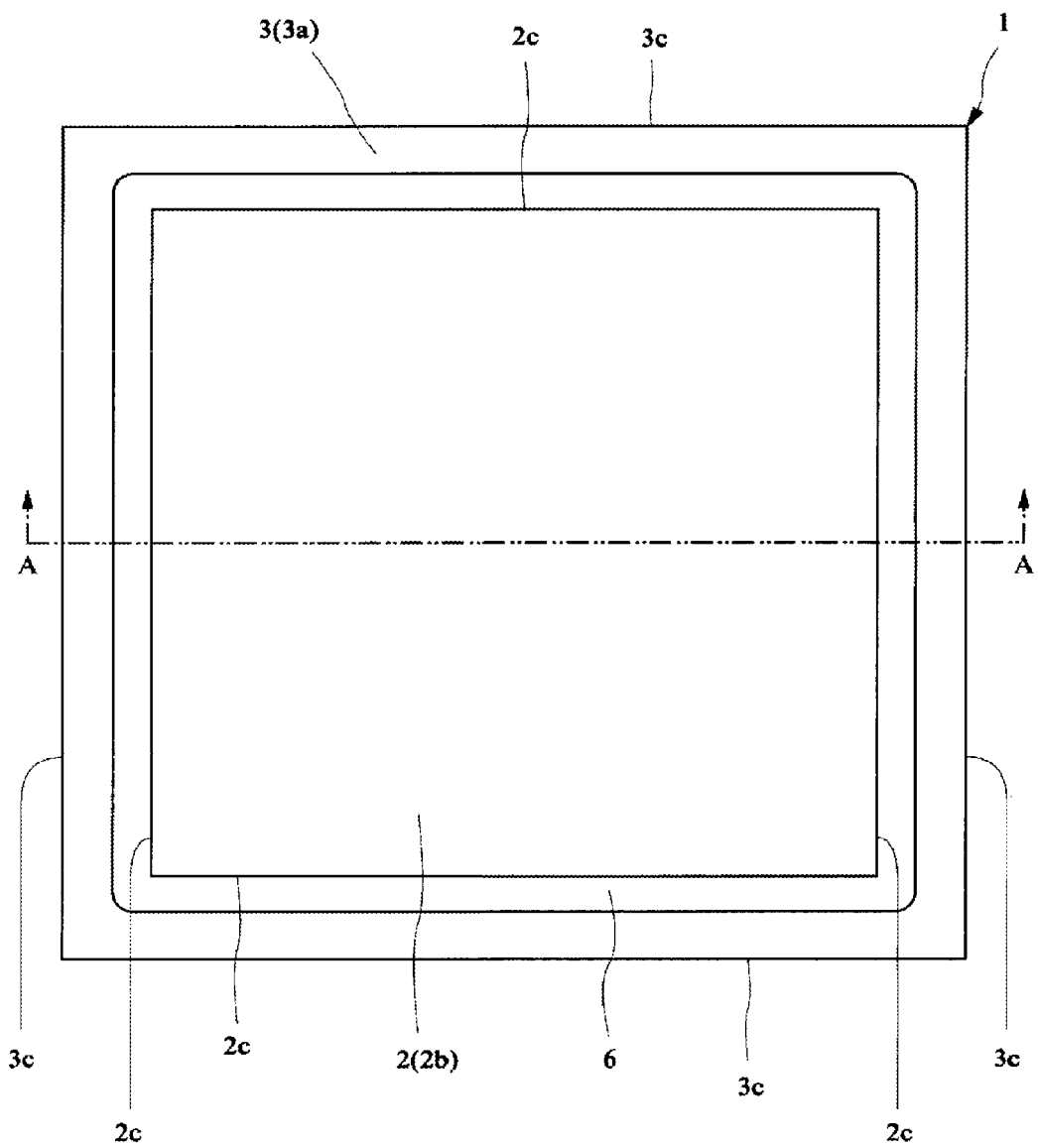
FIG. 1 is a plan view showing an overall structure on a chip mounting surface side of a semiconductor device of an embodiment of the present invention.

Explanation of the Description Form, the Basic Terminology, and the Usage in the Present Application In the present application, the embodiment will be described, divided into a plural sections or the like, if necessary for convenience. Except for the case where it shows clearly in particular, they are not mutually independent, and regardless of before or after the description, are each part of a single example, and one has relationships such as some details of another, or some or entire of another. Moreover, in principle, the duplicated description of a similar portion is omitted. Furthermore, in the following embodiment, each element is not necessarily indispensable unless otherwise specially stated, or unless theoretically restricted to a specified number of the elements, or unless the context clearly dictates otherwise.

Similarly, when described as "X is constituted by A" and so on with regard to the material, the composition, or the like in the embodiment or the like, X including elements other than "A" shall not be excluded unless otherwise specially stated or unless the context clearly dictates otherwise. For example, speaking of the component, "X is constituted by A" means "X containing A as a principal component" and so on. For example, it is needless to say that even referring to a "silicon member" or the like, it is not limited to pure silicon but includes a member containing a SiGe (silicon germanium) alloy, a multi-element alloy containing silicon as a principal component, other additives, and the like. Moreover, even referring to gold plating, a Cu layer, nickel plating, or the like, it shall include not only a pure one but members each containing gold, Cu, nickel, or the like as a principal component, unless otherwise specially stated.

Furthermore, when referring to a specific numeric value or amount, they may be greater or smaller than the specific number unless otherwise specially stated, or unless theoretically restricted to a specified number, or unless the context clearly dictates otherwise Moreover, in each view of the embodiment, the same or similar portion will be represented by the same or similar symbol or reference numeral, and the description thereof will not be repeated in principle.

Moreover, in the accompanying drawings, when the drawing becomes otherwise complicated or when a cross section is clearly discriminated from a space, hatching or the like may be omitted even in a sectional view. In this regard, when clear from the description or the like, the outline of a background may be omitted even if it is a planarly closed hole. Furthermore, even if it is not a cross section, in order to clarify that it is not a space or in order to clarify the boundary of a region, hatching or a dot pattern may be applied.

<Semiconductor Device>

Figure 2:
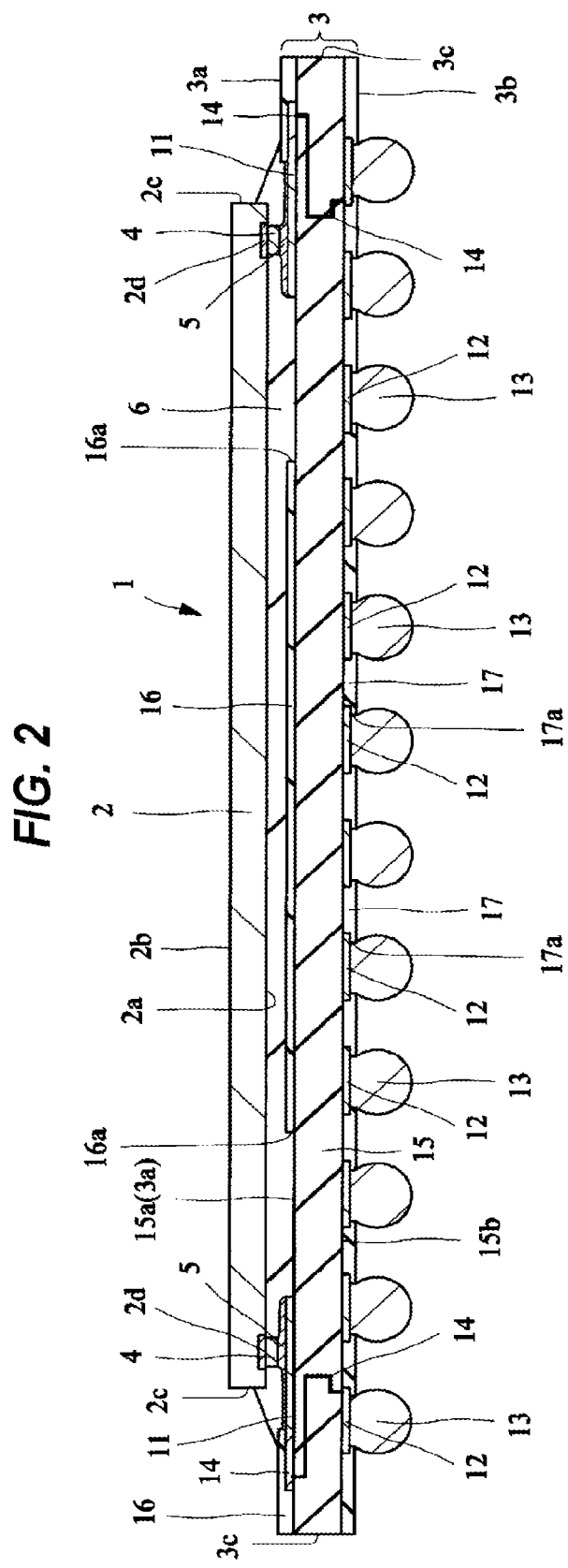
FIG. 2 is a cross sectional view along an A-A line of FIG. 1.
Figure 3:
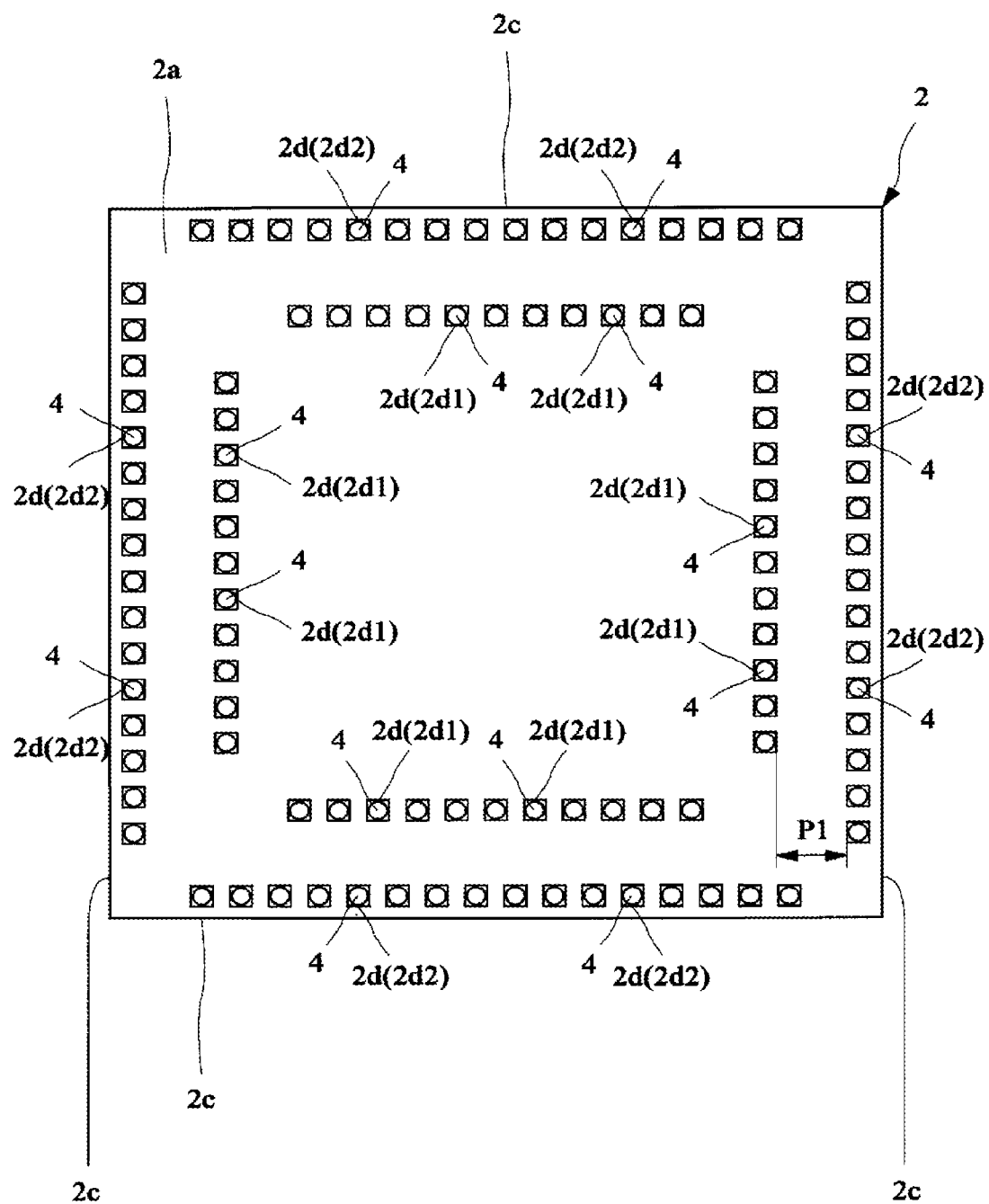
FIG. 3 is a plan view showing a front surface (surface facing a wiring substrate) side of the semiconductor chip shown in FIG. 1.
Figure 4:
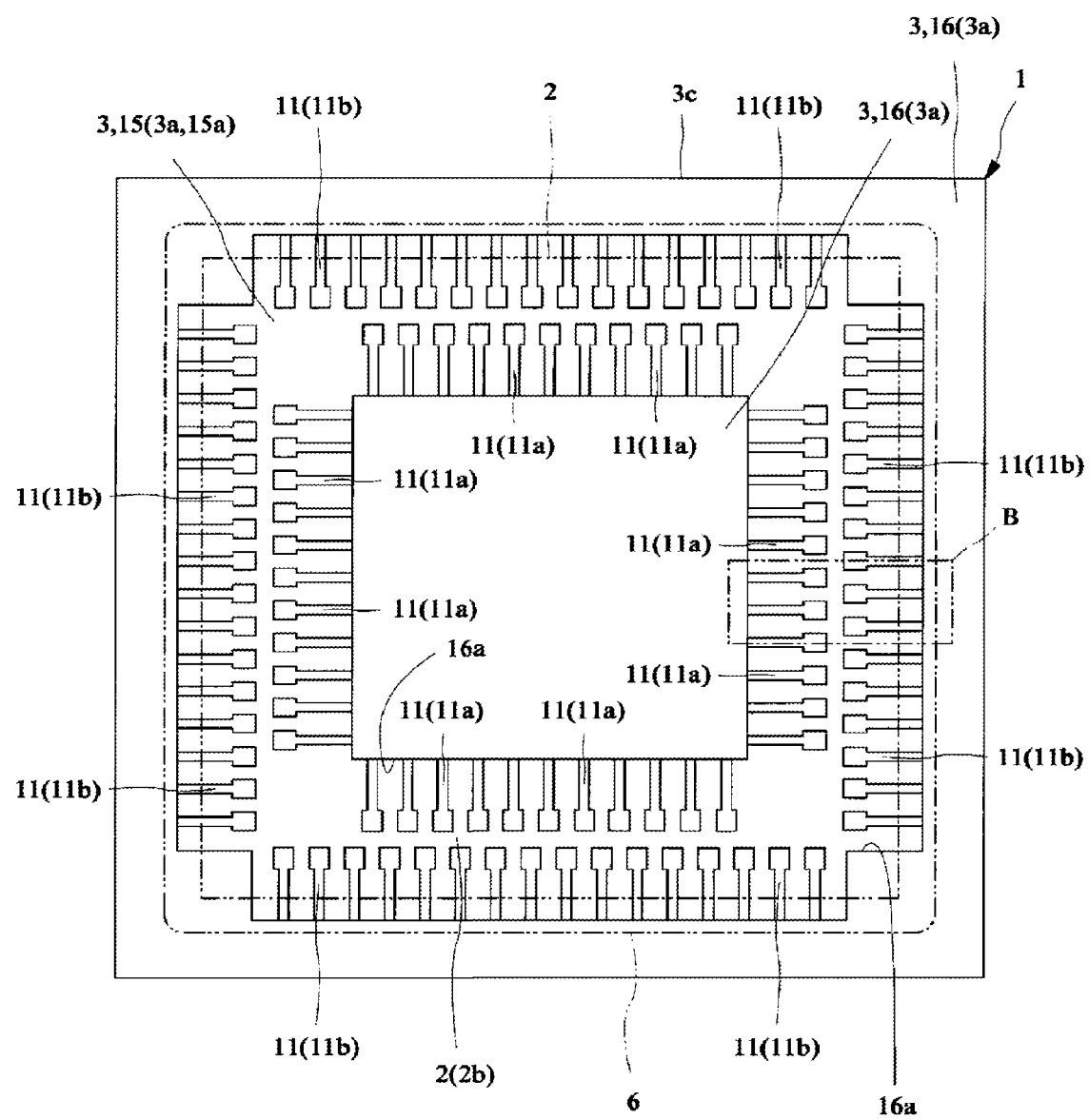
FIG. 4 is a plan view showing a chip mounting surface side of the wiring substrate, with the semiconductor chip shown in FIG. 1 removed.
Figure 5:
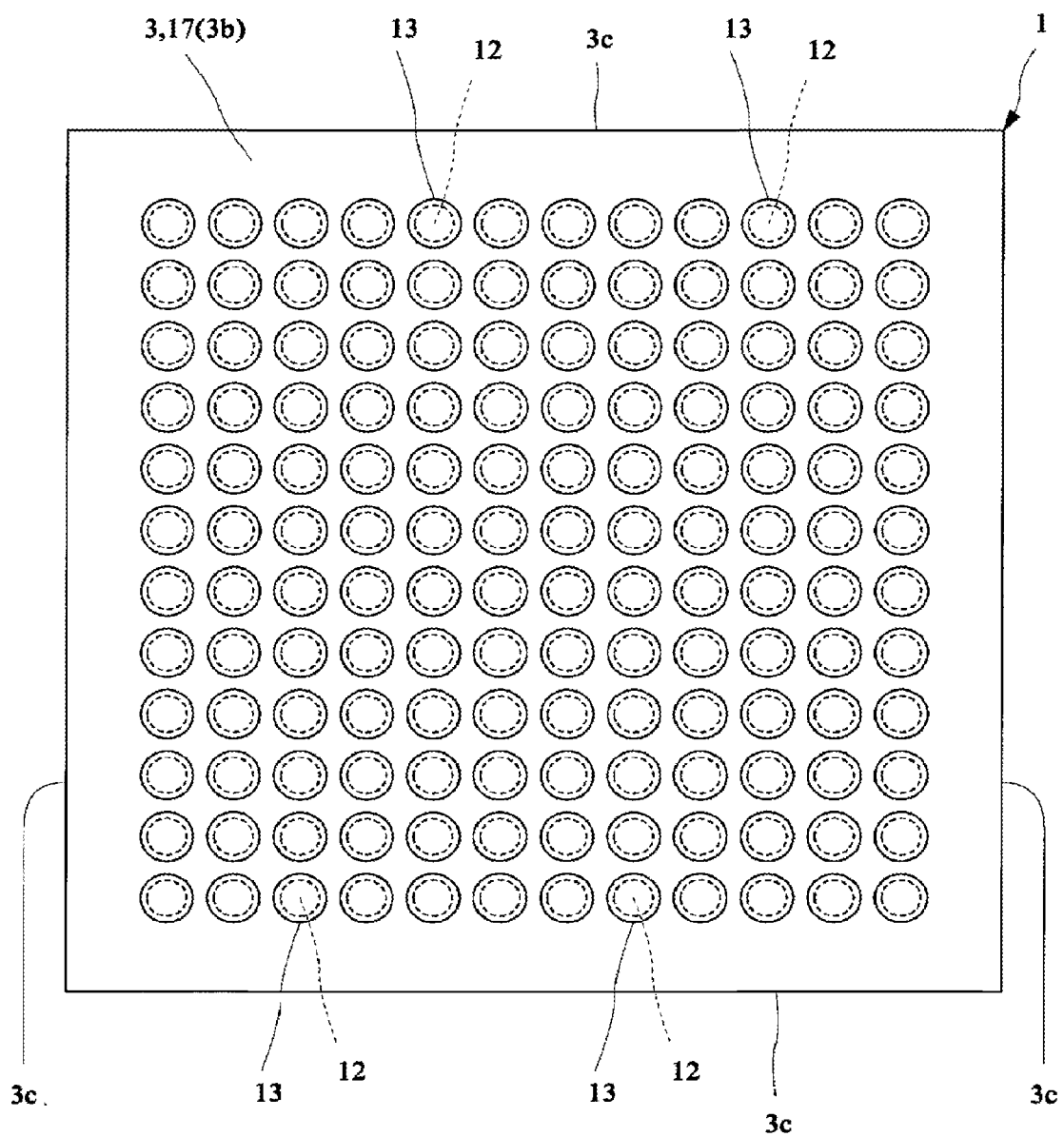
FIG. 5 is a plan view showing a rear surface (a mounting surface) side of the semiconductor device shown in FIG. 1.

FIG. 1 is a plan view showing an overall structure on a chip mounting surface side of a semiconductor device of an embodiment of the present invention, and FIG. 2 is a cross sectional view along an A-A line of FIG. 1. Moreover, FIG. 3 is a plan view showing a front surface (surface facing a wiring substrate) side of the semiconductor chip shown in FIG. 1. FIG. 4 is a plan view showing a chip mounting surface side of a wiring substrate with the semiconductor chip shown in FIG. 1 removed. FIG. 5 is a plan view showing a rear surface (mounting surface) side of the semiconductor device shown in FIG. 1. Note that, in FIG. 2 to FIG. 5, in order to make it easy to see the shape of a pad $2d$ or a terminal 11 which a semiconductor device 1 of the embodiment includes, the planar dimensions of each of a plurality of pads $2d$ or terminals 11 are shown larger than the dimensions that are illustratively described below.

As shown in FIG. 1, the semiconductor device 1 of the embodiment includes: a semiconductor chip 2; and a wiring substrate (base, interposer) 3, i.e., a base in which the semiconductor chip 2 is mounted, electrically connected to the semiconductor chip 2.

The semiconductor chip 2 includes a front surface $2a$ (see FIG. 2, FIG. 3) and a rear surface $2b$ (see FIG. 1, FIG. 2) positioned on the opposite side of the front surface $2a$, the front surface $2a$ and the rear surface $2b$ each forming a quadrangle in a plan view. For example, in an example shown in FIG. 3, the planar shape of the semiconductor chip 2 is a square, one side of which has the length of approximately 5 mm. Moreover, the semiconductor chip 2 includes a side face $2c$ (see FIG. 2) positioned between the front surface $2a$ and the rear surface $2b$. Moreover, the semiconductor chip 2 includes a semiconductor substrate (the illustration is omitted) constituted by silicon, for example, and a plurality of semiconductor elements (the illustration is omitted), such as a transistor, is formed in the major surface (element forming surface) of the semiconductor substrate. Over the major surface of the semiconductor substrate, a wiring layer (the illustration is omitted) including plurality of wirings and an insulating film isolating between the wirings are stacked. The wirings of the wiring layer are electrically connected to the semiconductor elements, respectively, to constitute an integrated circuit. Moreover, in the front surface $2a$ (see FIG. 3) of the semiconductor chip 2, the pads (electrode pads, bonding pads, chip electrodes) $2d$ are formed. The pads $2d$ are formed in the top layer of the wiring layers stacked over the semiconductor substrate, and are electrically connected to the semiconductor elements via the wirings of the wiring layer. Moreover, the front surface $2a$ of the semiconductor chip 2 is covered with an insulating film, such as silicon oxide ($SiO_2$), while over the pads $2d$, an opening portion is formed in the insulating film covering the front surface $2a$. Then, in the opening portion, the pad $2d$ is exposed from the insulating film. In this manner, the pads $2d$ formed in the front surface $2a$ of the semiconductor chip 2 are electrically connected to the semiconductor elements which the semiconductor chip 2 includes, and serve as an external terminal (electrode) of the semiconductor chip 2, respectively.

In the embodiment, for example, as shown in FIG. 3, the pads $2d$ are arranged along four side faces (sides) $2c$ of the semiconductor chip 2, respectively. The front surface $2a$ of the semiconductor chip 2 is partitioned into a main circuit forming region (logic circuit forming region) where a main circuit (core circuit), such as a logic circuit, is formed, and an input/output terminal forming region (I/O region) where the pads $2d$ are arranged. In the example shown in FIG. 3, the main circuit forming region is formed in the center of the front surface $2a$, and the input/output terminal forming region is arranged so as to surround the main circuit forming region. By partitioning the main circuit forming region from the input/output terminal forming region in this manner, even if, for example, a stress is generated in the pads $2d$, the influence on the main circuit can be suppressed. Moreover, the input/output terminal forming regions are put together in the peripheral portion of the front surface $2a$, so that the number of the pads $2d$ that are external terminals can be increased, and the area of the main circuit forming region can be increased. In the embodiment, along four side faces $2c$ of the semiconductor chip 2, the pads $2d$ are arranged in multiple rows (two rows in FIG. 3), respectively. In other words, the semiconductor chip 2 includes a plurality of first row pads $2d1$ arranged along the side face $2c$ and a plurality of second row pads $2d2$ arranged between the first row pads $2d1$ and the side face $2c$. Note that, in the embodiment, the first row pads $2d1$ and the second row pads $2d2$ are arranged outside the main circuit forming region (the illustration is omitted), but in the case where a configuration capable of relaxing the stress is employed for the pad $2d$ or in the case where the stress is not considered, the first row pad $2d1$, for example, may be arranged inside the main circuit forming region. The first row pad $2d1$ and the second row pad $2d2$ are provided corresponding to each of the four side faces $2c$ of the semiconductor chip 2. By arranging the pads $2d$ in multiple rows, respectively, along the side face $2c$ in this manner, the number of pads $2d$ can be increased further than the case where they are arranged in one row. In this manner, when the pads $2d$ are arranged in multiple rows, as shown in FIG. 3, the so-called staggered arrangement, in which the first row pads $2d1$ and the second row pads $2d2$ are alternately arranged along the side face $2c$, is preferable. By arranging the pads $2d$ in a staggered manner, a wiring $2e$ (see FIG. 8 described later) can be arranged between the adjacent first row pads $2d1$ to connect to the second row pad $2d2$ electrically. In other words, the first row pad $2d1$ can be arranged between the wirings connected to the second row pad 2*d*2. Therefore, an increased efficiency of the wiring layout (a reduction in the pitch) over the major surface of the semiconductor chip 2 can be achieved, so that the number of the pads 2*d* that are external terminals can be increased and the area of the main circuit forming region can be increased.

As shown in FIG. 1 and FIG. 2, the semiconductor chip 2 is mounted to the wiring substrate 3. The wiring substrate 3 includes an upper surface (a chip mounting surface, a front side) 3*a* (see FIG. 2, FIG. 4) and a lower surface (a mounting surface, a rear surface) 3*b* (see FIG. 2, FIG. 5) positioned on the opposite side of the upper surface 3*a*, the upper surface and the lower surface each forming a quadrangle in a plan view. For example, in the example shown in FIG. 3, the planar shape of the wiring substrate 3 is a square, one side of which has the length of approximately 7 mm to 8 mm. Moreover, the wiring substrate 3 includes a side face 3*c* (see FIG. 2) positioned between the upper surface 3*a* and the lower surface 3*b*. As shown in FIG. 4, a plurality of terminals (bonding leads) 11 is arranged in the upper surface 3*a* of the wiring substrate 3. More specifically, the wiring substrate 3 includes an insulating layer (a core layer, a core material) 15. In an upper surface 15*a* of the insulating layer 15, a conductor pattern including the terminals 11 and a wiring connected to the terminal 11, and constituted by, for example, copper (Cu), the conductor pattern, is formed. The conductor pattern is covered with a solder resist film (an insulating film, a protection film) 16 formed over the upper surface 15*a*. In the solder resist film 16, an opening portion 16*a* is formed at a position where the terminals 11 are arranged, and the terminals 11 are exposed from the solder resist film 16 in the opening portion 16*a*. In a plan view, the terminals 11 are arranged at a position where they overlap with the pads 2*d* (see FIG. 3) of the semiconductor chip 2. Therefore, in the embodiment, along each side (each side of the chip mounting portion forming a quadrangle in a plan view) of the chip mounting region that is a region overlapping with the semiconductor chip 2, the terminals 11 are arranged, respectively. In the chip mounting portion, also in the embodiment, along each side of the chip mounting region that is a region overlapping with the semiconductor chip 2, the pads 2*d* are arranged in multiple rows (two rows in FIG. 4), respectively. In other words, the upper surface 3*a* of the wiring substrate 3 includes a plurality of first row terminals (first row bonding leads) 11*a* arranged along each side of the chip mounting region and a plurality of second row terminals (second row bonding leads) 11*b* arranged between the first row terminals 11*a* and each side of the chip mounting region. Furthermore, in other words, the terminals 11 include the first row terminals 11*a* electrically connected to the first row pads 2*d*1 and the second row terminals 11*b* electrically connected to the second row pads 2*d*2. Moreover, the first row terminal 11*a* and the second row terminal 11*b* are arranged at a position, where they face the pad 2*d* (see FIG. 3) of the semiconductor chip 2, respectively, and therefore they are arranged in a staggered manner corresponding to the arrangement of the pads 2*d*.

On the other hand, as shown in FIG. 5, in the lower surface 3*b* of the wiring substrate 3, a plurality of lands (external terminals) 12 that are the external terminals of the semiconductor device 1 is arranged. A plurality of solder balls (mounting terminals, bonding material) 13 is bonded to the lands 12. More specifically, as shown in FIG. 2, the wiring substrate 3 includes an insulating layer (a core layer, a core material) 15. In a lower surface 15*b* of the insulating layer 15, a conductor pattern including the lands 12 and a wiring connected to the lands 12 and constituted by, for example, copper (Cu) is formed. The conductor pattern is covered with a solder resist film (an insulating film, a protection film) 17 that is formed so as to cover the lower surface 15*b*. In the solder resist film 17, an opening portion 17*a* is formed at a position where the land 12 is arranged, and the lands 12 are exposed from the solder resist film 17 in the opening portion 17*a*. Moreover, the solder ball 13 bonded to the land 12 is of a conductive bonding material which, in mounting the semiconductor device 1 to a non-illustrated mounting substrate, electrically connects the terminals on the mounting substrate side to the lands 12. Moreover, as shown in FIG. 5, in a plan view, the lands 12 and the solder balls 13 are arranged in a matrix (in an array). As with the semiconductor device 1, a package, in which the lands 12 (or solder balls 13) that are external terminals are arranged in a matrix in the mounting surface, is called an area array type semiconductor device. In the area array type semiconductor device 1, because the lower surface 3*b* of the wiring substrate 3 serving as the mounting surface can be effectively utilized as an arranging space for external terminals, the number of terminals can be increased while suppressing an increase in the mounting area.

Moreover, as schematically shown in FIG. 2, the terminals 11 of the wiring substrate 3 are electrically connected to a plurality of lands 12 via a plurality of wirings 14 that electrically connects the upper surface 3*a* side to the lower surface 3*b* side of the wiring substrate 3. In this manner, the wiring substrate 3, in electrically connecting non-illustrated mounting substrate to the semiconductor chip 2, serves as an interposer that relays between the semiconductor chip 2 and the mounting substrate. Note that, in FIG. 2, although the wirings 14 are schematically shown using a straight line, respectively, the wirings 14 include a wiring routed in each wiring layer which the wiring substrate 3 includes, and an interlayer wiring (a via wiring) electrically connecting between a plurality of wiring layers which the wiring substrate 3 includes. Moreover, in FIG. 2, the wiring substrate 3 including four layers of wiring layers (a total of four layers: the first layer in the upper surface 15*a* of the insulating layer 15; the second layer and the third layer between the upper surface 15*a* and the lower surface 15*b*; and the fourth layer in the lower surface 15*b*) is shown as an example, but the number of wiring layers is not limited to four and can be modified according to the number of terminals or to the wiring layout.

In the embodiment, as shown in FIG. 2, the semiconductor chip 2 is mounted over the wiring substrate 3 by the so-called flip-chip mounting method (face-down mounting method), with the front surface 2*a* of the semiconductor chip 2 facing the upper surface 3*a* of the wiring substrate 3. The terminals 11 are arranged at positions facing the pads 2*d* of the semiconductor chip 2, and are electrically connected to the pads 2*d* via a plurality of projecting electrodes (columnar electrodes) 4 and the solder material 5 as shown in FIG. 2. Moreover, the semiconductor chip 2 is fixed onto the upper surface 3*a* of the wiring substrate 3 via the projecting electrodes 4 and the solder material 5. That is, the projecting electrodes 4 formed over the pad 2*d* are bonded to the terminal 11 via the solder material 5, so that the semiconductor chip 2 is fixed onto the wiring substrate 3 and also is electrically connected to the wiring substrate 3.

The projecting electrode 4 of the embodiment is constituted by, for example, copper (Cu), and is a columnar electrode forming a cylindrical shape. Note that, the shape of the projecting electrode 4 is not restricted only to the cylindrical shape, but may be a rectangular columnar shape. Usually, as the constituent material of a projecting electrode bonded to the electrode pad of a semiconductor chip, gold (Au) other than copper (Cu) may be used, but by using the projecting electrode 4 constituted by copper (Cu) as with the embodiment 4, the material cost can be significantly reduced. Moreover, the solder material 5 and the solder ball 13 of the embodiment are constituted by the so-called lead-free solder that does not essentially contain lead (Pb), and is constituted by, for example, only tin (Sn), a tin-Bis film (Sn—Bi), tin-silver (Sn—Ag), tin-silver-copper (Sn—Ag—Cu), or the like. Here, the lead-free solder means solders with the content of lead (Pb) equal to or less than 0.1 wt %, and this content is specified as the standard of RoHS (Restriction of Hazardous Substances) Directive.

Moreover, between the front surface 2a of the semiconductor chip 2 and the upper surfaces 3a of the wiring substrate 3, an underfill resin (sealant) 6 is arranged and the bonding portion between the pad 2d and the terminal 11 is sealed with the underfill resin 6. In this manner, by sealing the bonding portion between the pad 2d and the terminal 11 with the underfill resin 6, a stress generated in the periphery of the bonding portion between the pad 2d and the terminal 11 can be distributed and relaxed. However, the flip-chip mounting method is not limited to the embodiment in which the underfill resin 6 is arranged between the semiconductor chip 2 and the wiring substrate 3 as shown in FIG. 2, but can be applied, as a variant, to configurations in which the underfill resin 6 is not arranged.

<Peripheral Structure of the Terminal Bonding Portion>

Figure 6:
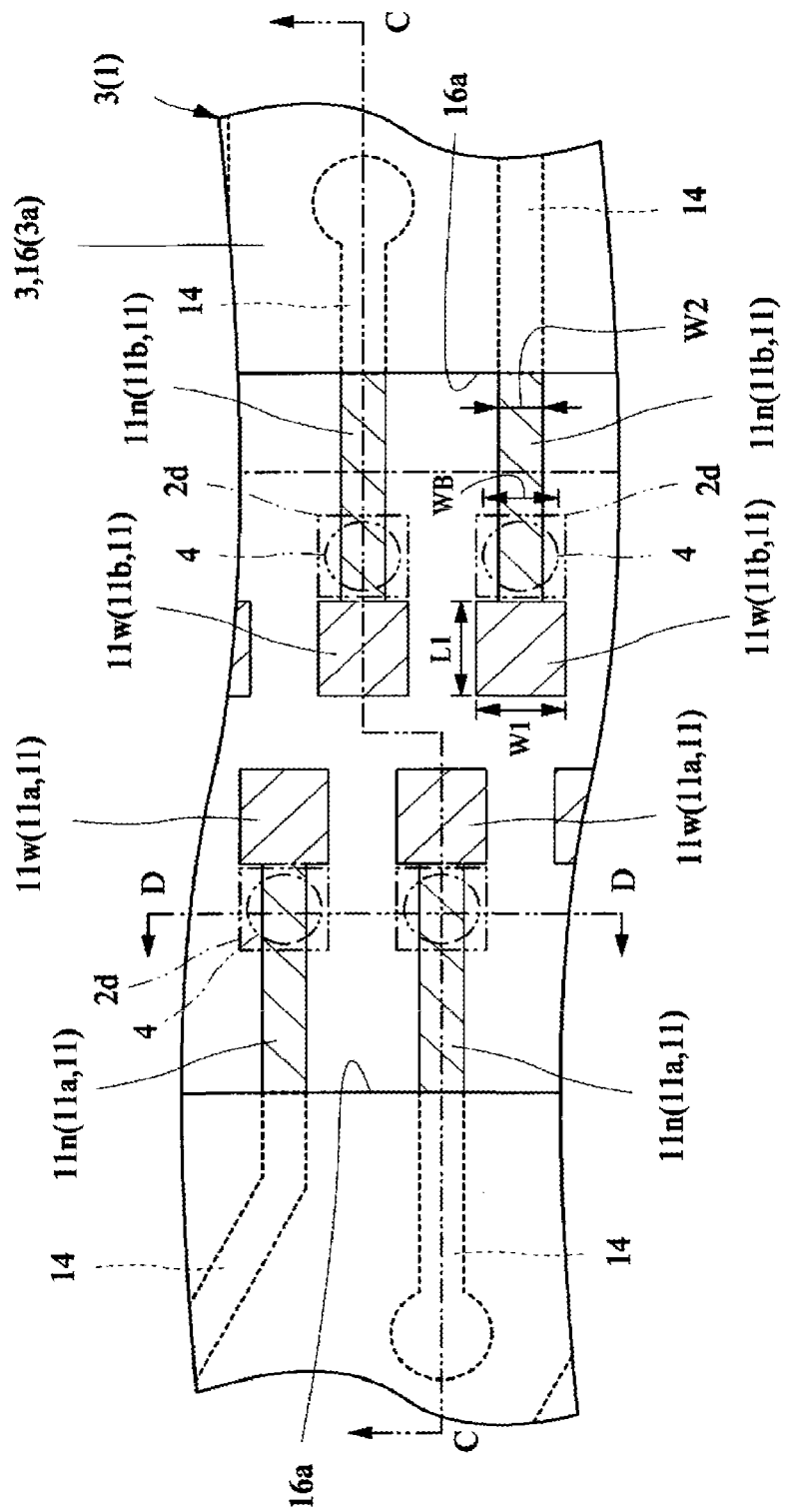
FIG. 6 is an enlarged plan view showing a planar positional relationship between a terminal and a projecting electrode in a B portion of FIG. 4.
Figure 7:
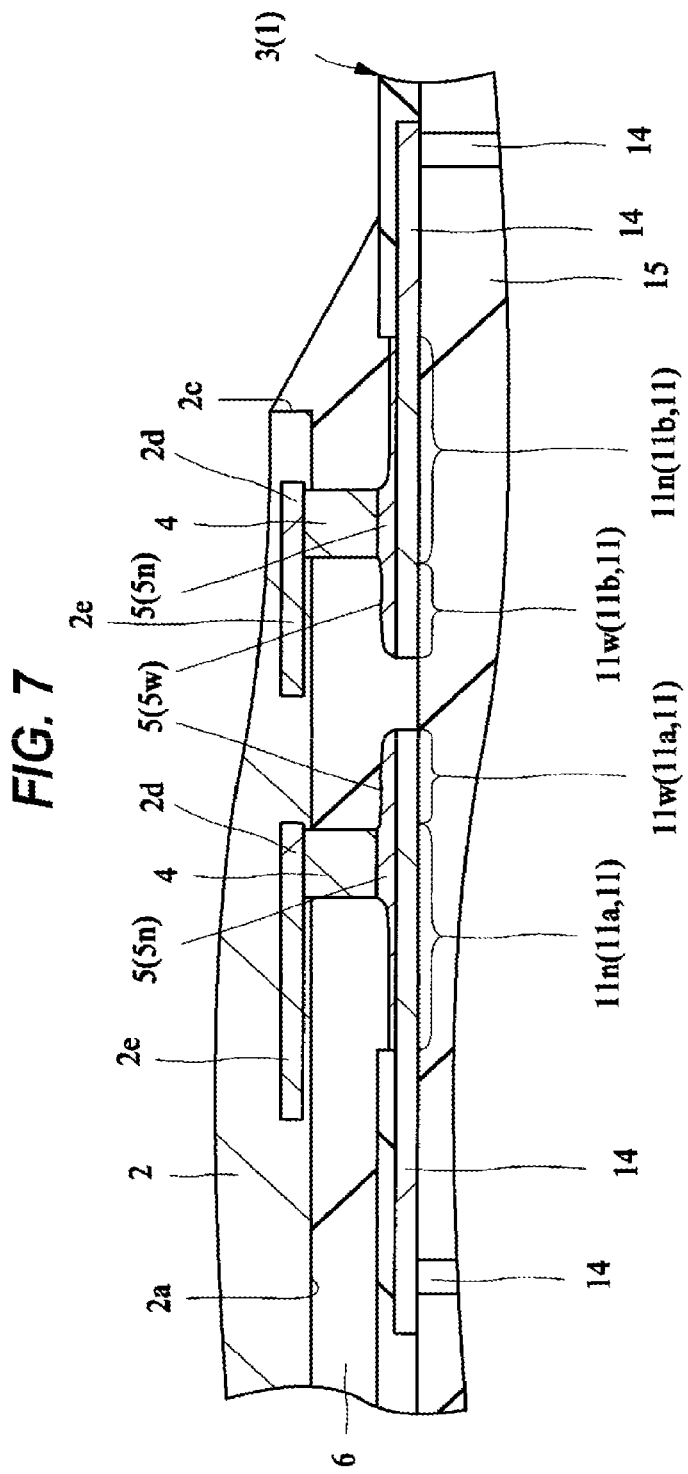
FIG. 7 is an enlarged sectional view along a C-C line of FIG. 6.
Figure 8:
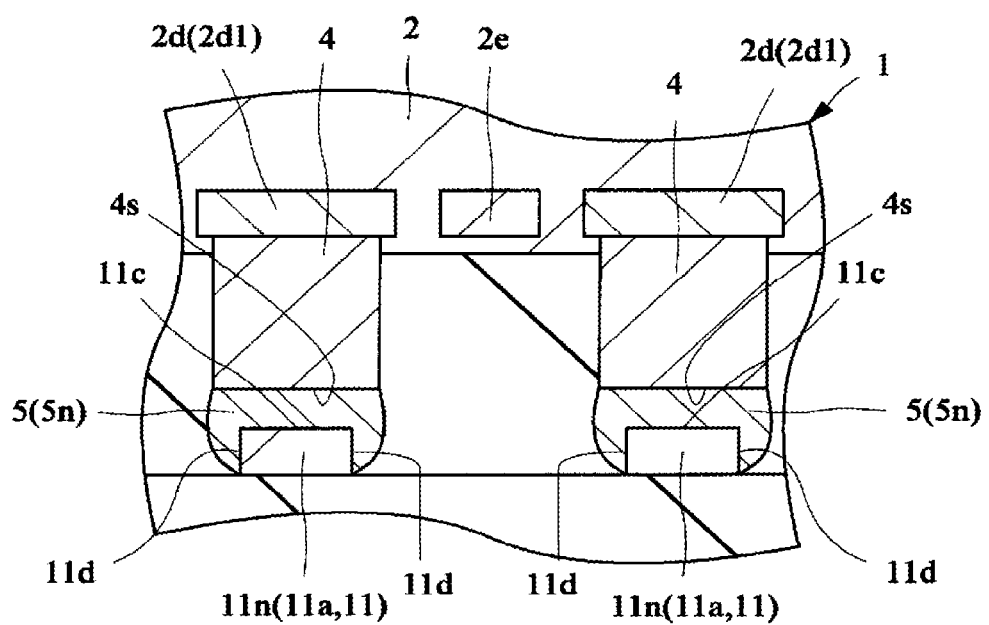
FIG. 8 is an enlarged sectional view along a D-D line of FIG. 6.
Figure 9:
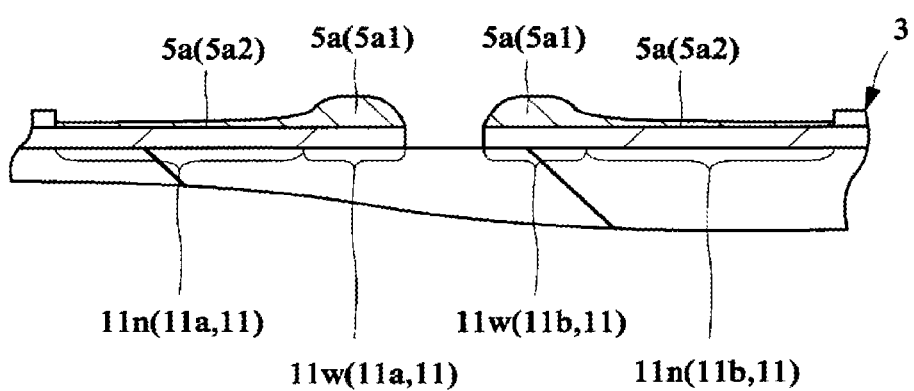
FIG. 9 is an enlarged sectional view showing a state where a solder material is applied in advance before connecting a projecting electrode to the wiring substrate shown in FIG. 7.

Next, the detailed structure in the periphery of the bonding portion between the pad 2d and the terminal 11 shown in FIG. 2 is described. FIG. 6 is an enlarged plan view showing a planar positional relationship between the terminal and the projecting electrode in a B portion of FIG. 4. FIG. 7 is an enlarged sectional view along a C-C line of FIG. 6 and FIG. 8 is an enlarged sectional view along a D-D line of FIG. 6. FIG. 9 is an enlarged sectional view showing a state where a solder material is applied in advance before connecting the projecting electrode to the wiring substrate shown in FIG. 7.

As shown in FIG. 6, each of the terminals 11 includes a wide part (portion) 11w having a width (length in a direction intersecting the direction in which the terminal 11 extends) W1 in a plan view and a narrow part (portion) 11n having a width (length in the direction intersecting the direction in which the terminal 11 extends) W2 smaller than the width W1 in a plan view, the narrow part (portion) being integrally formed with the wide part (portion) 11w. In the embodiment, the width W1 of the wide part (portion) 11w is nearly equal to a width (diameter in plan view) WB of the projecting electrode 4, and is approximately 30 µm, for example. On the other hand, the width W2 of the narrow part (portion) 11n is smaller (narrower) than the width W1, and is approximately 20 µm, for example. Then, the projecting electrodes 4 (pads 2d) are arranged at positions where they overlap with the narrow part (portion) 11n of the terminals 11, respectively, and are connected to the terminals 11 via the solder material 5 shown in FIG. 7 and FIG. 8.

From a view point of increasing the closely contacted area between the solder material 5 and the terminal 11 in a region facing the projecting electrode 4, the projecting electrode 4 is preferably arranged at a position where it overlaps with the wide part (portion) 11w. However, in the embodiment, the projecting electrode 4 is arranged at a position where it overlaps with the narrow part (portion) 11n from the reasons below. The projecting electrode 4 of the embodiment is constituted by copper (Cu) that is easily oxidized as compared with gold (Au). Then, if an oxide film is formed in the surface of the projecting electrode 4, the wettability of the solder material 5 will degrade, and therefore the bonding strength between the solder material 5 and the projecting electrode 4 will decrease. For this reason, with the surface of the projecting electrode 4 covered in advance with a solder material (a solder material serving as the raw material of the solder material 5), the projecting electrode 4 is subjected to a heat treatment (local reflow process) and bonded to the terminal 11. On the other hand, the terminal 11 of the embodiment is constituted by copper (Cu) as described above. Therefore, as with the case of the projecting electrode 4, if an oxide film is formed in the surface of the terminal 11, the wettability of the solder material 5 will decrease and therefore the bonding strength between the solder material 5 and the terminal 11 will decrease. For this reason, with the surface of the terminal 11 covered in advance with a solder material (a solder material serving as the raw material of the solder material 5), the terminal is subjected to a heat treatment (local reflow process) and bonded to the projecting electrode 4. In this manner, the bonding strength of the bonding portion between the projecting electrode 4 and the terminal 11 can be improved by bonding the projecting electrode 4 to the terminal 11, with the raw material of the solder material 5 applied in advance to the surface of the projecting electrode 4 and the surface of the terminal 11, respectively.

However, when the projecting electrode 4 is bonded to the terminal 11, with a material serving as the raw material of the solder material 5 applied in advance to the surface of the projecting electrode 4 and the surface of the terminal 11, respectively, the quantity of the solder material will increase in order to reliably cover the surface of the terminal 11 and the projecting electrode 4. In particular, when a solder material serving as the raw material of the solder material 5 is applied to the surface of the terminal 11 by printing (the detail is described later), the thickness thereof becomes approximately 15 µm to 18 µm. It has been found that for this reason, the quantity of the solder material 5 for integrally forming the solder material applied to each of the projecting electrode 4 and the terminal 11 will increase, and if a gap between the surface (the tip end surface 4s) of the projecting electrode 4 and the surface (the upper surface) of the terminal 11 becomes narrow by mounting the semiconductor chip 2, then a part of the solder material 5 interposed between the surface (the tip end surface 4s) of the projecting electrode 4 and the surface (the upper surface) of the terminal 11 protrudes into the periphery of the bonding region (for example, between the adjacent projecting electrodes 4 shown in FIG. 8). If the solder material 5 protrudes into the periphery of the bonding region, then depending on the distance between the adjacent terminals 11 (or between the projecting electrodes 4), the adjacent terminals 11 can be electrically connected and shorted to each other via the protruded solder material 5. That is, this causes degradation in the reliability of the semiconductor device. In other words, the prevention of the adjacent terminals 11 (or the projecting electrodes 4) from being shorted even if the solder material protrudes results in a limiting factor in reducing the distances between a large number of terminals and improving the integration level of the terminals. That is, this results in a limiting factor in achieving the enhanced functionality (or miniaturization) of the semiconductor device.

As the countermeasure for the above-described problem, the following techniques can be contemplated. One technique, in which the surface of the terminal 11 constituted by copper (Cu) is covered with, for example, a metal film constituted by a material, such as gold (Au), that is more difficult to be oxidized than copper (Cu), may be contemplated in order to prevent or suppress the formation of an oxide film in the surface of the terminal 11. In this case, even if a solder material serving as the raw material of the solder material 5 is not applied to the surface of the terminal 11 in advance, a decrease in the wettability of the solder material 5 in the surface of the terminal 11 can be suppressed. However, in this case, because the terminal 11 and the projecting electrode 4 are bonded to each other only using the solder material applied to the projecting electrode 4, the quantity of the solder material 5 becomes in short, thus causing a decrease in the bonding strength. Moreover, when the quantity of the solder material 5 is small, the solder material 5 will flow into the periphery of the bonding portion during a reflow process, thus causing a conduction failure between the projecting electrode 4 and the terminal 1. Another technique, in which the solder material serving as the raw material of the solder material 5 is applied to (formed in) the surface of the terminal 11 by plating, may be contemplated. For example, with an electrolysis plating method, the solder material (solder film) serving as the raw material of the solder material 5 can be applied with a thickness of approximately 5 μm. However, in order to apply (form) the solder material by electrolysis plating, each of the terminals 11 needs to be connected to a wiring for feeding a current (a power supply wiring). That is, there is a need to secure a space for arranging the power supply wiring for electrolysis plating in the wiring substrate 3, and thus the miniaturization of the wiring substrate becomes difficult. In addition, the degree of freedom of the layout of the wiring 14 connected to the terminal 11 of the wiring substrate 3 will decrease. Moreover, in the case where the solder material is applied (formed) by electroless plating, the power supply wiring does not have to be arranged but an unevenness easily occurs in the applied solder material. In other words, the solder material may not be formed at a position facing the projecting electrode 4 of the terminal 11. Moreover, in the electroless plating method, because the plating film is deposited by reduction, the terminal 11 constituted by copper (Cu) is corroded by the used plating liquid and when the projecting electrode 4 is bonded to the narrow part (portion) 11n of the terminal 11, as with the embodiment, a bonding failure will easily occur.

Then, the present inventor has studied in light of the above-described problem and found a configuration shown in FIG. 6 to FIG. 8. That is, each of the terminals 11 includes the wide part (portion) 11w having the width W1 in a plan view and the narrow part (portion) 11n having the width W2 smaller than the width W1 in a plan view, the narrow part (portion) 11n being integrally formed with the wide part (portion) 11w. Then, the projecting electrode 4 is arranged at a position where it overlaps with the narrow part (portion) 11n, and is bonded via the solder material 5. In other words, the bonding region for bonding the projecting electrode 4 overlaps with the narrow part (portion) 11n of the terminal 11. In the technique of applying a solder material to the surfaces of the terminals 11 by printing, a solder component and a solder paste containing a flux component (component for activating the solder component), or a large number of solder particles (solder powder) and flux paste (paste containing a flux component) are applied to the surface of the terminal 11. Then, if a heat treatment (reflow process) is carried out with a flux component and a solder composition in contact with each other, the solder component will melt and be integrated with the flux component. At this time, the melted solder component (melted solder), under the influence of a surface tension of the melted solder, deforms so as to be a physically stable shape.

Here, when the planar shape of the terminal 11, to which the solder material is applied, is not a simple shape, such as a simple square, the melted solder will, under the influence of a surface tension, deform in accordance with the shape of the terminal 11. That is, in a metallic pattern extending in a certain direction, when a portion with a wide width and a portion with a narrow width are present, the melted solder tends to easily gather toward the portion with a wide width. When applied to an example shown in FIG. 6, a lot of melted solder gathers to the wide part (portion) 11w, and a dome-shaped (hemispherical) solder material (solder lump) 5a1 is formed following the shape of the wide part (portion) 11w, as shown in FIG. 9. On the other hand, over the narrow part (portion) 11n shown in FIG. 6, particularly in a region adjacent to the wide part (portion) 11w, because the melted solder moves toward the wide part (portion) 11w, the quantity of a solder material (solder film) 5a2 formed by the melted solder becomes less than the wide part (portion) 11w, as shown in FIG. 9. Then, when the melted solder is cooled and the residual substance and the like of the flux component are removed by cleaning, the solder material (solder material serving as the raw material of the solder material 5) is applied (formed) onto the terminal 11, with the shape, which is formed by a surface tension of the melted solder, retained. That is, among the solder material 5a applied (formed) onto the surface of the terminal 11 in advance, the quantity (thickness) of the solder material 5a2 provided in the narrow part (portion) 11n becomes smaller (thinner) than the quantity (thickness) of the solder material 5a1 provided in the wide part (portion) 11w. In other words, in the embodiment, each of the terminals 11 has a shape including the wide part (portion) 11w and the narrow part (portion) 11n, so that, for example, even if the technique of applying the solder material 5a by printing is used, the solder material 5a2 can be stably formed thin. For example, in the embodiment, the thickness of the solder material 5a1 (distance from the upper surface of the terminal 11 to the highest point of the solder material 5a1) is equal to or greater than 10 μm. However, when the solder material 5a is applied by printing, the thickness of the solder material 5a1 is in particular preferably set equal to or greater than 20 μm. On the other hand, the thickness of the solder material 5a2 (distance from the upper surface of the terminal 11 to the highest point of solder material 5a2) is equal to or less than 7 μm. However, when the thickness of the solder material 5a1 is set equal to or greater than 20 μm, the thickness of the solder material 5a2 may become equal to or less than 10 μm.

Thus, according to the embodiment, the thickness of the solder material 5a2 applied (formed) onto the narrow part (portion) 11n can be stably thinned. For this reason, the projecting electrode 4 (see FIG. 7) is arranged over the solder material 5a2, which is formed thin, (that is, at a position where it overlaps with the narrow part 11n) and is bonded to the solder material 5a2, so that the quantity of the solder material 5 for connecting the terminal 11 to the projecting electrode 4 can be controlled to a proper quantity, as shown in FIG. 7 and FIG. 8. Accordingly, a degradation in the reliability of the semiconductor device 1 caused by the solder material 5 protruding into the periphery of the bonding region can be prevented or suppressed. In other words, the reliability of the semiconductor device 1 can be improved. Moreover, in the embodiment, because the solder material 5a can be stably formed by printing, the wiring for electrolysis plating (the power supply wiring) is not provided in the wiring substrate 3. Accordingly, the arrangement space of the power supply wiring and the periphery space thereof can be omitted, and therefore the planar size of the wiring substrate 3 can be reduced. In other words, the mounting area of the semiconductor device 1 can be reduced. Moreover, by not providing the power supply wiring, the degree of freedom of the wiring layout design can be improved. According to the embodiment, the printing method can be applied as the method of applying the solder material 5a, and therefore even if the wiring substrate is mass-produced, it can be stably mass-produced. In the case where the above-described technique is applied, if the projecting electrode 4 is bonded to the solder material 5a1 arranged over the wide part (portion) 11w, among the solder material 5a shown in FIG. 9, then a part of the solder material 5a1 will move to the projecting electrode 4 side, but most of the solder material 5a1 will remain over the wide part (portion) 11w as shown in FIG. 7. Accordingly, in the semiconductor device 1 of the embodiment to which the above-described technique is applied, among the solder material 5 for bonding the terminal 11 and the projecting electrode 4, the thickness of the solder material 5w arranged on the wide part (portion) 11w side from the bonding portion (a region sandwiched by the tip end surface 4s and the terminal 11) between the solder material 5 and the projecting electrode 4 becomes larger than the thickness of the solder material 5a2 arranged on the narrow part (portion) 11n side from the bonding portion between the solder material 5 and the projecting electrode 4 (on the opposite side of the wide part (portion) 11w). However, among the solder materials 5, the thickness of the solder material arranged in the bonding portion (a region sandwiched by the tip end surface 4s and the narrow part 11n) between the solder material 5 and the projecting electrode 4 may become larger than the solder material 5w arranged over the wide part (portion) 11w under the influence of a surface tension.

Note that, as a variant of the embodiment, even when the solder material 5a is formed by applying techniques other than the printing method, if the solder material applied onto the terminal 11 is subjected to a heat treatment and is melted, the melted solder will deform in accordance with the shape of the terminal 11 as described above. Accordingly, even in cases where, for example, the plating method (the electrolysis plating method or electroless plating method) is applied, when the plating film of a solder material is deposited with a thickness equal to or greater than approximately 10 μm, for example, it is effective to apply the above-described structure of the embodiment and melt the solder material before bonding the projecting electrode 4, and form the shown in FIG. 9 solder material 5a.

Moreover, from a view point of stably thinning the thickness of the solder material 5a2, the widths of the wide part (portion) 11w and the narrow part (portion) 11n provided in the terminal 11 may be set to relatively different widths, and therefore, for example, as a variant of the terminal 11 shown in FIG. 6, the width W1 of the wide part (portion) 11w may be set wider than the width (the diameter in a plan view) WB of the projecting electrode 4, thereby setting the width W2 of the narrow part (portion) 11n nearly equal to the width of the projecting electrode 4. However, from a view point of reducing the planar dimensions of the terminals 11, as shown in FIG. 6, it is preferable that the width W1 of the wide part (portion) 11w is set nearly equal to the width WB of the projecting electrode 4 and that the width W2 of the narrow part (portion) 11n is set smaller than the width of the projecting electrode 4. In this case, as shown in FIG. 8, a part of the tip end surface (the surface facing the upper surface 11c of the terminal 11) 4s of the projecting electrode 4 is arranged so as to protrude to the outside of the terminal 11. Accordingly, from a view point of suppressing a decrease in the bonding strength due to bonding the projecting electrode 4 to a position where it overlaps with the narrow part (portion) 11n, the solder material 5n is preferably formed so as to cover the upper surface 11c and both side faces 11d of the terminal 11. Because this can increase the contact area between the solder material 5n and the terminal 11, a decrease in the bonding strength can be suppressed.

<Method of Manufacturing the Semiconductor Device>

Figure 10:
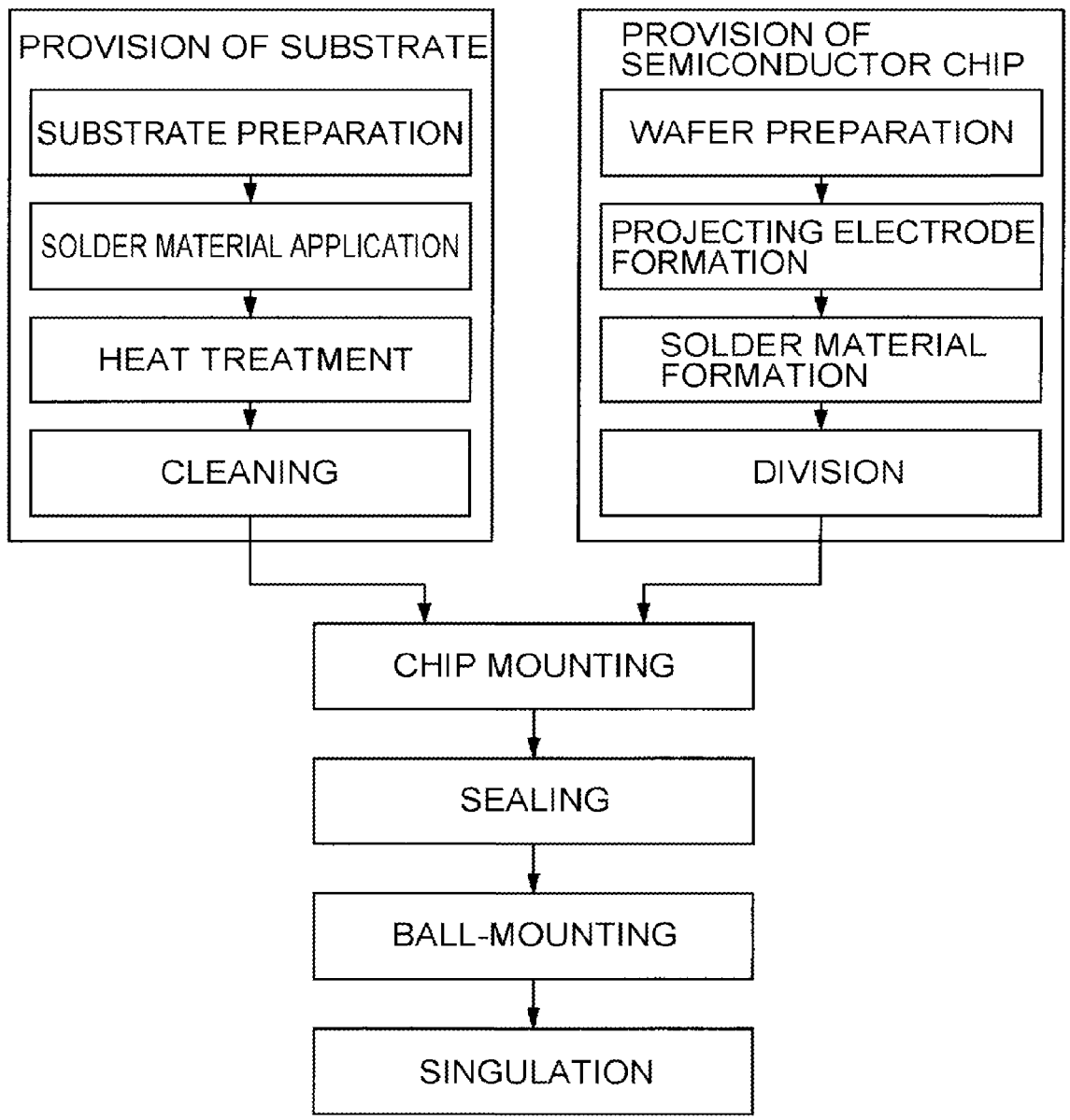
FIG. 10 is an explanatory view showing an overview of the steps of manufacturing the semiconductor device of one embodiment of the present invention.

Next, a method of manufacturing the semiconductor device of the embodiment is described. The semiconductor device 1 in the embodiment is manufactured following a flow shown in FIG. 10. FIG. 10 is an explanatory view showing an overview of the steps of manufacturing the semiconductor device of the embodiment. The detail of each step will be described below using FIG. 11 to FIG. 31.

<Substrate Preparation Step>

Figure 11:
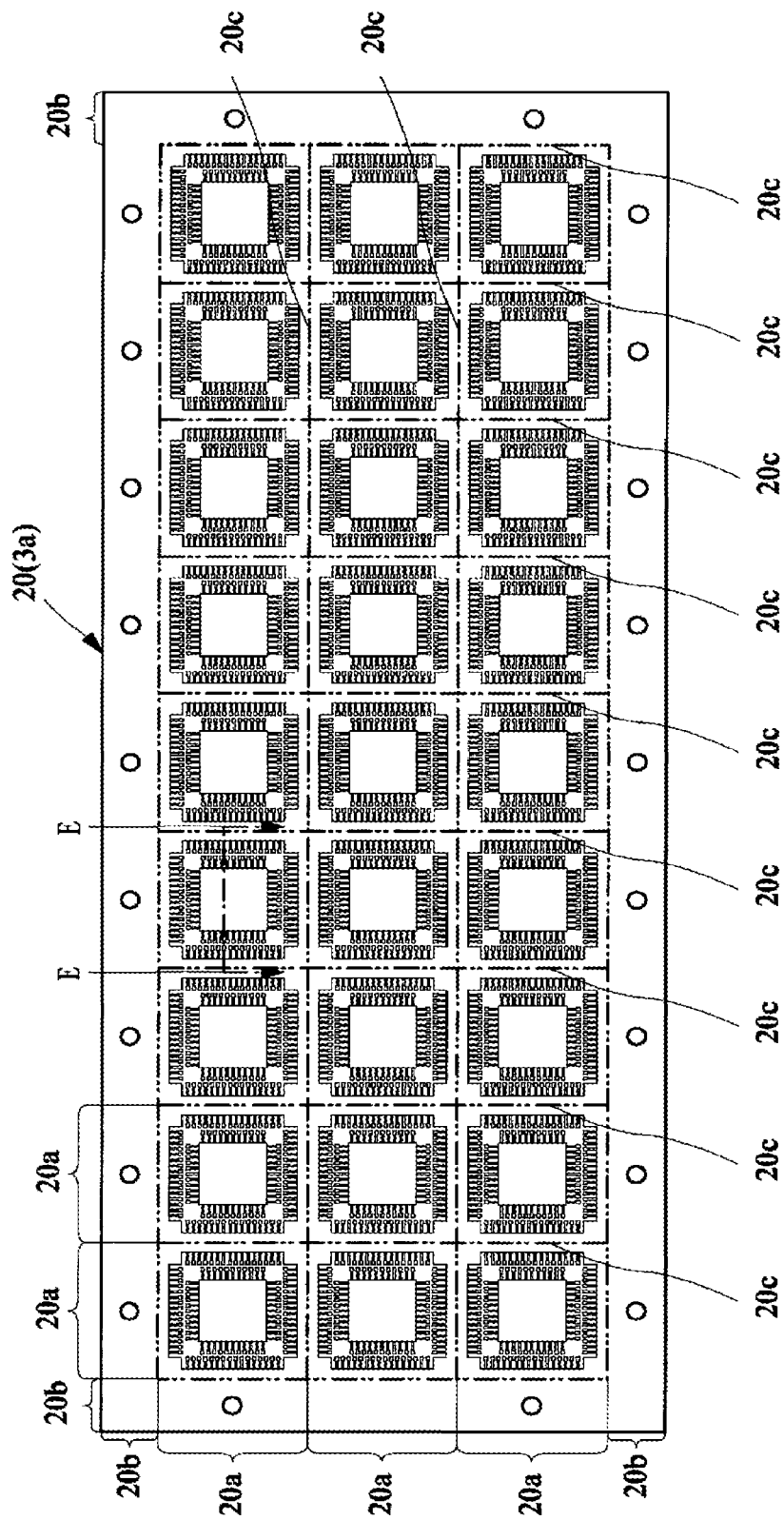
FIG. 11 is a plan view showing the overall structure of a wiring substrate prepared in a substrate preparation step shown in FIG. 10.
Figure 12:
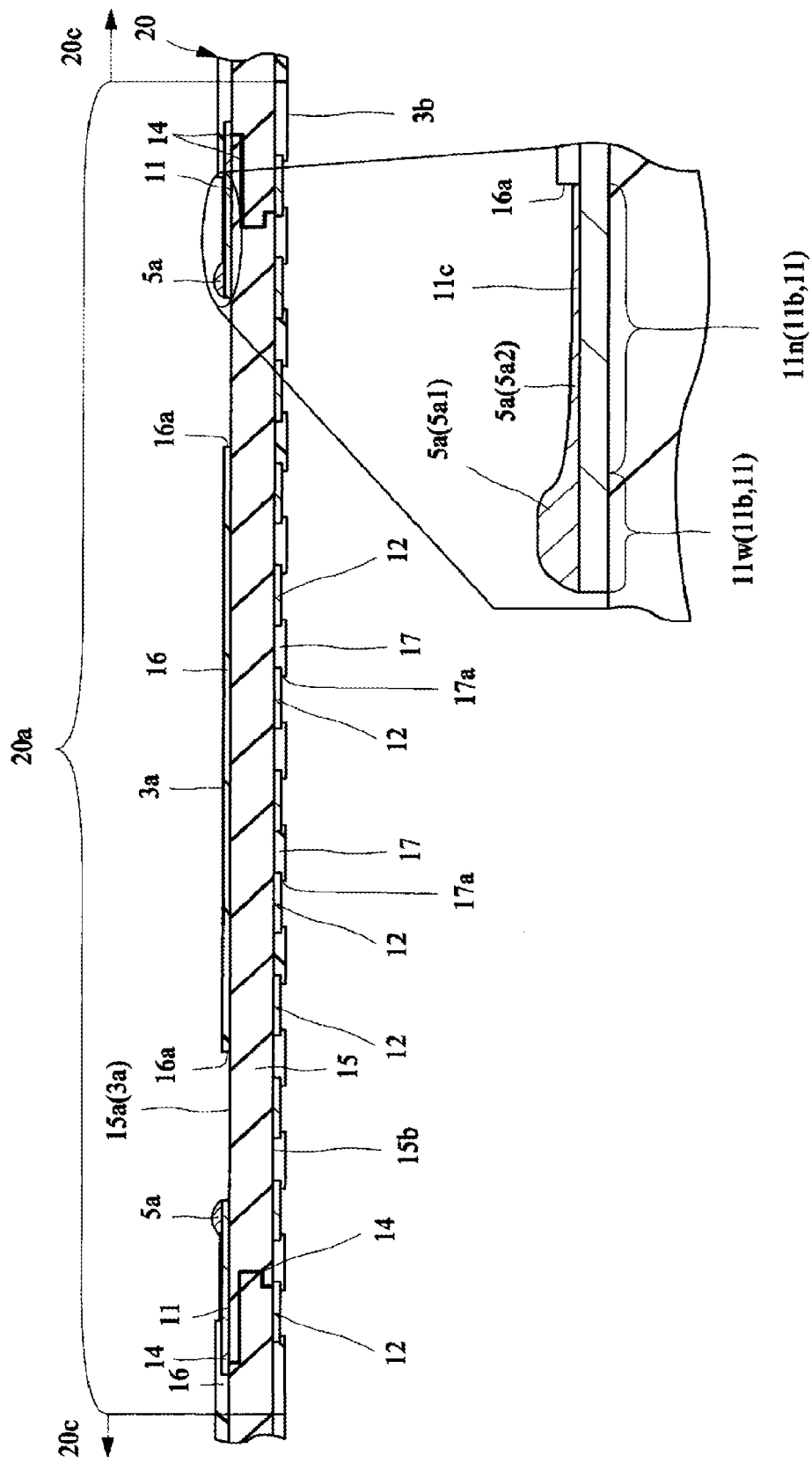
FIG. 12 is an enlarged sectional view along an E-E line of FIG. 11.

First, in a substrate preparation step shown in FIG. 10, a wiring substrate 20 shown in FIG. 11 and FIG. 12 is prepared. FIG. 11 is a plan view showing the overall structure of the wiring substrate prepared in the substrate preparation step shown in FIG. 10, and FIG. 12 is an enlarged sectional view along an E-E line of FIG. 11.

As shown in FIG. 11, the wiring substrate 20 prepared in this step includes a plurality of product forming regions 20a inside a frame portion (frame body) 20b. More specifically, the plurality (in FIG. 11, 27 pieces) of product forming regions 20a is arranged in a matrix. The wiring substrate 20 is the so-called multi-patterned substrate that includes the product forming regions 20a each corresponding to the wiring substrate 3 shown in FIG. 1 and a dicing line (a dicing area) 20c between the respective product forming regions 20a. In this manner, by using a multi-patterned substrate including the product forming regions 20a, the manufacturing efficiency can be improved.

Moreover, as shown in FIG. 12, in each product forming region 20a, a constituent member of the wiring substrate 3 described using FIG. 1 to FIG. 9 is formed. More specifically, the wiring substrate 20 includes an insulating layer (a core layer, a core material) 15 having the upper surface 15a and the lower surface 15b on the opposite side of the upper surface 15a, the insulating layer 15 being constituted by resin, for example. Moreover, each product forming region 20a of the wiring substrate 20 includes the terminals 11 arranged on the upper surface 3a side, the lands 12 arranged on the lower surface 3b side, and the wirings 14 for electrically connecting the terminals 11 and the lands 12. Moreover, the portion over the upper surface and the portion under the lower surface 15b of the insulating layer 15 are covered with the solder resist films 16 and 17, respectively, and in the opening portion 16a formed in the solder resist film 16, the terminals (bonding leads) 11 are exposed from the solder resist film 16. In the embodiment, the terminals 11 are exposed in one opening portion 16a. Moreover, in the opening portions 17a formed in the solder resist film 17, the lands 12 are exposed from the solder resist film 17, respectively. The conductor patterns (the terminals 11, the lands 12, and the wirings 14) which the wiring substrate 20 includes are formed by a metallic material containing copper (Cu) as a principal component, respectively. In the embodiment, as the technique for forming these conductor patterns, a technique, such as a subtract process or a semi-additive process, is used. With such a process, as shown in FIG. 6, the shape of the terminal 11 including: the wide part (portion) 11w having the width (the length in the direction intersecting the direction in which the terminal 11 extends) W1 in a plan view; and the narrow part (portion) 11n having the width (the length in the direction intersecting the direction in which the terminal 11 extends) W2 smaller than the width W1 in a plan view, the narrow part (portion) being integrally formed with the wide part (portion) 11w, can be formed. Accordingly, the terminals 11, which the wiring substrate 20 prepared in the step includes, has a planar shape including the wide part (portion) 11w and the narrow part (portion) 11n as shown in FIG. 6.

Moreover, over the upper surface 11c of the terminals 11, the solder materials 5a are applied in advance. The solder material 5a is the raw material of the solder material 5 shown in FIG. 2, as described above. In the solder material 5a, among the solder materials 5a applied (formed) onto the surface of the terminal 11 in advance, the quantity (thickness) of the solder material 5a2 provided in the narrow part (portion) 11n is applied (formed) so as to be smaller (thinner) than the quantity (thickness) of the solder material 5a1 provided in the wide part (portion) 11w. In other words, the terminals 11 each include the region (the narrow part 11n), in which the solder material (solder film) 5a2 is applied (formed) thin (e.g., with a thickness equal to or less than 7 μm), adjacent to the wide part (portion) 11w. The solder material 5a is formed, for example, by printing, as described above. Hereinafter, a method of forming the solder material 5a2 by printing is described. FIG. 13 is an explanatory view that schematically shows an example of the method of forming the solder material shown in FIG. 12, and FIG. 14 is an explanatory view that schematically shows an example of a method of forming the solder material shown in FIG. 12 by using a method other than the method shown in FIG. 13.

In the method of forming the solder material shown in FIG. 13, first, in Step S1 (the substrate preparation step shown in FIG. 10), the wiring substrate 20 having the terminals 11 formed therein is prepared. Next, in Step 2 (a solder material application step shown in FIG. 10), a solder paste (solder material) Pss is applied (printed) onto the terminals 11. The solder paste Pss contains a solder component and a flux component for activating the solder component, and exhibits paste-like properties at room temperature. In the embodiment, instead of independently applying the solder paste Pss to each of the terminals 11, the solder paste Pss is applied so as to collectively cover the terminals 11. By employing such an application method, the application step can be simplified. Next, in Step 3 (a heat treatment step shown in FIG. 10), a heat treatment (reflow process) is carried out to the solder paste Pss to melt the solder component contained in the solder paste Pss. Note that, the heating temperature at this time differs depending on the melting point of the solder component, but when a tin-silver (Sn—Ag)-based lead-free solder is employed, the solder paste Pss is heated at 240° C. to 280° C., for example. In the step, a flux (flux component) FL contained in the solder paste Pss can improve the wettability of the melted solder Ms with respect to the terminal 11 by activating the solder component of the solder paste Pss. Moreover, in the step, the melted solder Ms, under the influence of a surface tension, deforms so as to be a physically stable shape. Accordingly, as with the solder material 5a shown in FIG. 9 or FIG. 12, a lot of melted solder Ms gathers onto the wide part (portion) 11w (see FIG. 13). As a result, the thickness of the melted solder Ms over the narrow part (portion) 11n shown in FIG. 13 can be stably thinned, with a thickness equal to or less than 7 μm, for example. Next, in Step 4 (a cleaning step shown in FIG. 10), the melted solder Ms is solidified by cooling the melted solder Ms, thereby forming the solder material 5a. Moreover, by cleaning the periphery of the terminal 11 and removing the residual substance of the flux FL remaining in the periphery of the solder material 5a, the wiring substrate 20 having the solder material 5a shown in FIG. 12 formed therein can be obtained.

Figure 14:
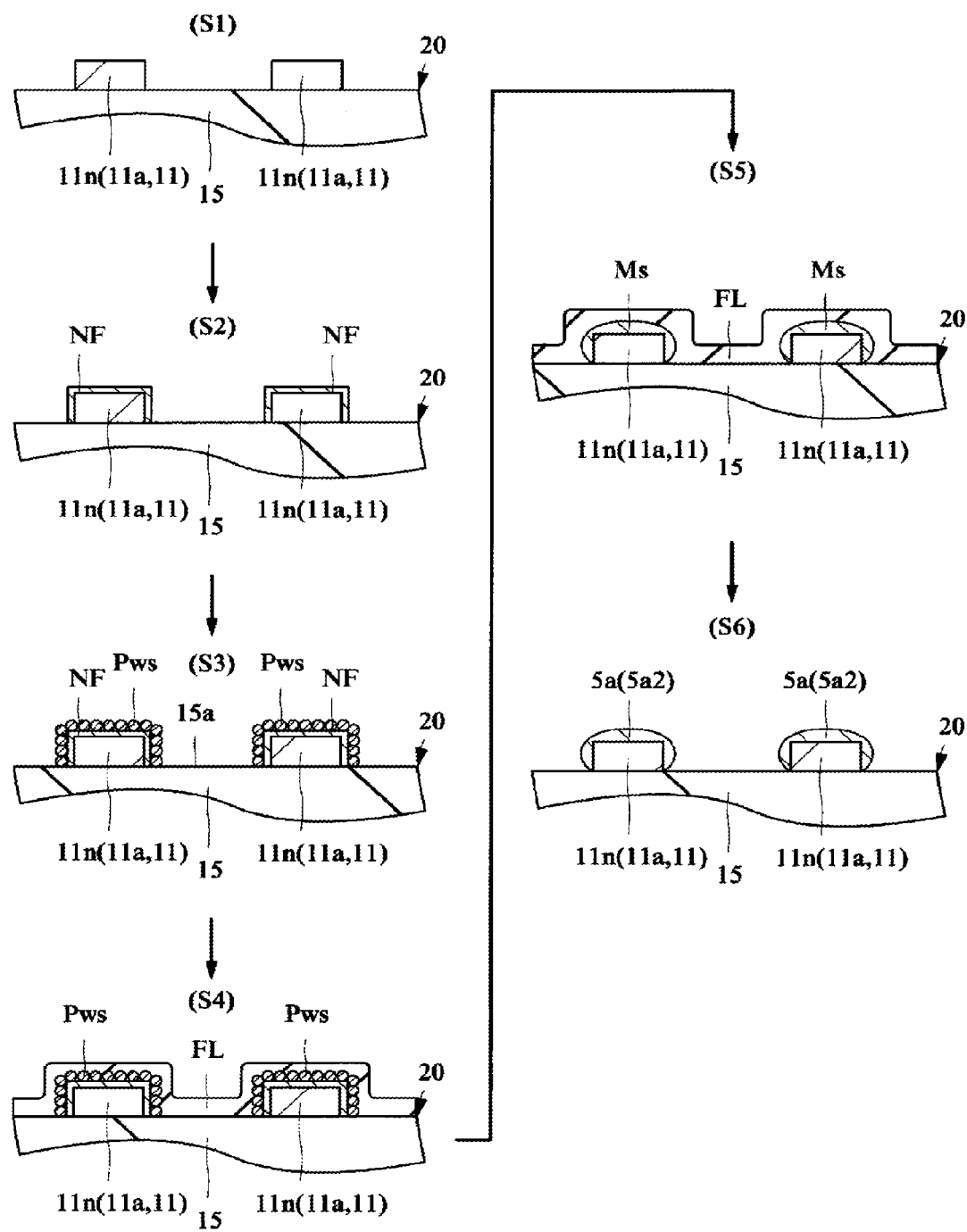
FIG. 14 is an explanatory view that schematically shows an example of a method of forming a solder material shown in FIG. 12 by using a method other than the method shown in FIG. 13.

On the other hand, the method of forming the solder material shown in FIG. 14 is as follows. First, in Step S1 (the substrate preparation step shown in FIG. 10) shown in FIG. 14, the wiring substrate 20 having the terminals 11 formed therein is prepared. Next, in Step S2 (the substrate preparation step shown in FIG. 10), the terminals 11 formed in the wiring substrate 20 are immersed into an agent and then dried so as to form an adhesive film NF in the surface (the upper surface and the side face) of the terminal 11. Because the adhesive film NF is formed by a chemical reaction between the metal in the surface of the terminal 11 and the agent, the adhesive film NF can be formed in the exposed surface (the upper surface and the side face) of the terminal 11. Next, in Step S3 (the solder material application step shown in FIG. 10), a large number of solder particles (solder powder, solder material) Pws are applied (printed) onto the terminals 11 and are stuck to the adhesive film NF. Because the adhesive film NF is selectively formed in the surface of the terminal 11, even if the solder particles Pws are collectively applied onto the terminals 11, the solder particle Pws will not adhere to the upper surface 15a of the insulating layer 15. Accordingly, the solder particles Pws can be selectively stuck onto the terminal 11. For this reason, as compared with the method shown in FIG. 13, the quantity of the solder component adhering to the periphery of the terminal 11 can be reduced. Moreover, with the average particle size of the solder particle Pws, the quantity of the solder component adhering to the periphery of the terminal 11 can be controlled. That is, if the average particle size of the solder particle Pws is reduced, the quantity of the solder component adhering to the periphery of the terminal 11 can be reduced. In contrast, if the average particle size of the solder particle Pws is increased, the quantity of the solder component adhering to the periphery of the terminal 11 can be increased. Next, in Step S4 (the solder material application step shown in FIG. 10), a paste (flux paste) containing the flux FL is applied (printed) so as to cover the terminals 11 and the solder particles Pws. The flux FL is applied in order to activate the solder particle (solder component) Pws and improve the wettability with respect to the terminal 11, and therefore from a view point of simplifying the application step, the flux FL is collectively applied so as to cover the terminals 11, for example. Next, in Step S5 (a heat treatment step shown in FIG. 10), a heat treatment (reflow process) is carried out to the solder particle Pws to melt the solder component. Note that, the heating temperature at this time differs depending on the melting point of the solder component, but when a tin-silver (Sn—Ag)-based lead-free solder is employed, the solder paste Pss is heated at 240° C. to 280° C. In this step, because the flux FL applied onto the solder particle Pws activates the solder component, the wettability of the melted solder Ms with respect to the terminal 11 can be improved. Moreover, in this step, as described above, the melted solder Ms, under the influence of a surface tension, deforms so as to be a physically stable shape. Accordingly, as with the solder material 5a shown in FIG. 9 or FIG. 12, a lot of melted solder Ms gathers onto the wide part (portion) 11w (see FIG. 13). Next, in Step S6 (a cleaning step shown in FIG. 10), the melted solder Ms is solidified by cooling the melted solder Ms, thereby forming the solder material 5a. Moreover, by cleaning the periphery of the terminal 11 and removing the residual substance of the flux FL remaining in the periphery of the solder material 5a, the wiring substrate 20 having the solder material 5a shown in FIG. 12 formed therein can be obtained.

Note that, in the above-described methods of forming the solder material 5a, two methods, among the methods which the present inventor has studied, which may be particularly suitable, are exemplarily taken. Accordingly, it is needless to say that various modifications are possible without departing from the scope and spirit of the present invention.

<Semiconductor Chip Preparation Step>

Figure 15:
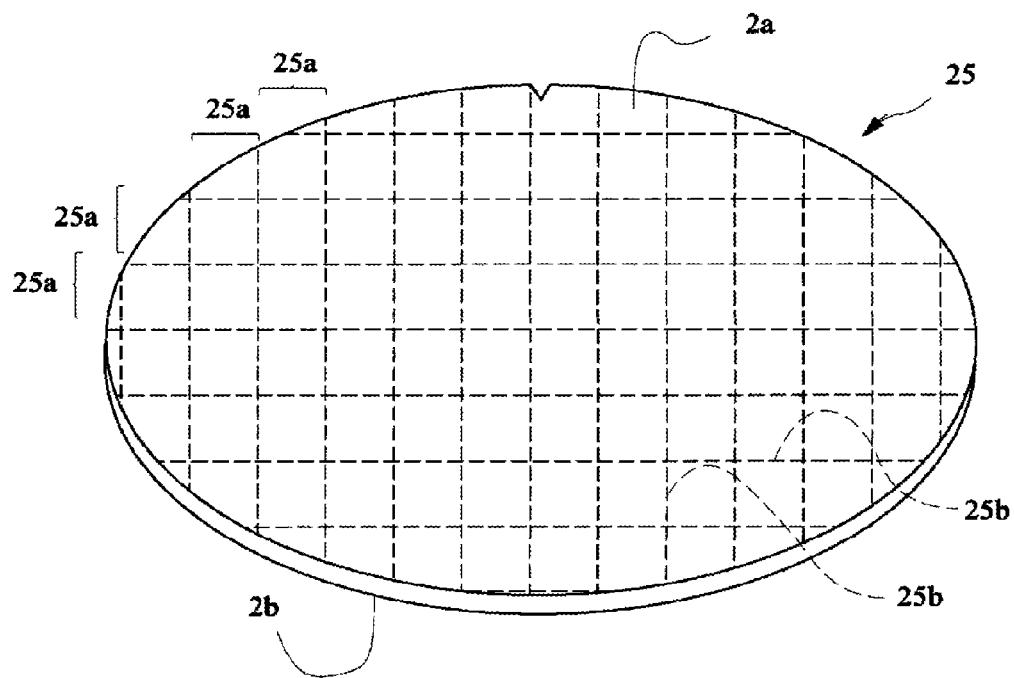
FIG. 15 is a plan view showing a semiconductor wafer prepared in a wafer preparation step shown in FIG. 10.
Figure 16:
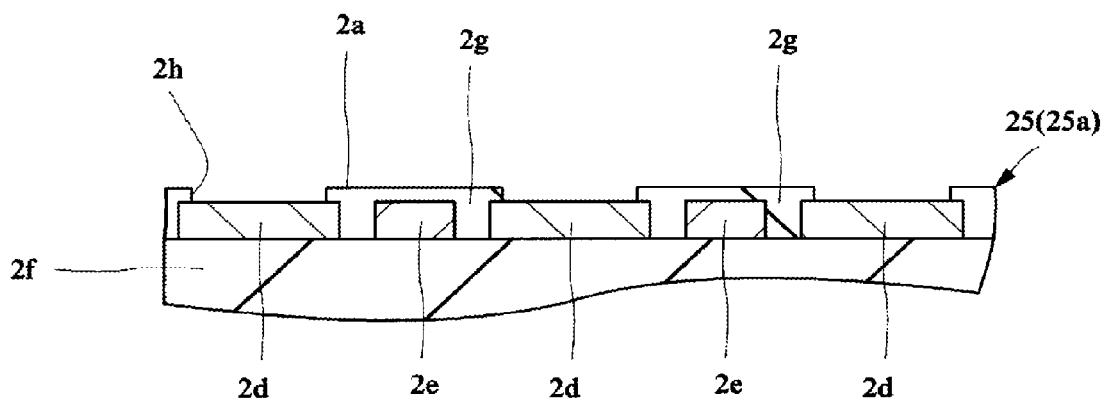
FIG. 16 is an enlarged sectional view showing the periphery of a pad formed in a chip area of the semiconductor wafer shown in FIG. 15.
Figure 18:
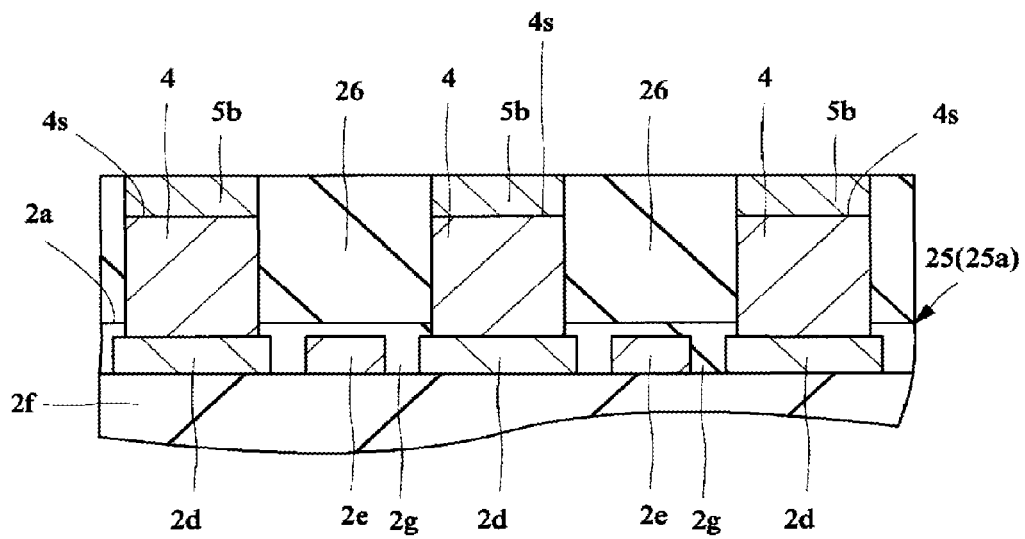
FIG. 18 is an enlarged sectional view showing a state where a solder material is attached onto a tip end surface of the projecting electrode shown in FIG. 17.
Figure 19:
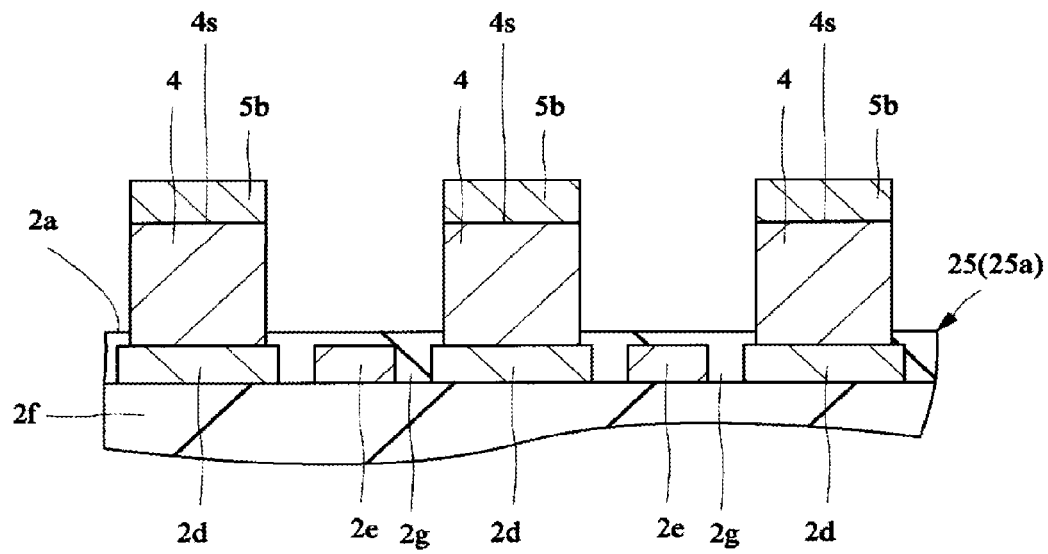
FIG. 19 is an enlarged sectional view showing a state where a mask shown in FIG. 18 is removed.
Figure 20:
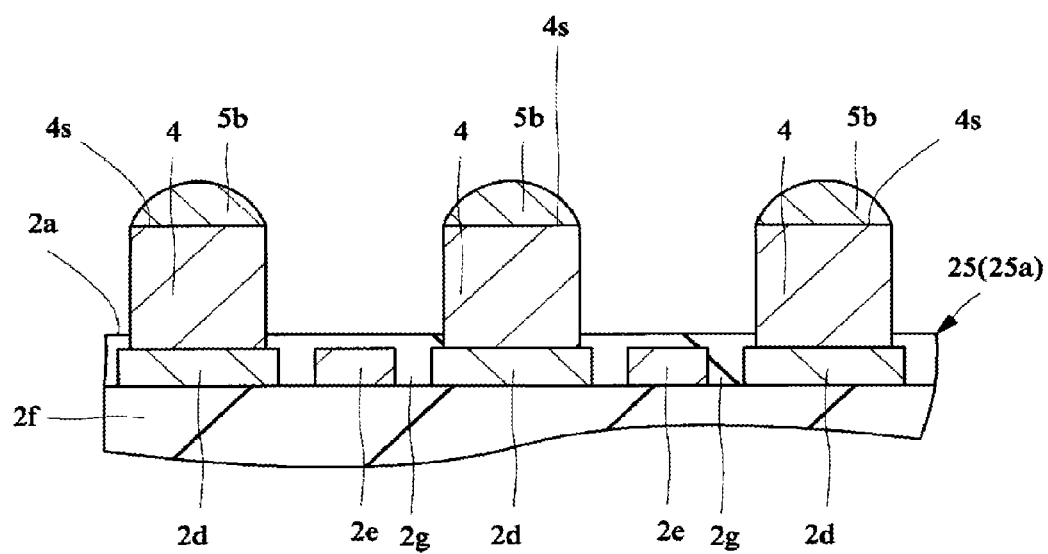
FIG. 20 is an enlarged sectional view showing a state where the solder material shown in FIG. 19 is heated to be deformed into a dome shape.

In a semiconductor chip preparation step shown in FIG. 10, the above-described semiconductor chip 2 shown in FIG. 3 is prepared. FIG. 15 is a plan view showing a semiconductor wafer prepared in the wafer preparation step shown in FIG. 10, and FIG. 16 is an enlarged sectional view showing the periphery of a pad formed in a chip area of the semiconductor wafer shown in FIG. 15. Moreover, FIG. 17 is an enlarged sectional view showing a state where a projecting electrode is formed over a plurality of pads shown in FIG. 16, FIG. 18 is an enlarged sectional view showing a state where a solder material is applied onto a tip end surface of the projecting electrode shown in FIG. 17, FIG. 19 is an enlarged sectional view showing a state where a mask shown in FIG. 18 is removed, and FIG. 20 is an enlarged sectional view showing a state where the solder material shown in FIG. 19 is deformed into a dome-like shape by heating.

The semiconductor chip shown in FIG. 3 is manufactured as follows, for example. First, in the wafer preparation step shown in FIG. 10, a wafer (semiconductor wafer) 25 shown in FIG. 15 is prepared. The wafer 25 prepared in this step has the front surface 2a with a substantially-circular planar shape and the rear surface 2b positioned on the opposite side of the front surface 2a, as shown in FIG. 15. Moreover, the wafer 25 includes a plurality of chip areas (device areas) 25a, and each chip area 25a corresponds to the semiconductor chip 2 shown in FIG. 3. Moreover, between the adjacent chip areas 25a, a scribe line (scribe area) 25b is formed. The scribe line 25b is formed in a grid, and partitions the front surface 2a of the wafer 25 into a plurality of chip areas 25a. Moreover, in the scribe line 25b, a plurality of conductor patterns, such as a TEG (Test Element Group) for verifying whether or not a semiconductor element formed inside the chip area 25a has been formed correctly and/or an alignment mark, is formed.

In the wafer 25 prepared in this step, a plurality of semiconductor elements (the illustration is omitted), such as a transistor, is formed in the major surface (the element forming surface) of the semiconductor substrate constituted by silicon (Si), for example. Moreover, over the major surface of the semiconductor substrate, as shown in FIG. 16, a wiring layer (the illustration is omitted) including a plurality of wirings 2e and an insulating film 2f for isolating between the adjacent wirings 2e is stacked, and in the top layer, the pads (electrode pads, bonding pads, chip electrodes) 2d electrically connected to the wirings 2e are formed. The pads 2d are electrically connected to a plurality of semiconductor elements via the wirings 2e in the wiring layer. That is, in the wafer 25 prepared in this step, an integrated circuit is formed over the major surface of the semiconductor substrate in advance. Moreover, the front surface 2a of the semiconductor chip 2 is covered with an insulating film 2g of silicon oxide (S102) or the like, while over the pads 2d, an opening portion 2h is formed in the insulating film 2g covering the front surface 2a. Then, in the opening portion 2h, the pad 2d is exposed from the insulating film.

Figure 17:
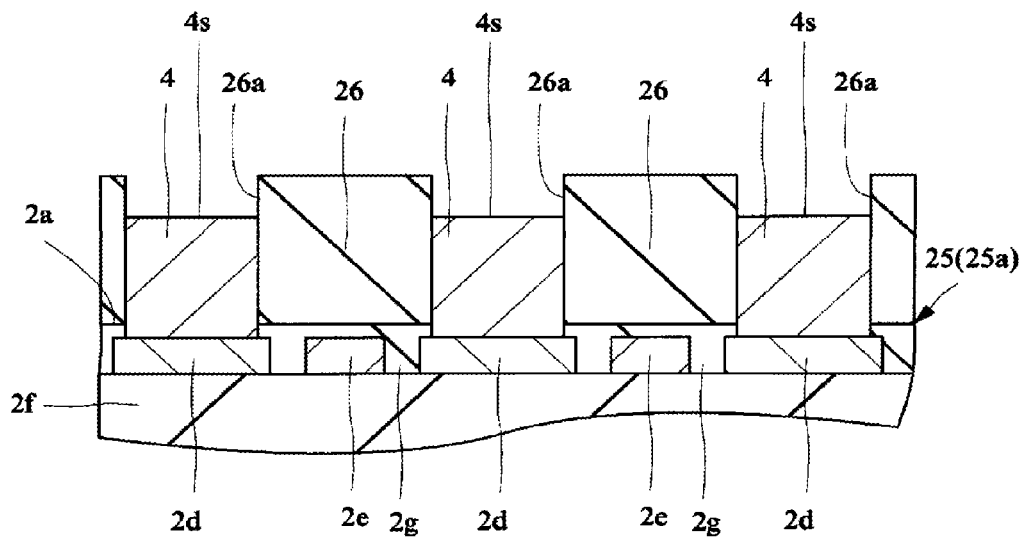
FIG. 17 is an enlarged sectional view showing a state where a projecting electrode is formed over a plurality of pads shown in FIG. 16.

Next, in a projecting electrode formation step shown in FIG. 10, as shown in FIG. 17, over the pads 2d, a metal film is deposited, respectively, to form the projecting electrode 4. In the embodiment, a mask 26 is arranged (fixed) onto the front surface 2a of the wafer 25 as shown in FIG. 17. Then, a through-hole (opening portion) 26a is formed at a position where the projecting electrode 4 is formed. The through-hole 26a can be formed using a photolithography technique or an etching technique, for example. Subsequently, inside the through-hole 26a, a metal film is deposited to form the projecting electrode 4. In the embodiment, a copper film is deposited. The method of depositing a metal film is not limited in particular, and the metal film can be deposited by plating, for example. Moreover, when a metal film different from the copper film is formed in the interface between the copper film and the pad 2d or in the tip end surface 4s of the projecting electrode 4, it can be easily formed by sequentially depositing the different metallic materials. In this manner, when the projecting electrode 4 is formed by depositing a metal film, a stress that is applied to the pad 2d in bonding the projecting electrode 4 to the pad 2d can be reduced. In particular, as compared with a method of compression-bonding (including thermo-compression bonding) the projecting electrode to a pad, such as a ball-bonding method, the stress can be significantly reduced. Therefore, degradation in the reliability due to the breakage of the chip area 25a at the time of forming the projecting electrode can be suppressed. Moreover, by depositing the metal film, with a plurality of through-holes 26a formed in the mask 26, a plurality of (multiple) projecting electrodes 4 can be collectively formed. Therefore, the projecting electrode 4 can be efficiently formed. Moreover, because the projecting electrode 4 is formed before dividing the wafer 25, the projecting electrode 4 can be collectively formed in the chip areas 25a. Therefore, the projecting electrode 4 can be efficiently formed. Thus, the projecting electrode formed by depositing the metal film inside the through-hole 26a of the mask 26 turns into a columnar electrode with a columnar cubic shape. Moreover, the planar shape of the projecting electrode 4 is formed in accordance with the opening shape of the through-hole 26a. For example, in the embodiment, the cylindrical projecting electrode 4 can be obtained by forming the through-hole 26a with a circular opening shape.

Next, in a solder material formation step shown in FIG. 10, as shown in FIG. 18, the solder material 5b is formed (attached) by depositing a solder film onto the tip end surface 4s of the projecting electrode, respectively. In the embodiment, a metal film is deposited halfway into the through-hole 26a (see FIG. 17) in the above-described projecting electrode formation step, followed by depositing a solder film (without removing the mask 26). Therefore; for example, if the solder film is continuously deposited after depositing the copper film, the formation of an oxide film in the copper film before the solder film is formed can be suppressed. Accordingly, the bonding strength of the bonding interface between the solder material 5b and the projecting electrode 4 can be improved. Moreover, by covering the tip end surface 4s of the projecting electrode 4 with the solder material 5b in this step, the tip end surface 4s can be prevented from being exposed to the atmosphere, and therefore a state where an oxide film is unlikely to be formed in the tip end surface 4s can be maintained. Accordingly, the bonding strength of the bonding interface between the solder material 5b and the projecting electrode 4 can be improved. As a result, as shown in FIG. 8, the bonding strength of the bonding interface between the solder material 5 and the tip end surface 4s can be improved. Note that, in order to more reliably suppress the oxidation of the projecting electrode 4, a nickel (Ni) film may be formed in the tip end surface 4s of the projecting electrode 4. However, when the nickel film is formed, not only the number of plating steps (process time) increases but the wettability of the solder material 5 with respect to the projecting electrode 4 decreases, and it is therefore preferable that the solder material 5b is directly formed in the tip end surface 4s of the projecting electrode 4, as with the embodiment.

Next, the mask 26 (see FIG. 18) is removed and the wafer 25 is cleaned, so that the side face of the projecting electrode 4 is exposed as shown in FIG. 19. In this state, the solder material 5b has a cylindrical shape as with the projecting electrode 4. However, if a heat treatment is carried out to melt at least a part of the solder material 5b, the shape of the solder material 5b deforms, under the influence of a surface tension of the melted solder, into a dome shape, as shown in FIG. 20. With such a heat treatment, the tip end surface 4s of the projecting electrode 4 and the solder material 5b can be securely bonded. Because the dome shape as shown in FIG. 20 will further stabilize the solder material 5b, the dropping off from the projecting electrode and/or the damaging can be suppressed.

With the respective steps described above, the wafer 25, in which the projecting electrodes 4 are formed (bonded) onto the surface (upper surface) of the pads 2d and also a plurality of the solder materials 5b is formed in the tip end surface 4s of the projecting electrodes 4, is obtained.

Next, a tape used for back grinding is applied to the surface of the wafer 25 having the projecting electrodes 4 formed therein, and then the rear surface of the wafer 25 is polished (ground) to obtain the wafer 25 with a desired thickness. Note that, when the thickness of the wafer 5 to prepare is already thin at the wafer preparation stage, or when there is no need to thin the wafer, this grinding step can be eliminated.

Next, in a division step shown in FIG. 10, the wafer 25 shown in FIG. 20 is divided (singulated) for each chip area 25a to obtain a plurality of the semiconductor chips 2 shown in FIG. 3. In this step, the wafer 25 is cut along the scribe line 25b shown in FIG. 16 and divided. The cutting method is not limited in particular, but a cutting method using a dicing blade (a rotary blade) or a cutting method of radiating a laser beam can be used.

<Chip Mounting Step>

Figure 21:
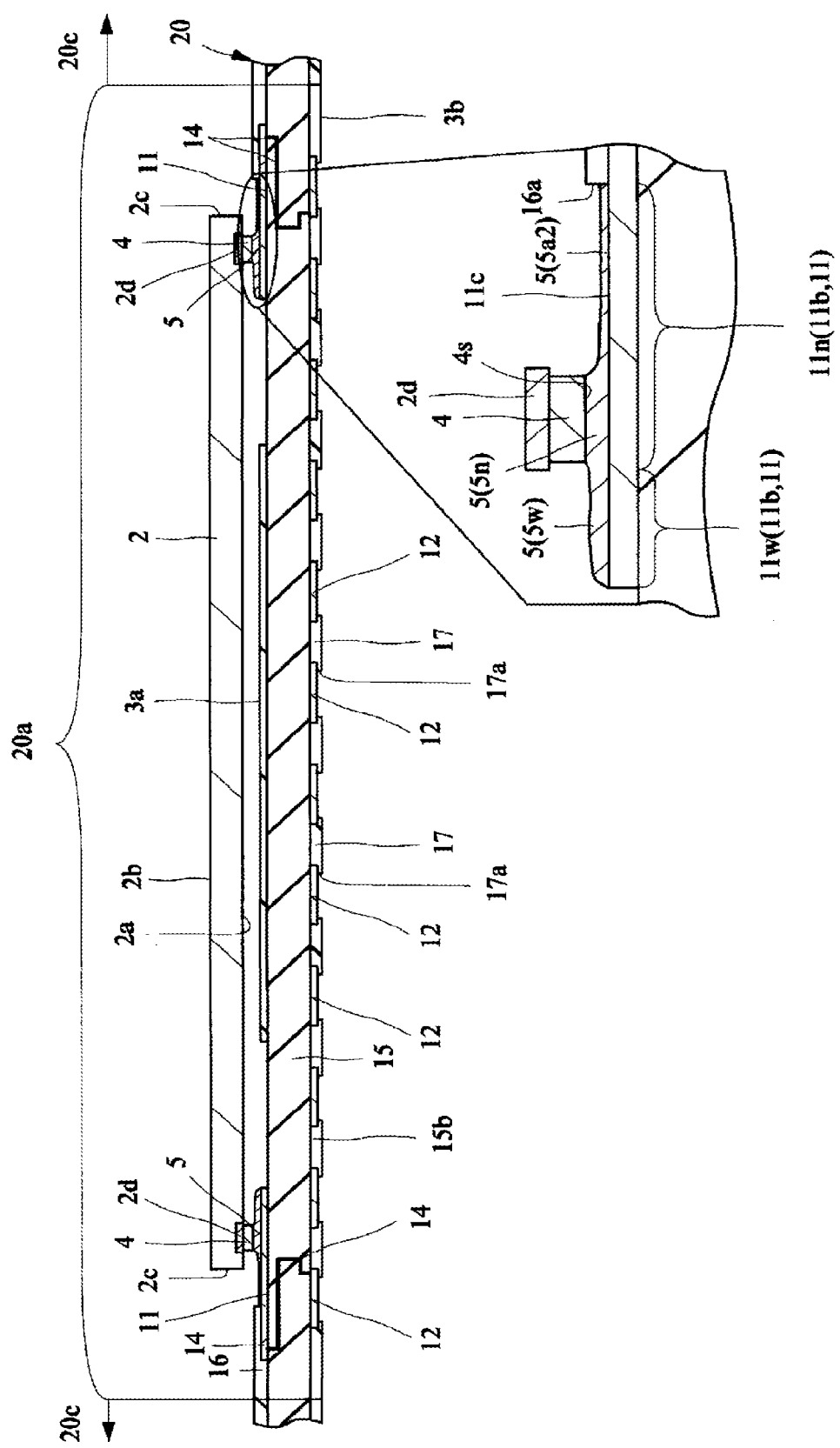
FIG. 21 is an enlarged sectional view showing a state where a semiconductor chip is mounted over the wiring substrate shown in FIG. 12.
Figure 22:
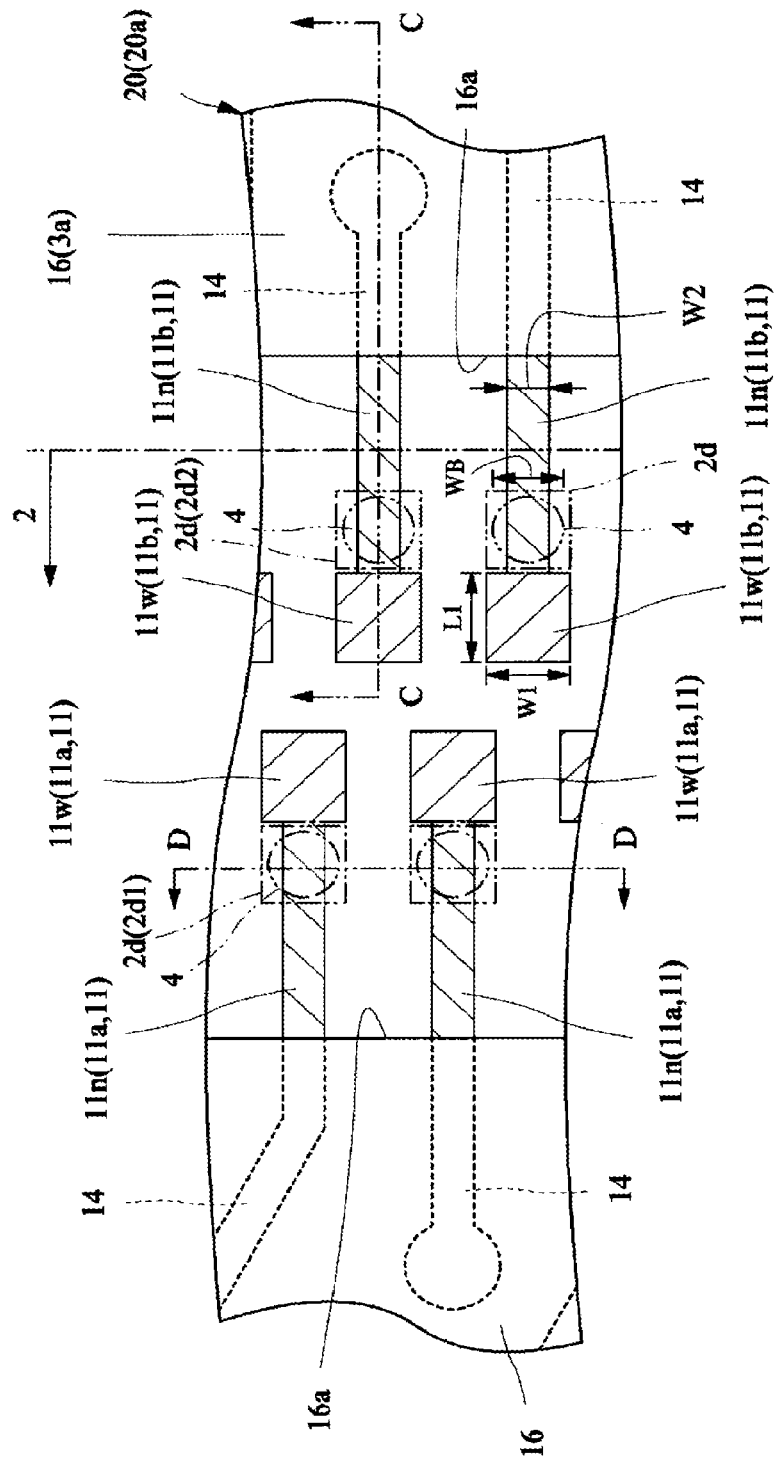
FIG. 22 is an enlarged plan view showing a planar positional relationship between a projecting electrode and a terminal when the semiconductor chip is disposed over the wiring substrate.
Figure 23:
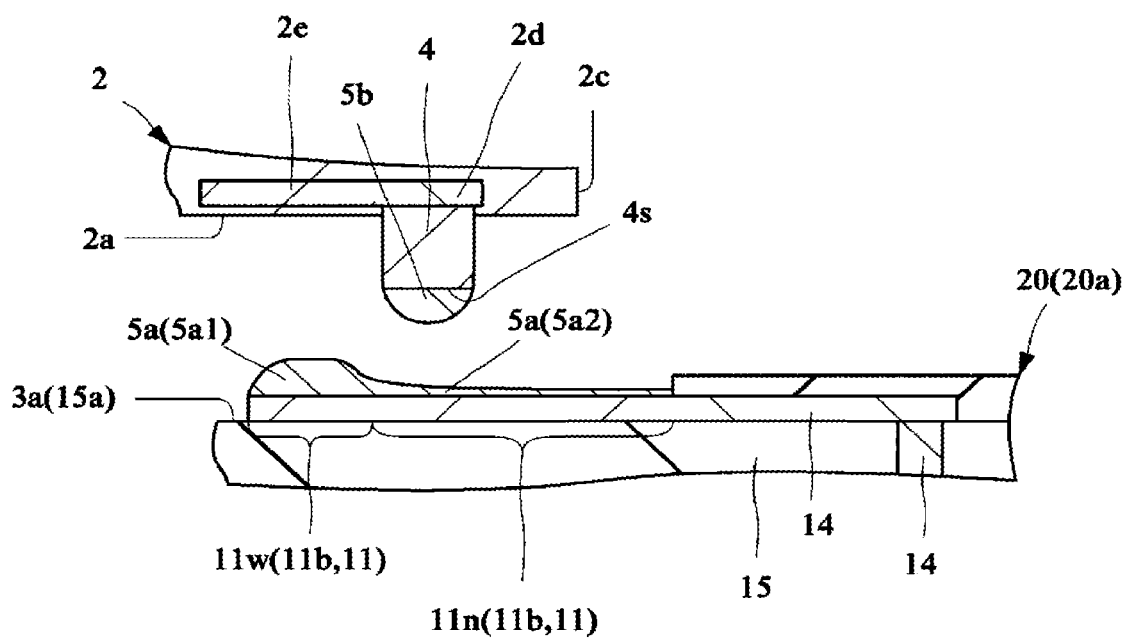
FIG. 23 is an enlarged sectional view along a C-C line of FIG. 22.
Figure 24:
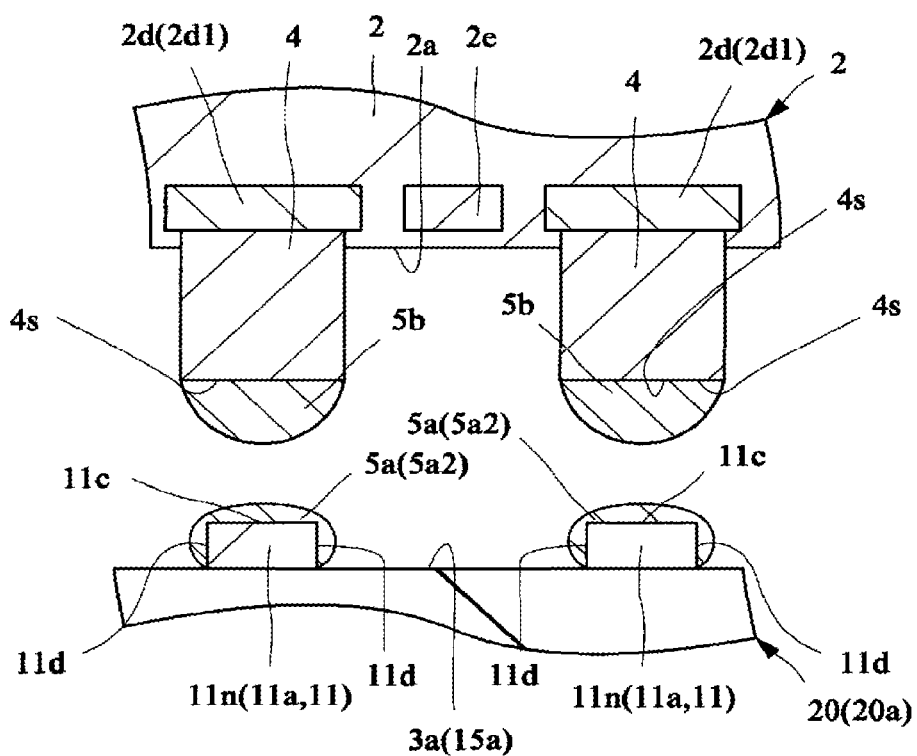
FIG. 24 is an enlarged sectional view along a D-D line of FIG. 22.
Figure 25:
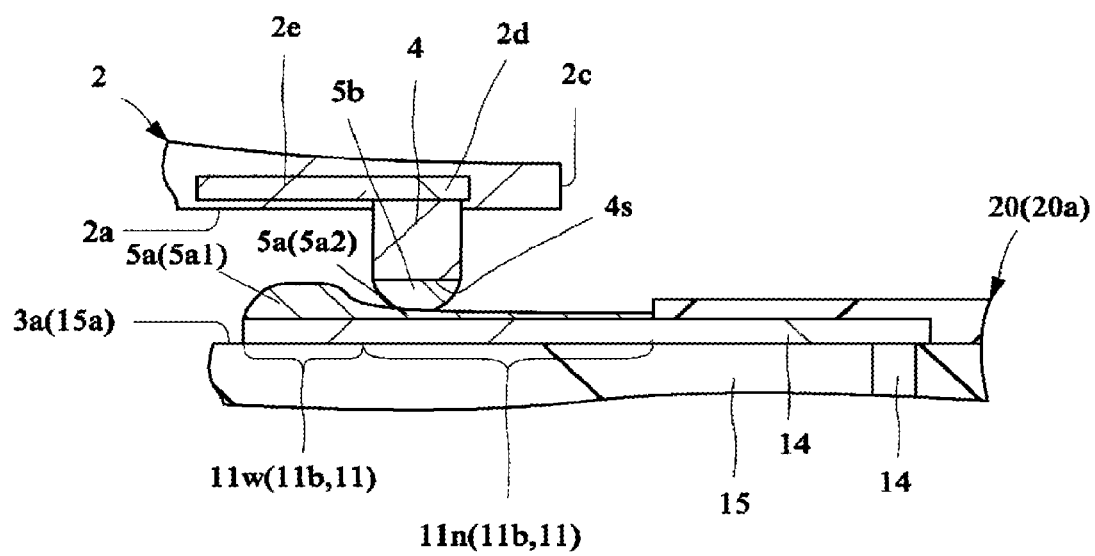
FIG. 25 is an enlarged sectional view showing a state where the opposingly arranged solder materials shown in FIG. 23 are brought into contact with each other.
Figure 26:
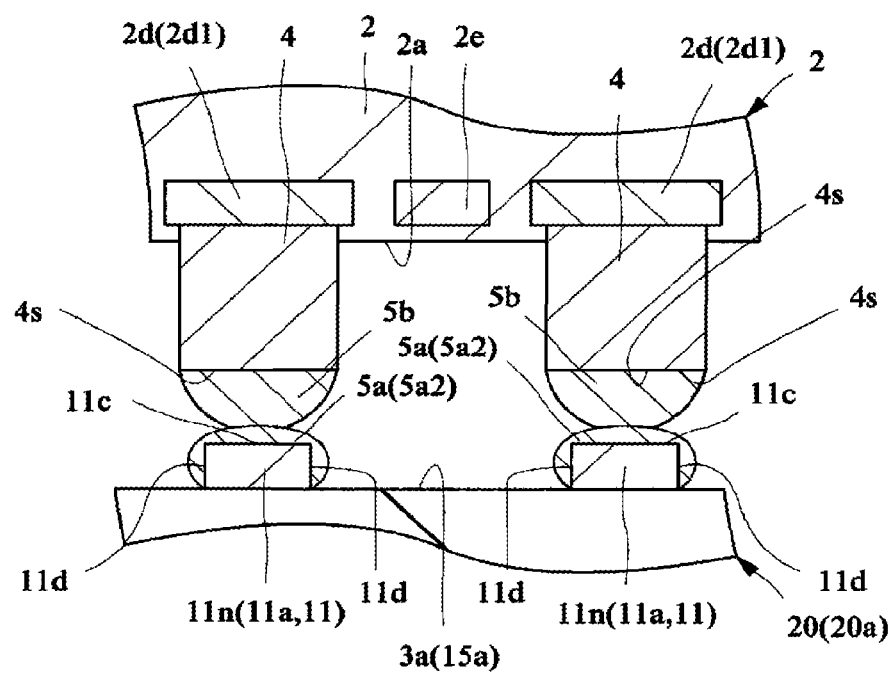
FIG. 26 is an enlarged sectional view showing a state where the opposingly arranged solder materials shown in FIG. 24 are brought into contact with each other.
Figure 27:
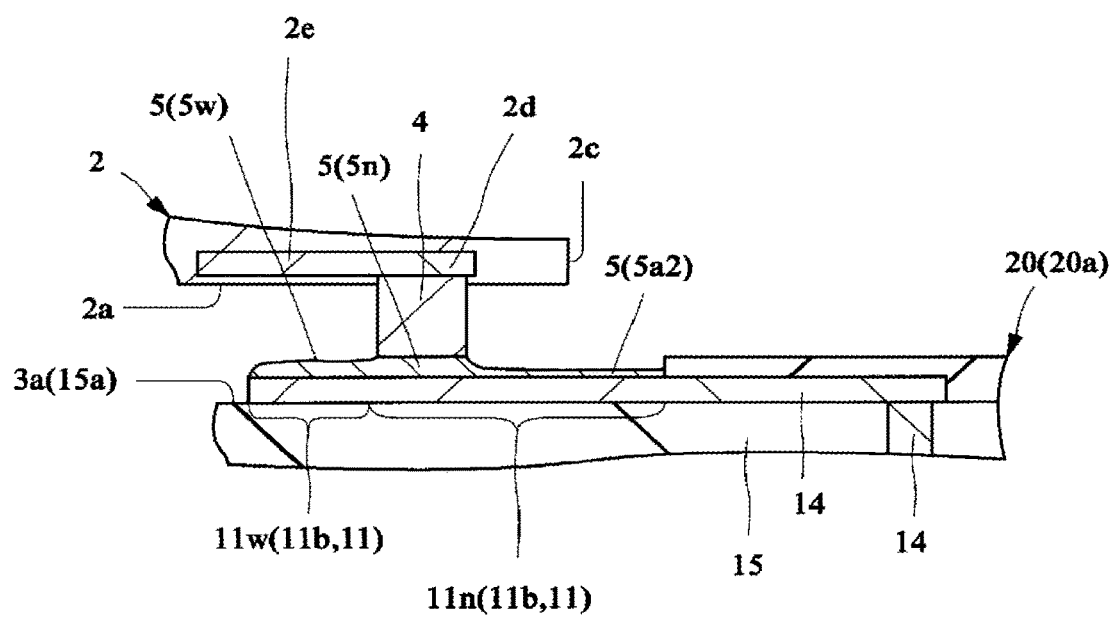
FIG. 27 is an enlarged sectional view showing a state where the solder materials in contact with each other shown in FIG. 25 are integrated.

In a chip mounting step shown in FIG. 10, as shown in FIG. 21, the semiconductor chip 2 is arranged over the wiring substrate 20 so that the front surface 2a faces the upper surface 3a of the wiring substrate 20, and then the terminals 11 and the pads 2d are electrically connected to each other. FIG. 21 is an enlarged sectional view showing a state where the semiconductor chip is mounted onto the wiring substrate shown in FIG. 12. FIG. 22 is an enlarged plan view showing a planar positional relationship between the projecting electrode and the terminal when the semiconductor chip is arranged over the wiring substrate. FIG. 23 is an enlarged sectional view along a C-C line of FIG. 22 and FIG. 24 is an enlarged sectional view along a D-D line of FIG. 22. FIG. 25 is an enlarged sectional view showing a state where the opposingly arranged solder materials shown in FIG. 23 are brought into contact with each other. FIG. 26 is an enlarged sectional view showing a state where the opposingly arranged solder materials shown in FIG. 24 are brought into contact with each other. FIG. 27 is an enlarged sectional view showing a state where the solder materials in contact with each other shown in FIG. 25 are integrated.

Figure 28:
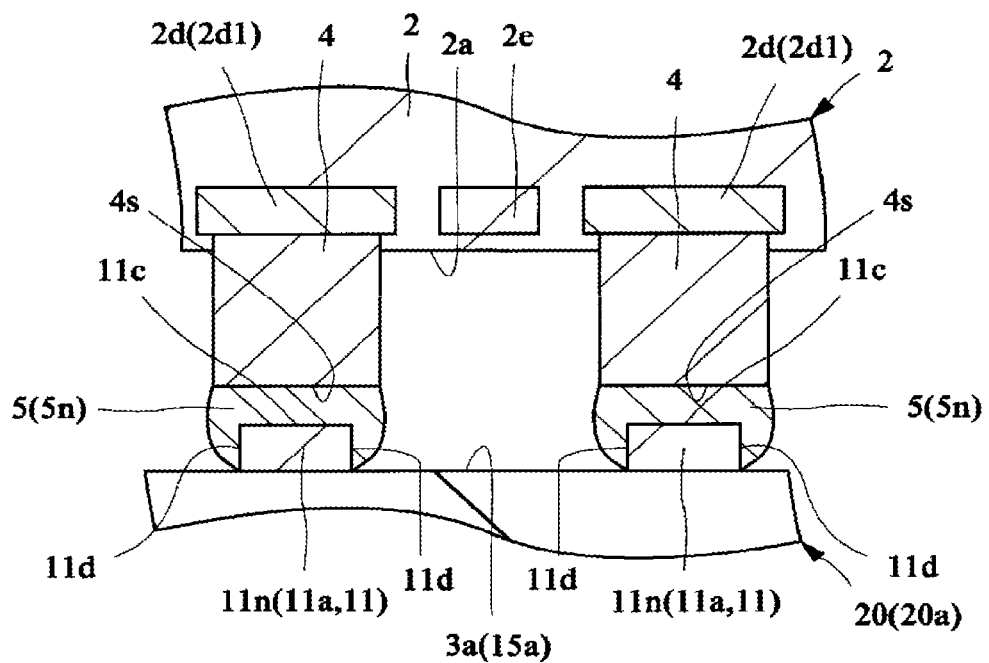
FIG. 28 is an enlarged sectional view showing a state where the solder materials in contact with each other shown in FIG. 26 are integrated.

FIG. 28 is an enlarged sectional view showing a state where the solder materials in contact with each other shown in FIG. 26 are integrated.

In this step, first, as shown in FIG. 22 to FIG. 24, the semiconductor chip 2 is arranged over the wiring substrate 20 so that the front surface 2a faces the upper surface 3a of the wiring substrate 20 (a semiconductor chip arrangement step). At this time, as shown in FIG. 23 and FIG. 24, the tip end surface 4s of each of the projecting electrodes 4 is adapted to be arranged over the narrow part (portion) 11n of the terminal 11 (at a position where it overlaps with the narrow part 11n). In other words, as shown in FIG. 23 and FIG. 24, the tip end surface 4s of each of the projecting electrodes 4 is arranged so that the solder material 5b attached to the tip end surface 4s of the projecting electrode 4 faces the narrow part (portion) 11n of the terminal 11. This is because the projecting electrode 4 is bonded to a region where the solder material 5a is formed thin, i.e., the bonding region over the narrow part (portion) 11n. As shown in FIG. 23, in the embodiment, the tip end surface 4s of the projecting electrode 4 is arranged so as not to overlap with the wide part (portion) 11w of the terminal 11. Note that, as shown in FIG. 23, the solder material 5a1 arranged in the wide part (portion) 11w is dome-shaped, and the vertex thereof is present in the center of the wide part (portion) 11w. Accordingly, in the peripheral portion (the skirt portion of the solder material 5a1) of the wide part (portion) 11w, the thickness of the solder material 5a1 becomes smaller than in the center portion. Accordingly, even in cases where a part of the peripheral portion of the tip end surface 4s of the projecting electrode 4 overlaps with the wide part (portion) 11w, as compared with the case where the center portion of the tip end surface 4s is arranged over the wide part (portion) 11w, the amount of protrusion from over the terminal 11 of the solder material 5 (see FIG. 21) can be reduced. However, from a view point of significantly reducing the amount of protrusion from over the terminal 11 of the solder material 5 and reliably suppressing a short-circuit failure, as shown in FIG. 23, the projecting electrode 4 is preferably arranged so that the entire tip end surface 4s of the projecting electrode 4 does not overlap with the wide part (portion) 11w of the terminal 11. Moreover, from a view point of reducing the time until the temperature of the solder materials 5a and 5b reaches a temperature equal to or greater than the melting point in a heating step (a heat treatment step, a local reflow process) to be described later, the solder material 5a and the solder material 5b are preferably heated in advance in the state shown in FIG. 23 and FIG. 24 (a pre-heating step is preferably implemented). However, at this stage, the solder materials 5a and 5b may not need to be melted but may be pre-heated. As the method of heating the solder material 5a, for example, the wiring substrate 20 is fixed to a heat stage (a substrate holding stand with a heating portion, such as a heater; the illustration is omitted) and the temperature of the heat stage is set to approximately 100° C., for example. Thus, the solder material 5a can be heated via the conductor pattern (the terminal 11 and the like) formed in the wiring substrate 20. Moreover, the solder material 5b attached to the semiconductor chip 2 can be heated by heating the semiconductor chip 2 by means of the heating portion such as a heater (the illustration is omitted). Because the semiconductor chip 2 can be heated to a higher temperature than the wiring substrate 20, it is heated in advance to a higher temperature than the wiring substrate 20, for example, to approximately 200° C.

Next, as shown in FIG. 25 and FIG. 26, the distance between the semiconductor chip 2 and the wiring substrate 3 is reduced to bring (abut) the solder materials 5a and 5b into contact with each other (a solder material contacting step). At this time, as shown in FIG. 25, the solder material 5b is brought into contact with the solder material 5a2 arranged over the narrow part (portion) 11n of the terminal 11 among the solder material 5a. Moreover, as shown in FIG. 26, in order to bring the solder materials 5b into contact with the solder materials 5a, respectively, at least one of the solder material 5a and the solder material 5b is preferably heated to have the hardness to an extent that it deforms after contacting. This is because by bringing the solder material 5b and the solder material 5a into contact with each other so that one of them bites into the other, all the solder materials 5a and 5b can be brought into contact with each other even if there is a variation in the thickness of the projecting electrode 4 or the solder materials 5a and 5b. Moreover, in this state, the solder materials 5a and 5b are further heated until the temperature reaches a temperature equal to or greater than the melting point (a heating step (a heat treatment step, a local reflow process)). Although the heating temperature varies with the melting point of the solder materials 5a and 5b, the solder materials 5a and 5b are heated at 240° C. to 280° C. when a tin-silver (Sn—Ag)-based lead-free solder is employed. In this step, because the solder materials 5a and 5b are heated while in contact with each other, the solder material 5a can be heated through the heat transfer from the solder material 5b, for example. Then, when the respective solder materials 5a and 5b melt, the solder materials 5a and 5b are integrated. That is, the solder materials 5a and 5b come into the so-called "wet" state. Then, after this integration, the solder material 5 (more specifically the solder material 5n) shown in FIG. 27 and FIG. 28 is formed by cooling the melted solder. Thus, by bringing the solder materials 5a and 5b into the wet state, the solder materials 5a and 5b can be firmly bonded. Moreover, when the solder materials 5a and 5b are integrated, they deform so as to have a physically stable shape due to surface tension of the integrated melted-solders. Therefore, as shown in FIG. 27, a part of the solder material arranged over the wide part (portion) 11w of the terminal 11 moves toward the projecting electrode 4. However, as described above, because the melted solder tends to easily gather toward the wide part (portion) 11w with a wide plan area under the influence of a surface tension, a lot of melted solder remains over the wide part (portion) 11w. That is, the quantity of the melted solder moving toward the tip end surface of the projecting electrode 4 is limited. Accordingly, the shape of the solder material 5 formed in this step easily turns into a shape exemplarily shown in FIG. 27 and FIG. 28. That is, among the solder material 5, the thickness of the solder material 5n arranged in the bonding portion (a region sandwiched by the tip end surface 4s and the terminal 11) between the solder material 5 and the projecting electrode 4 is substantially equal to the thickness of the solder material 5w arranged over the wide part (portion) 11w (to an extent that the solder material 5n is slightly thicker). On the other hand, among the solder material 5, with regard to the solder material 5a2 arranged adjacent to the bonding portion between the solder material 5 and the projecting electrode 4 and arranged on the opposite side of the solder material 5w, there is almost no change in the thickness and the thickness is smaller than that of the solder materials 5w and 5n. Moreover, in a cross section in the width direction (the direction intersecting a direction in which the terminal 11 extends) of the bonding portion between the solder material 5 and the projecting electrode 4, as shown in FIG. 28, the amount of protrusion of the solder material 5n in the width direction can be suppressed because the quantity of the solder material 5n decreases. As a result, the short-circuit of the adjacent solder materials 5n can be suppressed. That is, degradation in the reliability of the semiconductor device can be suppressed. In other words, by suppressing the amount of protrusion of the solder material 5n, the distance between the adjacent terminals 11 (the distance between the projecting electrodes 4, the distance between the pads 2d) can be reduced, and therefore the integration level can be improved.

<Sealing Step>

Figure 29:
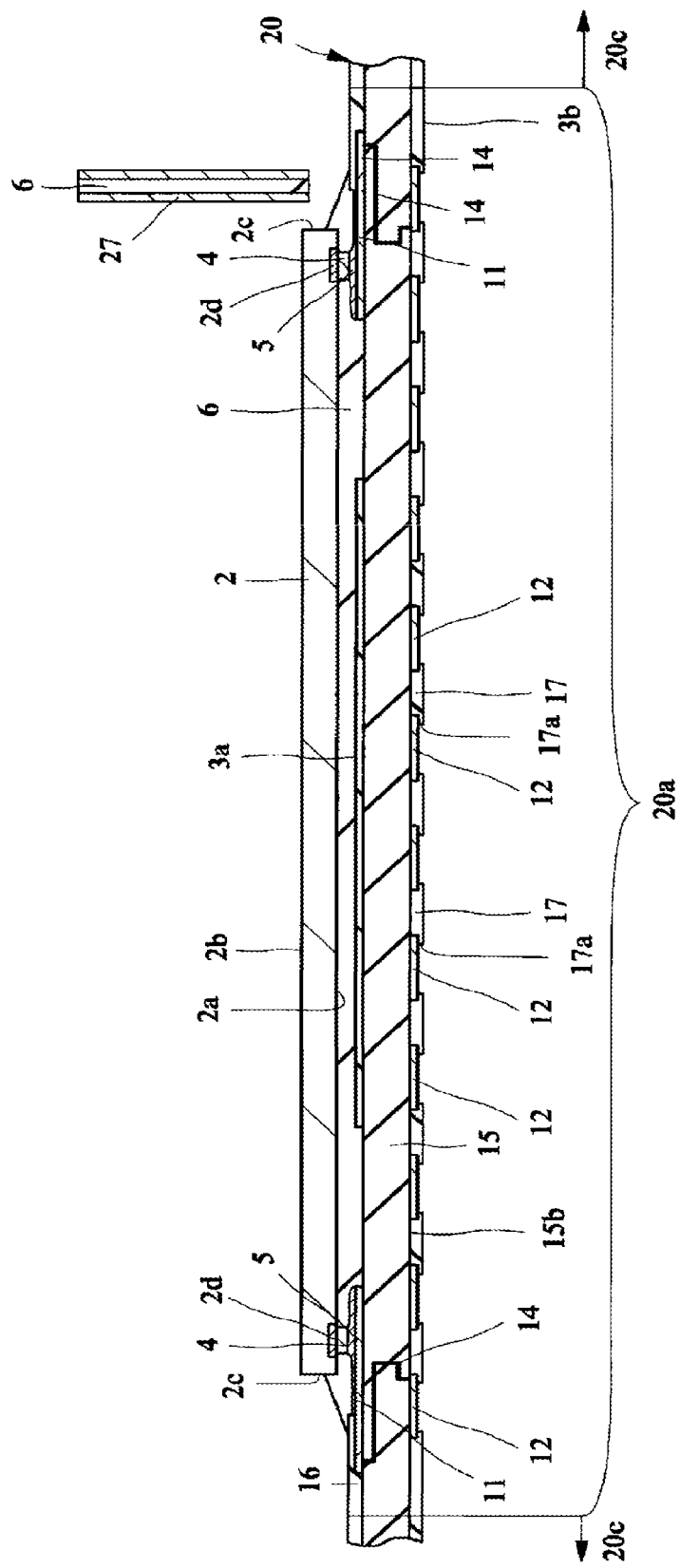
FIG. 29 is an enlarged sectional view showing a state where an underfill resin is supplied between the semiconductor chip and the wiring substrate shown in FIG. 21.

Next, in a sealing step shown in FIG. 10, as shown in FIG. 29, the underfill resin 6 is supplied between the front surface 2a of the semiconductor chip 2 and the upper surface 3a of the wiring substrate 20 to seal the bonding portion between the pad 2d and the terminal 11. FIG. 29 is an enlarged sectional view showing a state where the underfill resin is supplied between the semiconductor chip and the wiring substrate shown in FIG. 21. In this step, a nozzle 27 for supplying a resin is arranged outside the side face 2c of the semiconductor chip 2, for example, and the underfill resin 6 that is a thermosetting resin is supplied between the front surface 2a of the semiconductor chip 2 and the upper surface 3a of the wiring substrate 20. Thus, each bonding portion between the pad 2d and the projecting electrode 4, between the projecting electrode 4 and the solder material 5, and between the solder material 5 and the terminal 11 can be collectively sealed. In this manner, by sealing the bonding portion between the pad 2d and the terminal 11 with the underfill resin 6, a stress on the bonding portion can be distributed via the underfill resin 6, which is therefore preferable from a view point of improving the reliability of the connection between the pad 2d and the terminal 11. However, the technique described in the embodiment is not applied only to the semiconductor device in which the underfill resin 6 is used, and as a variant of the embodiment, the technique described in the embodiment can be applied also to semiconductor devices in which the underfill resin 6 shown in FIG. 29 is not arranged. In this case, the sealing step shown in FIG. 10 can be omitted. Moreover, even in the case where the underfill resin 6 is used, unlike the embodiment in which the underfill resin 6 is supplied between the semiconductor chip 2 and the wiring substrate 20 after arranging the semiconductor chip 2 over the wiring substrate 20, the semiconductor chip 2 may be arranged over the wiring substrate 20 after arranging the underfill resin 6 in the chip mounting region of the wiring substrate 20 in advance.

<Ball Mounting Step>

Figure 30:
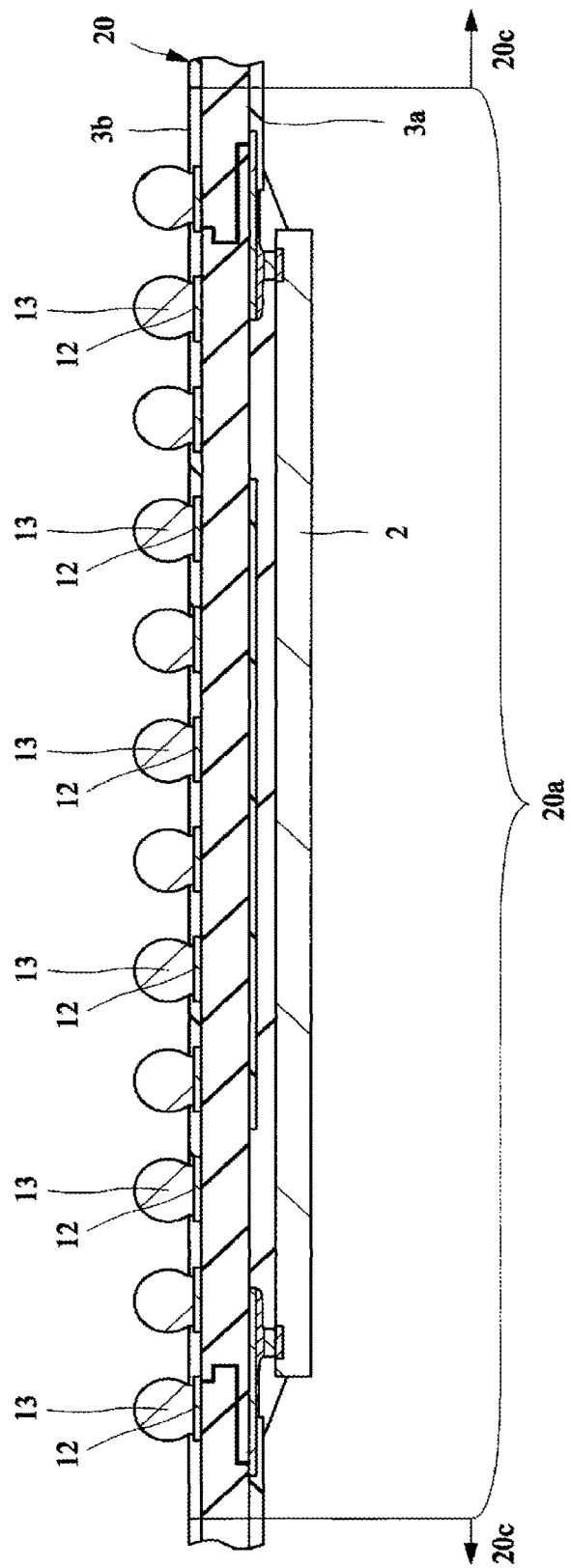
FIG. 30 is an enlarged sectional view showing a state where a solder ball is bonded onto a plurality of lands after reversing the upper and lower sides of the wiring substrate shown in FIG. 29.

Next, in a ball-mounting step shown in FIG. 10, as shown in FIG. 30, a plurality of solder balls 13 is bonded to the lands 12 formed in the lower surface 3b of the wiring substrate 20. FIG. 30 is an enlarged sectional view showing a state where the solder balls are bonded onto the lands after reversing the upper and lower sides of the wiring substrate shown in FIG. 29. In this step, as shown in FIG. 30, after reversing the wiring substrate 20, the solder ball 13 is arranged over each of the lands 12 exposed in the lower surface 3b of the wiring substrate 20, and then the solder ball 13 is heated so as to bond the solder balls 13 to the lands 12. With this step, the solder balls 13 are electrically connected to the semiconductor chip 2 via the wiring substrate 20. However, the technique described in the embodiment is not applied only to the so-called BGA (Ball Grid Array) type semiconductor device with the solder ball bonded thereto. For example, as a variant of the embodiment, the technique described in the embodiment can be applied to the so-called LGA (Land Grid Array) type semiconductor device, which is shipped without forming the solder ball 13 and with the land 12 exposed or with a solder paste applied to the land 12 thinner than the solder ball 13.

<Singulation Step>

Figure 31:
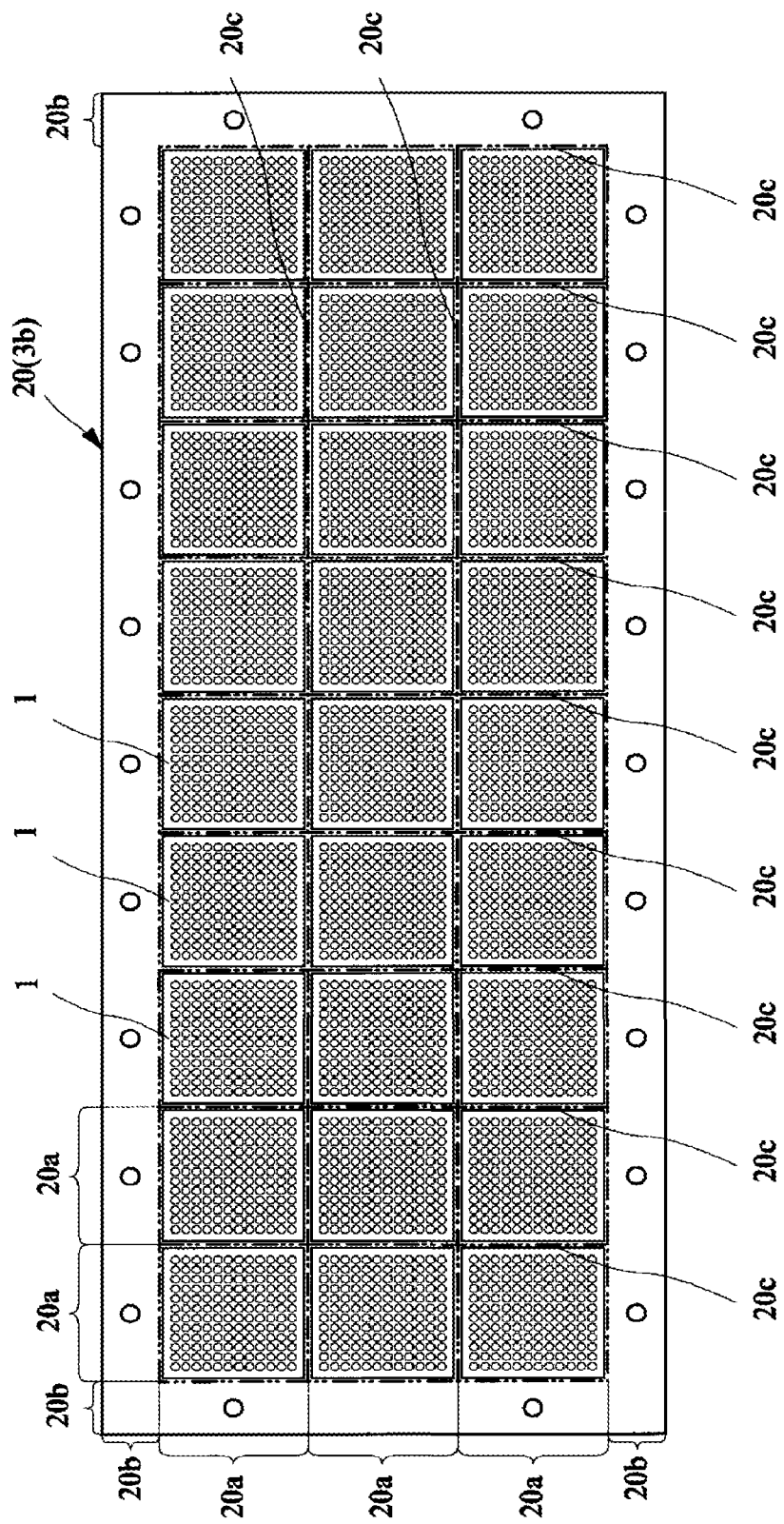
FIG. 31 is a plan view (bottom view) showing a state where a multi-patterned substrate shown in FIG. 29 is singulated.

Next, in a singulation step shown in FIG. 10, the wiring substrate 20 is divided for each product forming region 20a as shown in FIG. 31. FIG. 31 is a plan view (bottom view) showing a state where a multi-patterned wiring substrate shown in FIG. 29 is singulated. In this step, as shown in FIG. 31, the wiring substrate 20 is cut along the dicing line (dicing area) 20c to obtain a plurality of singulated semiconductor devices 1. The cutting method is not limited in particular, and for example, a method of cutting a wiring substrate using a dicing blade (rotary blade) can be used.

Through the respective steps described above, the semiconductor device 1 described using FIGS. 1 to 4 is obtained. Thereafter, the semiconductor device 1 is subjected to a necessary inspection or test, such as visual inspection or an electrical test, and is shipped or mounted onto a non-illustrated mounting substrate.

<Preferred Aspects>

As stated above, the basic configuration of the embodiment has been described, but various variants can be applied to the embodiment described using FIG. 1 to FIG. 31. Hereinafter, preferred aspects of the embodiment will be further described using variants.

<Extension Distance of the Wide Part (Portion)>

Figure 32:
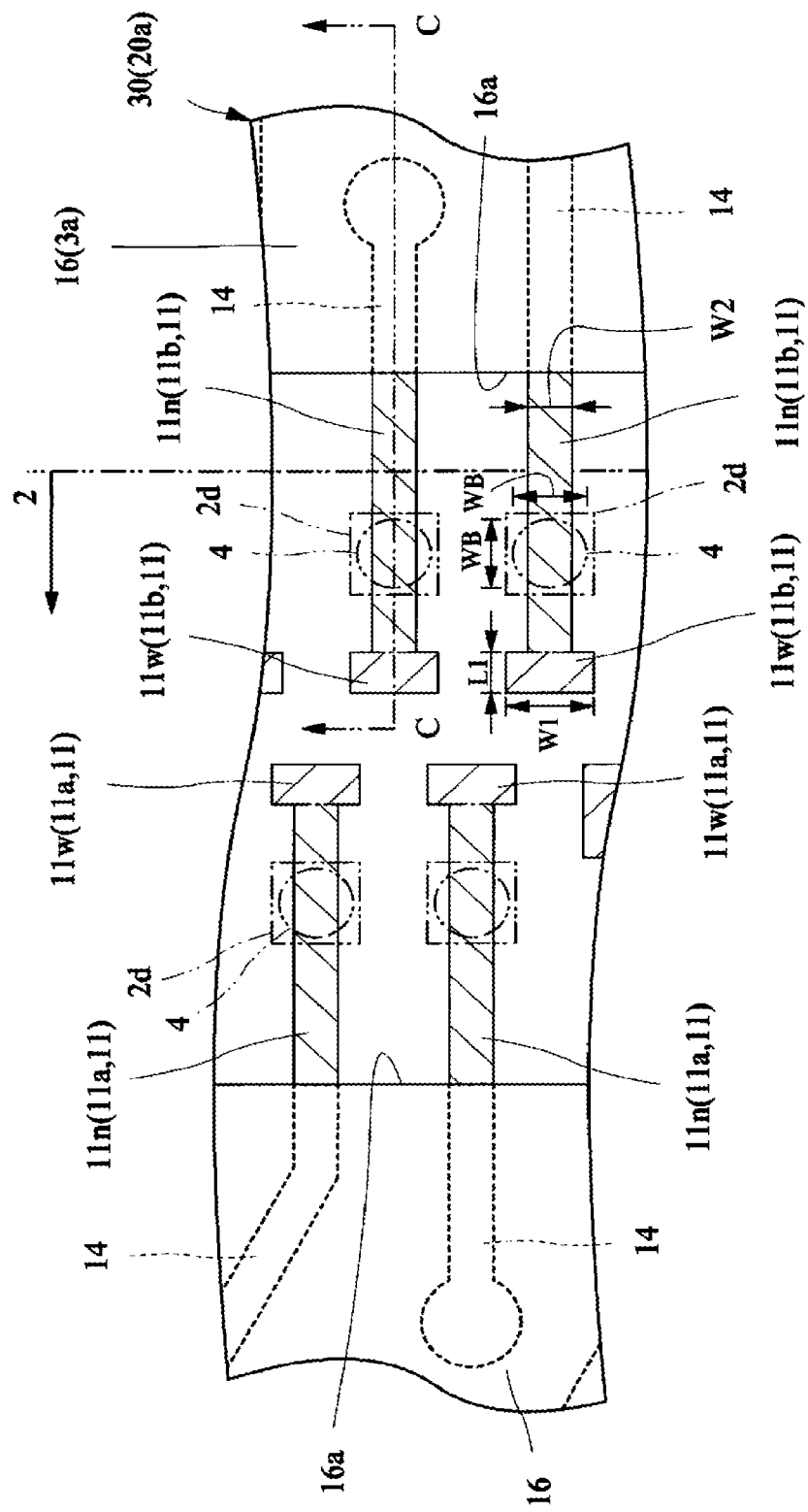
FIG. 32 is an enlarged plan view showing a wiring substrate that is a variant of FIG. 22.
Figure 33:
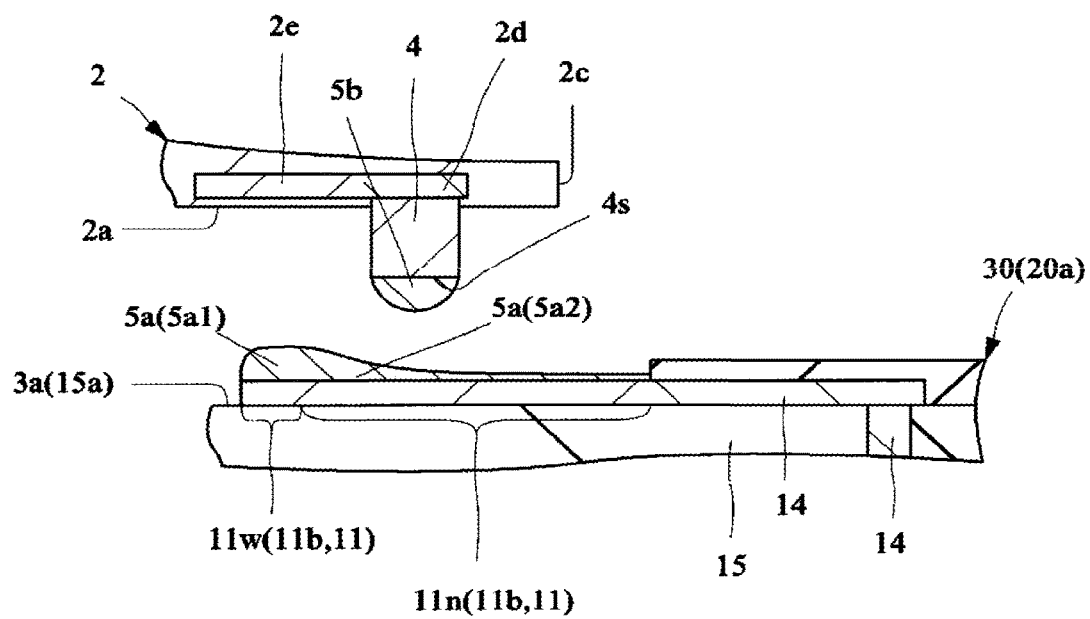
FIG. 33 is an enlarged sectional view along a C-C line of FIG. 32.

First, a length (an extension distance; the length in the extending direction of the terminal 11) L1 of the wide part (portion) 11w shown in FIG. 6 and FIG. 22 is described. FIG. 32 is an enlarged plan view showing a wiring substrate that is a variant of FIG. 22, and FIG. 33 is an enlarged sectional view along a C-C line of FIG. 32. The wiring substrate 30 shown in FIG. 32 differs from the wiring substrate 20 shown in FIG. 22 in that the length L1 of the wide part (portion) 11w is smaller than the width W1. The wiring substrate 30 is otherwise the same as the wiring substrate 20. As described above, when a solder material is applied onto the terminal 11 by printing, for example, and then this solder material is heated to be melted, the melted solder deforms in accordance with the shape of the terminal 11. That is, when there are a portion with a wide width and a portion with a narrow width in the metallic pattern extending in a certain direction, the melted solder tends to easily gather toward the portion with a wide width. This tendency occurs regardless of the length L1 of the wide part (portion) 11w, and therefore if the wide part (portion) 11w is formed, the melted solder can be gathered on the wide part (portion) 11w side. Accordingly, as with the wiring substrate 30 shown in FIG. 32, for example, the wide part (portion) 11w with the length L1 shorter than the width W1 can be applicable. However, depending on the relationship between the plan area of the wide part (portion) 11w and the application quantity of the whole solder material 5a, even over the narrow part (portion) 11n as shown in FIG. 33, the thickness of the solder material 5a2 in a region adjacent to the wide part (portion) 11w may be a thickness nearly equal to that of the solder material 5a1. Moreover, from a view point of expanding the plan area of the wide part (portion) 11w, a method of further increasing the width W1 shown in FIG. 32 can be contemplated. However, if the width W1 is increased, the arrangement pitch (the arrangement pitch in the direction of the width W1) of the terminal 11 in the upper surface 3a of the wiring substrate 30 will increase, and therefore the miniaturization of the semiconductor device becomes difficult. Accordingly, from a view point of suppressing an increase in the arrangement pitch of the terminal 11 and also thinning the thickness of the solder material 5a2 in the region where the projecting electrode 4 is bonded, the length L1 of the wide part (portion) 11w is preferably increased as with the wiring substrate 20 shown in FIG. 22. According to the study of the present inventor, the thickness of the solder material 5a2 arranged over the narrow part (portion) 11n can be stably thinned by setting the length L1 of the wide part (portion) 11w equal to or greater than the width W1.

Moreover, when the length L1 of the wide part (portion) 11w is increased, the following effects can be obtained. That is, in the substrate preparation step shown in FIG. 10, when an electric inspection, such as a conduction test, is performed after forming a wiring in the wiring substrate, the wide part (portion) 11w can be used as a testing pad. Here, as shown in FIG. 8, while the tip end surface 4s of the projecting electrode 4 is a flat surface, the shape at the end of a test pin (a probe needle) used in an electric inspection is sharp (not illustrated). On the other hand, the surface (the upper surface, the surface facing the projecting electrode 4) of the narrow part (portion) in has a flatness lower than the surface (upper surface) of the wide part (portion) 1w. Therefore, by using the wide part (portion) 11w as the testing pad, the contact failure of a test pin can be suppressed. Note that, the wide part (portion) 11w constitutes a part of the terminal 11, and is integrally formed with the narrow part (portion) 11n to which the projecting electrode 4 is bonded. In this manner, by performing a conduction test before mounting the semiconductor chip 2 onto the wiring substrate 20, a defective portion can be detected in advance. Then, if a defective portion is detected in advance, then even when the defective portion cannot be repaired, the loss due to a good semiconductor chip 2 mounted to the product forming region 20a, where the defect has been detected, can be reduced. As described above, when the wide part (portion) 11w is used as the testing pad in the electric inspection step of the wiring substrate 20, which is performed before mounting the semiconductor chip 2, the length L1 is preferably set equal to or greater than 50 μm.

<Distance Between the Pad Rows Arranged in Multiple Rows>

Figure 34:
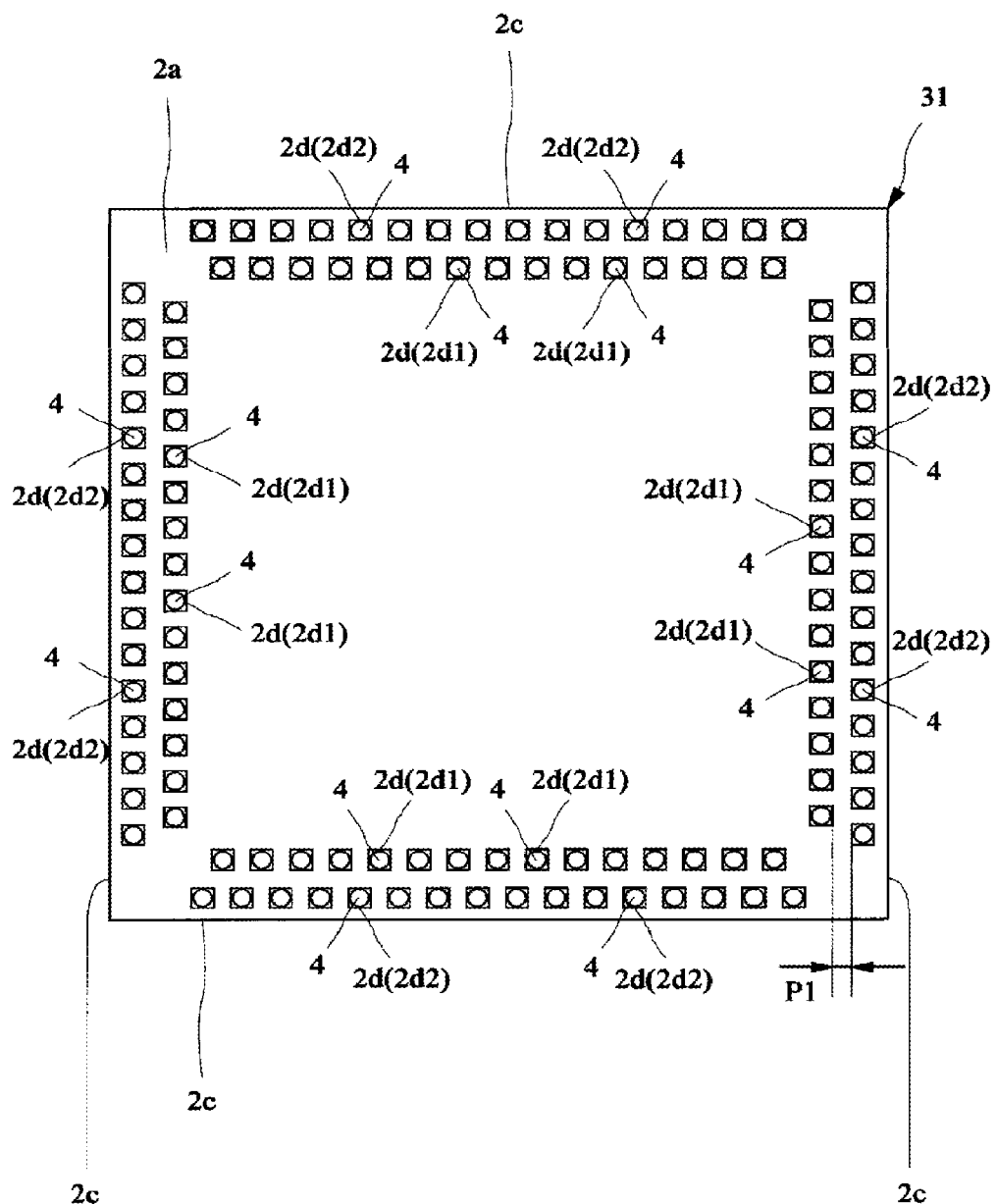
FIG. 34 is a plan view showing a semiconductor chip that is a variant of FIG. 3.
Figure 35:
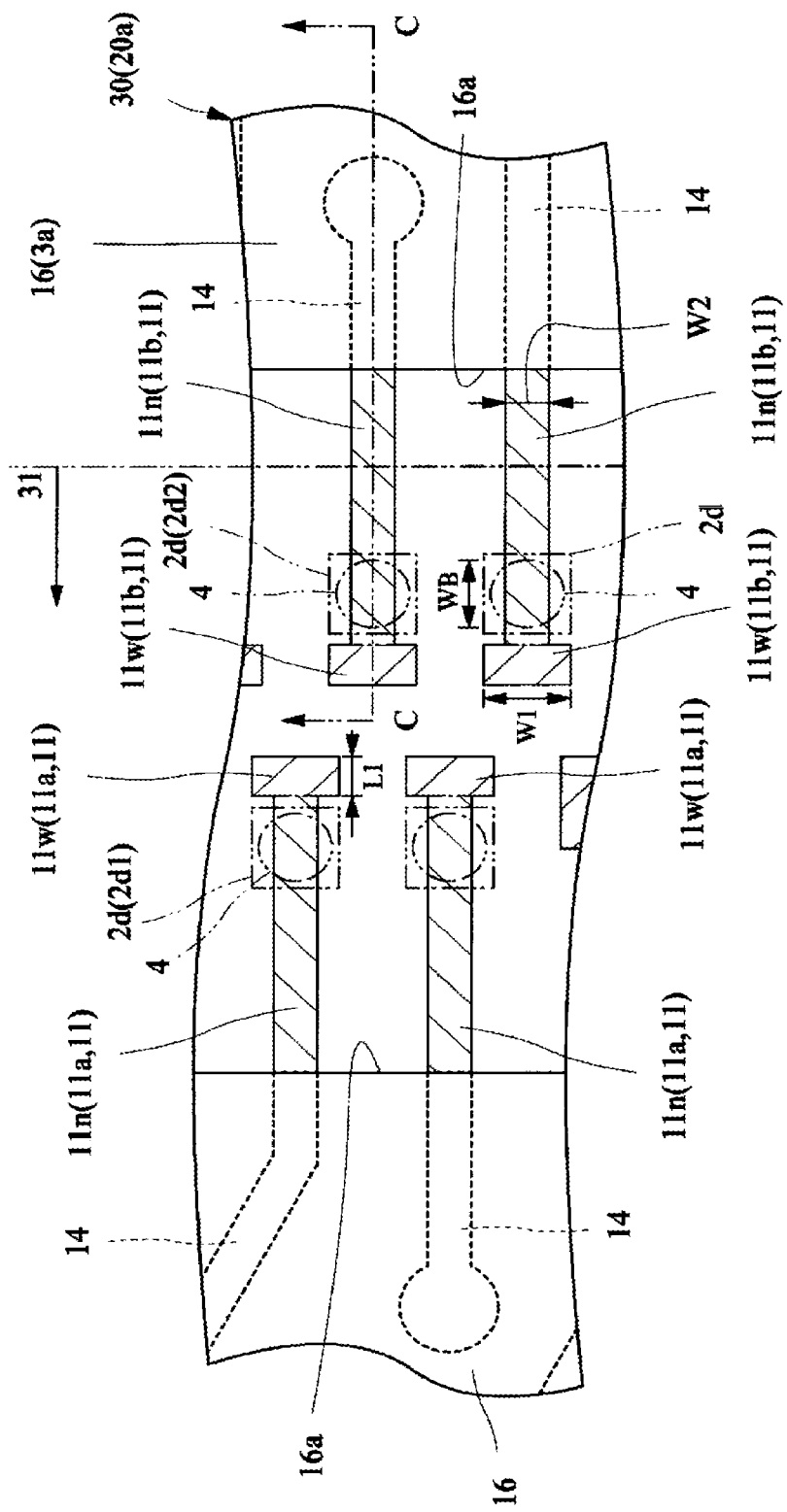
FIG. 35 is an enlarged plan view showing a state where the semiconductor chip shown in FIG. 34 is mounted over the wiring substrate shown in FIG. 32.

Next, as shown in FIG. 3, an inter-pad-row distance when a plurality of pads is arranged in multiple rows is described. FIG. 34 is a plan view showing a semiconductor chip that is a variant of FIG. 3. FIG. 35 is an enlarged plan view showing a state where the semiconductor chip shown in FIG. 34 is mounted onto the wiring substrate shown in FIG. 32, and FIG. 36 is an enlarged sectional view along a C-C line of FIG. 35.

A semiconductor chip 31 shown in FIG. 34 differs from the semiconductor chip 2 shown in FIG. 3 in that the first row pad 2d1 is arranged closer to the side face 2c side of the semiconductor chip 31, respectively, and in that the number of first row pads 2d1 is many. In other words, in the semiconductor chip 31 shown in FIG. 34, while the pads 2d are arranged in multiple rows along the side face 2c, the distance (the inter-pad-row distance) P1 between the first row pad 2d1 and the second row pad 2d2 is shorter than the distance P1 in the semiconductor chip 2 shown in FIG. 3. Moreover, in an example shown in FIG. 34, the number of first row pads 2d1 is more than that in the example shown in FIG. 3. The semiconductor chip 31 is otherwise the same as the semiconductor chip 2 shown in FIG. 3. As with the semiconductor chip 31 shown in FIG. 34, if the distance (the inter-pad-row distance) P1 between the first row pad 2d1 and the second row pad 2d2 is reduced, the first row pad 2d1 can be brought closer to the side face 2c side (the outer edge side of the front surface 2a). Here, the front surface 2a of the semiconductor chip 31 is partitioned into a main circuit forming region (a logic circuit forming region) where a main circuit (core circuit), such as a logic circuit, is formed, and an input/output terminal forming region (I/O region) where the pads 2d are arranged. In the example shown in FIG. 34, the main circuit forming region is formed in the center of the front surface 2a, and the input/output terminal forming region is arranged so as to surround the main circuit forming region. By partitioning the main circuit forming region and the input/output terminal forming region from each other in this manner, even if, for example, a stress is generated in the pads 2d, the influence thereof on the main circuit can be suppressed. Moreover, by arranging the first row pad 2d1 closer to the outer peripheral side of the front surface 2a, the area of the main circuit forming region can be increased. Moreover, by collecting all the pads 2d in the peripheral portion of the front surface 2a, the number of pads 2d that are external terminals can be increased.

Here, when the semiconductor chip 31 shown in FIG. 34 is mounted, for example, onto the wiring substrate 20 shown in FIG. 22, the projecting electrode 4 may overlap with the wide part (portion) 11w because the distance P1 becomes shorter. As with the wiring substrate 20 shown in FIG. 22, when the wide part (portion) 11w is arranged between the projecting electrodes 4 arranged in multiple rows (between the first row pad 2d1 and the second row pad 2d2), the gap between the projecting electrode 4 of the first row and the projecting electrode 4 of the second row needs to be set to a length greater than twice the length L1 of the wide part (portion) 11w. Therefore, if the length L1 of the wide part (portion) 11w is set longer than the width W1 as shown in FIG. 22, the projecting electrode 4 may overlap with the wide part (portion) 11w. Then, when the wide part (portion) 11w is arranged between the projecting electrodes 4 arranged in multiple rows (between the first row pad 2d1 and the second row pad 2d2), the length L1 of the wide part (portion) 11w is preferably set shorter (smaller) than the width W1, as with the wiring substrate 30 shown in FIG. 35. Thus, the projecting electrode 4 can be reliably arranged over the narrow part (portion) 11n.

Figure 36:
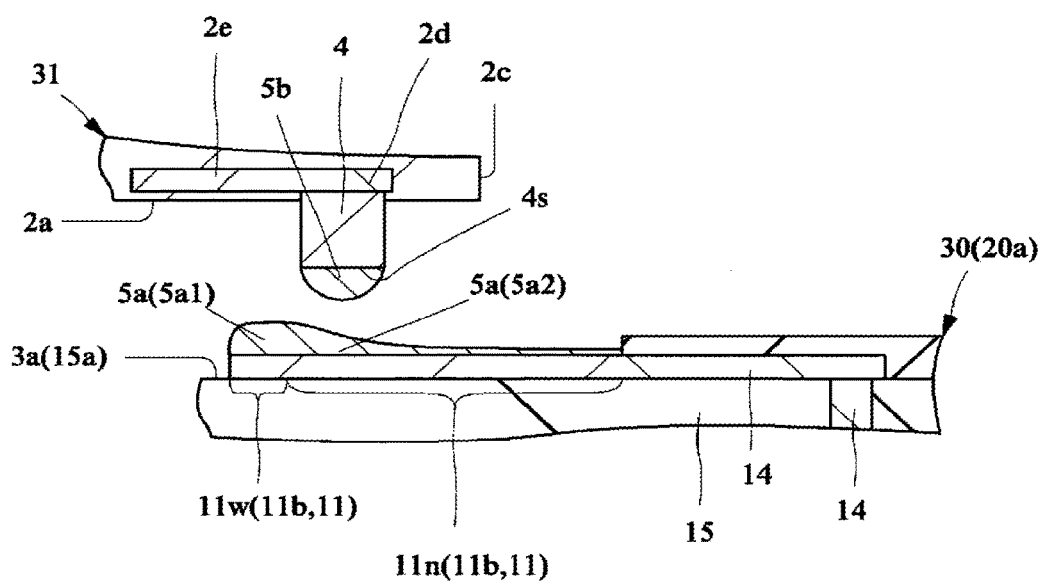
FIG. 36 is an enlarged sectional view along a C-C line of FIG. 35.
Figure 37:
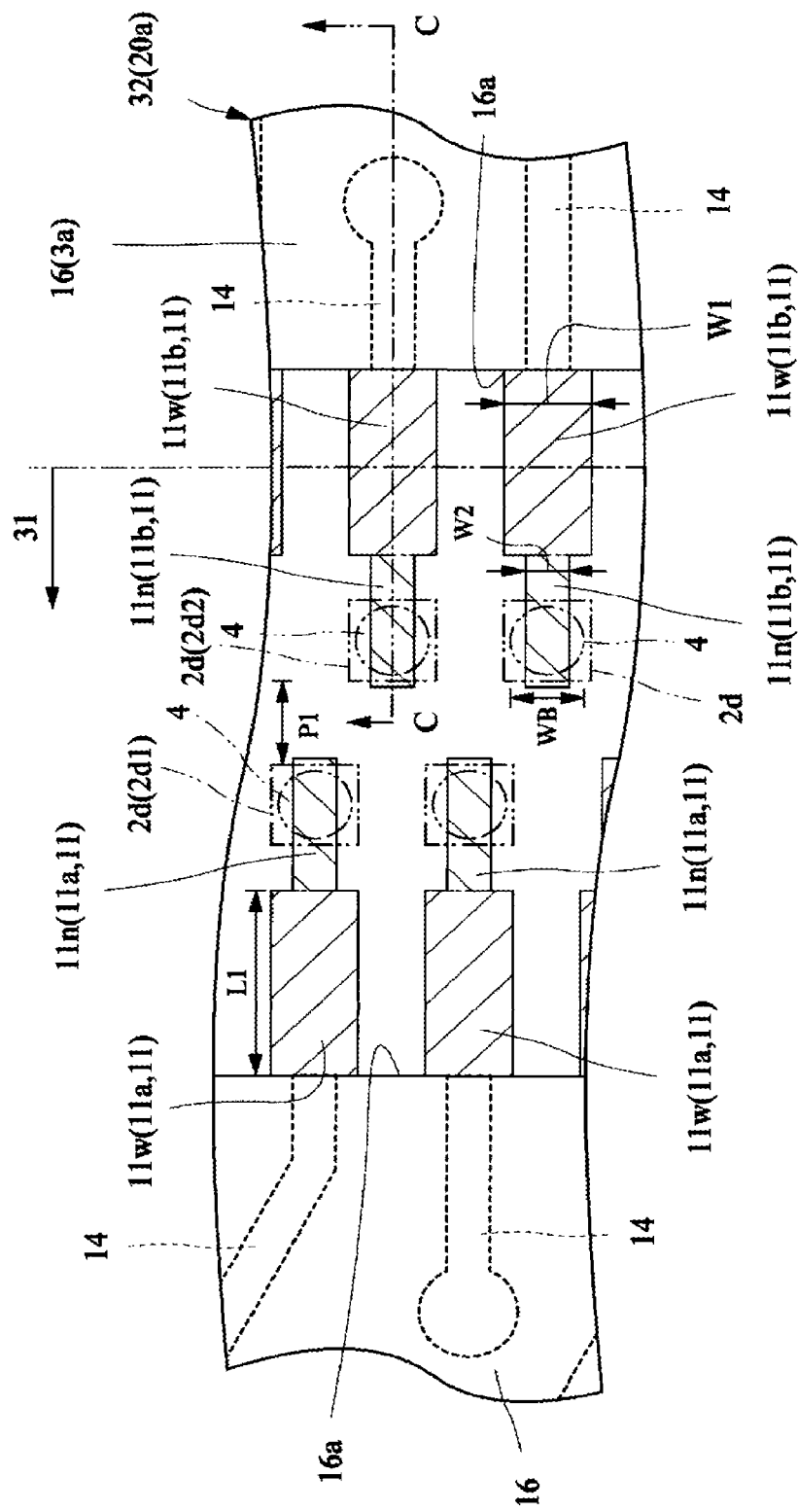
FIG. 37 is an enlarged plan view showing a state where the semiconductor chip shown in FIG. 34 is mounted to a wiring substrate that is another variant of FIG. 22.
Figure 38:
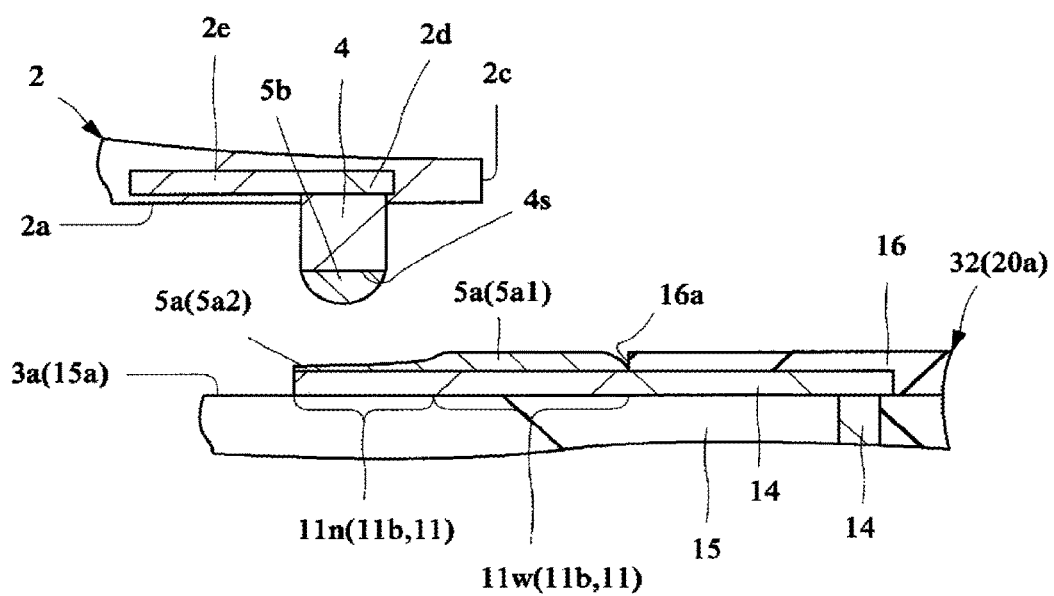
FIG. 38 is an enlarged sectional view along a C-C line of FIG. 37.

However, depending on the relationship between the plan area of the wide part (portion) 11w and the application quantity of the whole solder material 5a, even over the narrow part (portion) 11n as shown in FIG. 36, the thickness of the solder material 5a2 in a region adjacent to the wide part (portion) 11w may be a thickness nearly equal to that of the solder material 5a1. In this case, even if the projecting electrode 4 is bonded onto the narrow part (portion) 11n, the amount of protrusion of the solder material will increase. Moreover, when the length L1 of the wide part (portion) 11w is reduced, in the substrate preparation step shown in FIG. 10 it is difficult to use the wide part (portion) 11w as the testing pad when an electric inspection, such as a conduction test, is performed after forming a wiring in the wiring substrate. Then, taking into consideration the above circumstances, a configuration, in which the projecting electrode 4 is arranged (bonded) onto the narrow part (portion) 11n provided between the wide part (portion)s 11w, is particularly preferable as with the variants shown in FIG. 37 and FIG. 38. FIG. 37 is an enlarged plan view showing a state where the semiconductor chip shown in FIG. 34 is mounted to a wiring substrate that is another variant of FIG. 22, and FIG. 38 is an enlarged sectional view along a C-C line of FIG. 37.

A wiring substrate 32 shown in FIG. 37 differs from the wiring substrate 20 shown in FIG. 22, in that the narrow part (portion)s 11n (the narrow part 11n of the first row terminal 11a and the narrow part 11n of the second row terminal 11b) are arranged between the wide part (portion) 11w which the first row terminal 11a includes and the wide part (portion) 11w which the second column terminal 11b includes, and in that the projecting electrode 4 is arranged over the narrow parts 11n, respectively. In other words, the wiring substrate 32 shown in FIG. 37 differs from the wiring substrate 20 shown in FIG. 22 in that the bonding region for bonding the projecting electrode 4 is arranged between the wide part (portion) 11w of the first row terminal 11a and the second row terminal 11b. Moreover, the wiring substrate 32 differs from the wiring substrate 20 shown in FIG. 22 in that the wide part (portion) 11w extends from the halfway point of the terminal 11 to the boundary of the opening portion 16a of the solder resist film 16.

As with the wiring substrate 32 shown in FIG. 37, when the narrow part (portion) 11n is arranged between the wide part (portion) 11w which the first row terminal 11a includes and the wide part (portion) 11w which the second row terminal 11b includes and the projecting electrode 4 is arranged over the narrow part (portion) 11n, the position and the length L1 of the wide part (portion) 11w can be set regardless of the distance (the inter-pad-row distance) P1 between the first row pad 2d1 and the second row pad 2d2. That is, the pad 2d (the projecting electrode 4) of the semiconductor chip 31 can be arranged without considering the length L1 of the wide part (portion) 11w. Moreover, as shown in FIG. 38, with regard to the thickness of the solder material 5a, the fact that the solder material 5a1 arranged over the wide part (portion) 11w is thicker than that of the solder material 5a2 arranged over the narrow part (portion) 11n is the same as that in the above-described wiring substrate 20. That is, in the case of the wiring substrate 32 shown in FIG. 37 and FIG. 38, even when the semiconductor chip 31 having the narrow distance (the distance between the pad rows) P1 between the first row pad 2d1 and the second row pad 2d2 is mounted, the bonding position of the projecting electrode 4 can be set over the solder material 5a2 that has been formed stably thin. Moreover, in the wiring substrate 32 shown in FIG. 37, the length L1 of the wide part (portion) 11w can be increased regardless of the distance (the inter-pad-row distance) P1 between the first row pad 2d1 and the second row pad 2d2, and therefore for example, in the substrate preparation step shown in FIG. 10, when an electric inspection, such as a conduction test, is performed after forming a wiring in the wiring substrate, the wide part (portion) 11w can be used as the testing pad.

Figure 39:
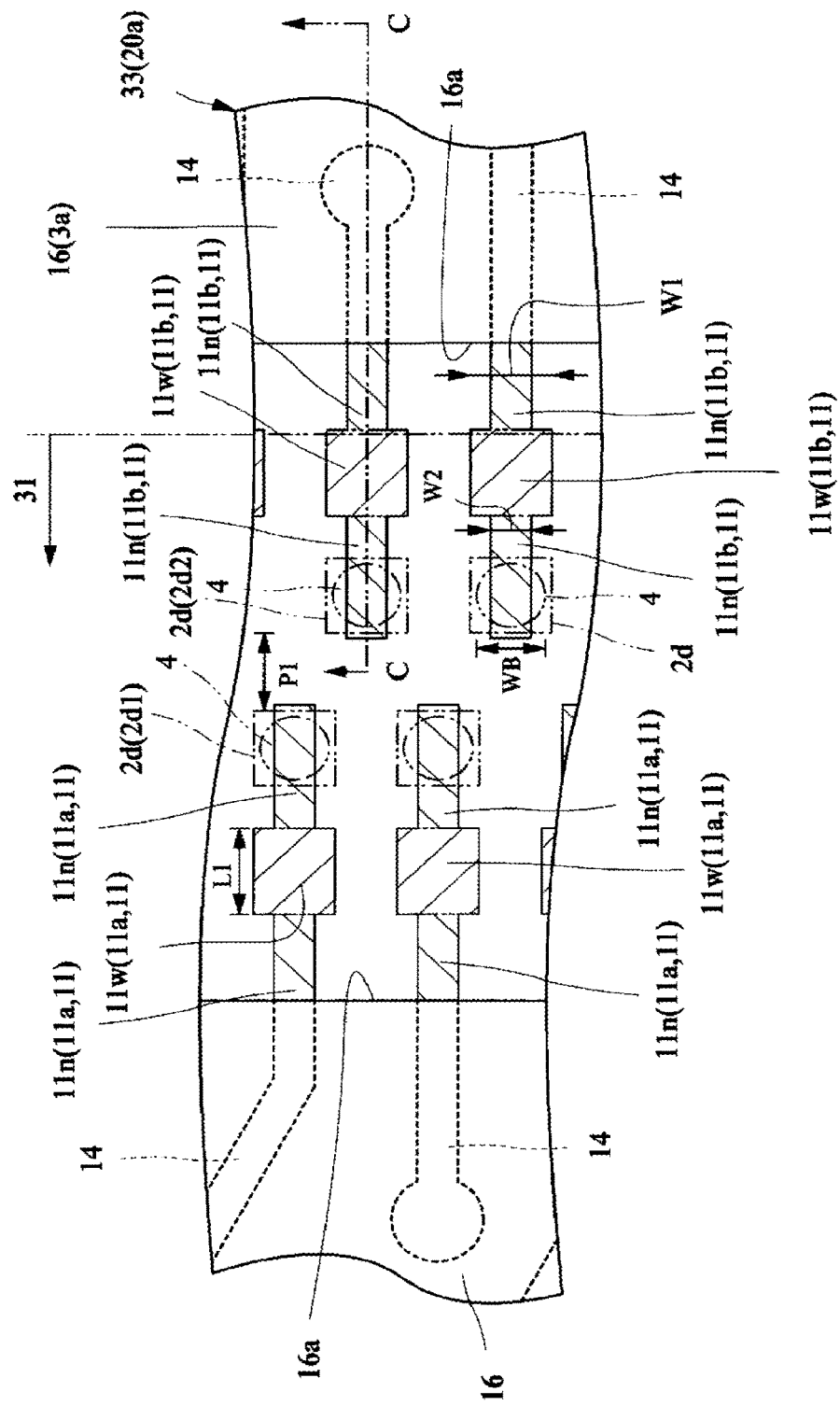
FIG. 39 is an enlarged plan view showing a variant of FIG. 37.
Figure 40:
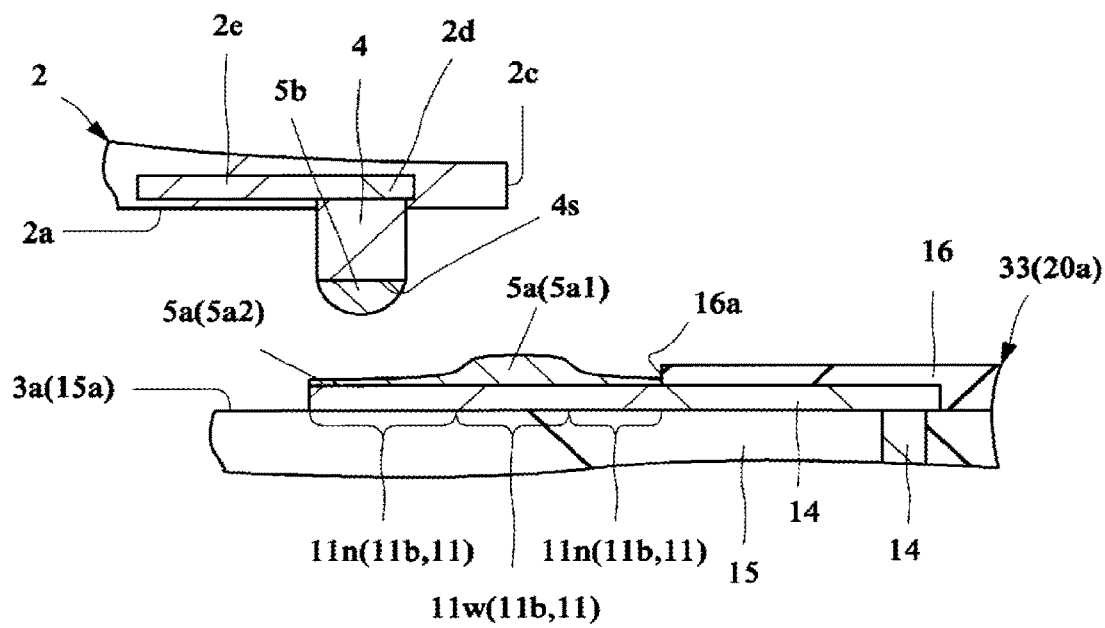
FIG. 40 is an enlarged sectional view along a C-C line of FIG. 39.

Moreover, in each of the terminals 11, from a view point of reducing a variation in the thickness of the solder material 5a2 in the region for bonding the projecting electrode 4, as with the wiring substrate 33 shown in FIG. 39 and FIG. 40 a structure is preferable, in which each of the terminals 11 includes the wide part (portion) 11w sandwiched by the narrow part (portion) 11n. FIG. 39 is an enlarged plan view showing a variant of FIG. 37, and FIG. 40 is an enlarged sectional view along a C-C line of FIG. 29. A wiring substrate 33 shown in FIG. 39 differs from the wiring substrate 32 shown in FIG. 37 in that each of the terminals 11 includes the wide part (portion) 11w sandwiched by the narrow part (portion) 11n. In other words, the wiring substrate 33 differs from the wiring substrate 32 in that the wide part (portion) 11w of the wiring substrate 32 does not extend to the boundary of the opening portion 16a of the solder resist film 16 and the narrow part (portion) 11n is arranged in the boundary of the opening portion. The wiring substrate 33 is otherwise the same as the wiring substrate 32.

As described above, in the embodiment, by utilizing a nature that the melted solder easily gathers to the portion with a wide width over the terminal 11, the heat treatment step is performed after the solder material application step shown in FIG. 10, so that the thickness of the solder material 5a (see FIG. 38) is controlled. Here, when the wide part (portion) 11w is extended to the boundary of the opening portion 16a of the solder resist film 16 as with the wiring substrate 32 shown in FIG. 37, the length L1 of the wide part (portion) 11w varies with the positional accuracy of the opening portion 16a. If the length L1 of the wide part (portion) 11w varies, there is a concern that the thicknesses of the solder material 5a1 and the solder material 5a2 shown in FIG. 38 vary. Then, as shown in FIG. 39, by employing a structure in which, the wide part (portion) 11w does not extend to the boundary of the opening portion 16a of the solder resist film 16 but is sandwiched by the narrow part (portion) 11n, the influence of the positional accuracy of the opening portion 16a can be reduced. That is, by employing a structure having the wide part (portion) sandwiched by the narrow part (portion) 11n, a variation in the area of the wide part (portion) 11w can be reduced. As a result, as shown in FIG. 40, a variation in the thickness of the solder material 5a2 in the region where the projecting electrode 4 is bonded can be reduced.

<Other Variants>

As described above, the present invention made by the present inventor has been described specifically based on the embodiment, but it is obvious that the present invention is not limited to the above embodiment and various modifications may be made without departing from the scope of the invention.

For example, in the above-described embodiment, the embodiment in which each of the terminals 11 includes one wide part (portion) 11w has been described, but for example, as with a wiring substrate 34 shown in FIG. 41, a configuration, in which each of the terminals 11 includes a plurality of (in FIG. 41, two) wide part (portion)s 11w, and in which the projecting electrode 4 is bonded onto the narrow part (portion) 11n between the wide part (portion)s 11w, can be employed. FIG. 41 is an enlarged plan view showing a variant of the wiring substrate shown in FIG. 39. The wiring substrate 34 shown in FIG. 41 differs from the wiring substrate 33 shown in FIG. 39 in that two wide part (portion)s 11w are provided. The wiring substrate 34 is otherwise the same as the wiring substrate 33. When a plurality of wide part (portion)s 11w is provided in one terminal 11 as with the wiring substrate 34, the solder material gathers to each of the wide part (portion)s 11w, and therefore the thickness of the solder material over the narrow part (portion) 11n arranged between the wide part (portion)s 11w can be made stably thin. However, according to the study of the present inventor, the thickness of the solder material 5a2 (see FIG. 40) can be made stably thin by using the wiring substrate 33 shown in FIG. 39 and FIG. 40. Accordingly, from a view point of simplifying the shape of the conductor pattern, the wiring substrate 33 shown in FIG. 39 and FIG. 40 is more preferable. That is, configuration, in which the wide part (portion) 11w is not arranged between the projecting electrodes 4 arranged in multiple rows, is more preferable.

Moreover, for example, the embodiment, in which one edge of the terminal 11 is not connected to other conductor pattern, and in which the other end is connected to the wiring 14, has been described in the above-described embodiment. For example, as with a wiring substrate 35 shown in FIG. 42, the present invention can be applied to a configuration, in which the both ends of the terminal 11 are connected to the wiring 14, respectively. FIG. 42 is an enlarged plan view showing another variant of FIG. 39. The wiring substrate 35 shown in FIG. 42 differs from the wiring substrate 33 shown in FIG. 39 in that the both ends of the terminal 11 are connected to the wiring 14 covered with the solder resist film 16, respectively. The wiring substrate 35 is otherwise the same as the wiring substrate 33. Moreover, a semiconductor chip 36 shown in FIG. 42 is the same as the semiconductor chip 31 shown in FIG. 39 except that the pads 2d (projecting electrodes 4) are arranged in one row. As shown in FIG. 42, when the both ends of the terminal 11 are connected to the wiring 14, respectively, they can be connected to an underlying wiring layer (a wiring in an underlying wiring layer) via either one wiring 14. That is, a via wiring needs to be formed in order to connect to a wiring in an underlying wiring layer electrically, but in the case of the wiring substrate 35, because the both ends of the terminal 11 are connected to the wiring 14, respectively, the degree of freedom of the via wiring layout can be improved. Moreover, the wiring substrate 35, as shown in FIG. 42, is particularly effectively applied to the embodiment in which the semiconductor chip 36 having the pads 2d (projecting electrodes 4) arranged in one row is mounted by flip-chip mounting. As shown in FIG. 42, when the wiring substrate 35 is applied to the semiconductor chip 36 having the pads 2d (projecting electrodes 4) arranged in one row, from a view point of increasing the arrangement pitch of the adjacent wide part (portion)s 11w, it is preferable that the wide part (portion)s 11w are arranged in two rows so as to sandwich an arrangement line along which the pads 2d (projecting electrodes 4) are arranged, and also are arranged so as to align alternately on the opposite side of the arrangement line. With such an arrangement of the terminals, a space between the adjacent wide part (portion)s 11w can be expanded. Accordingly, a space for arranging the narrow part (portion) 11n can be easily secured between the adjacent wide part (portion)s 11w. As a result, by further extending the narrow part (portion) 11n arranged between the wide part (portion)s 11w, the both ends of the terminal 11 can be connected to the wiring 14, respectively.

Moreover, for example, in the above-described embodiment, it has been described that the solder material 5a is formed over the terminal 11 of the wiring substrate 3 by printing (e.g., the method shown in FIG. 13 and FIG. 14), but because this method includes the heat treatment step, the thicknesses of the solder material 5a formed in the wide part (portion) 11w and in the narrow part (portion) 11n among the terminals 11 provided in each chip area (device area) 25a of the prepared wiring substrate 20 differ from each other. That is, the thickness (quantity) of the solder material 5a1 arranged in the wide part (portion) 11w is larger than the thickness (quantity) of the solder material 5a2 arranged in the narrow part (portion) 11n. On the other hand, by employing a plating method (an electrolysis plating method, an electroless plating method) as the method of forming the solder material 5a, the thickness of the solder material 5a1 formed in the wide part (portion) 11w of the terminals 11 can be set the same as the thickness of the solder material 5a2 formed in the narrow part (portion) 11n of the terminals 11. However, because the subsequent chip mounting step includes a heating step, a part of the solder material 5a2 formed in the narrow part (portion) 11n in this chip mounting step moves to the wide part (portion) 11w, and as a result, the quantity of the solder material 5a1 in the wide part (portion) 11w will increase. Therefore, if the projecting electrode 4 is bonded to the wide part (portion) 11w, the solder material might protrude into the periphery thereof. Then, as with the variant in the embodiment, when nickel (Ni) is formed in the tip end surface 4s of the projecting electrode 4, the wettability of the solder material will decrease and therefore the solder material will more likely protrude. From the above, when a wiring substrate, in which the solder material 5a is formed over the terminal 11 using the plating method, is used in the chip mounting step, that is, at the stage in which the wiring substrate is prepared, even if the thickness of the solder material 5a1 arranged in the wide part (portion) 11w is the same as the thickness of the solder material 5a2 arranged in the narrow part (portion) 11n, the projecting electrode 4 is preferably bonded to a region where the solder material 5a is formed thin, i.e., in the bonding region over the narrow part (portion) 11n as with the embodiment, not bonded to the wide part (portion) 11w.

Moreover, for example, the semiconductor device, in which one semiconductor chip 2 is mounted onto the wiring substrate 3 by flip-chip mounting, has been described in the above-described embodiment. But the number of semiconductor chips mounted onto the wiring substrate is not limited to one. For example, the embodiment can be applied to a semiconductor device, such as a SIP (System in Package), in which a plurality of semiconductor chips is mounted. Moreover, for example, the embodiment can be applied to a semiconductor device called a POP (Package on Package) in which another semiconductor device is stacked over the wiring substrate 3.

Moreover, for example, in the above-described embodiment, the embodiment has been described, in which the projecting electrode 4 constituted by, for example, copper (Cu), and formed in a columnar shape is bonded via the solder material 5, but various variants can be applied. Even in the case where a projecting electrode consisted by, for example, gold (Au), and formed by ball-bonding is used, when the relevant projecting electrode, to which a solder material is attached in advance, is bonded to a solder material attached onto the terminal 11, a short-circuit failure may occur depending on the amount of protrusion of the solder material, as described above. Accordingly, by applying the technique described in the embodiment, the short-circuit failure can be suppressed.

The present invention can be applicable to semiconductor devices, in which a bump electrode of a semiconductor chip is connected to a terminal of a substrate via a solder material.

What is claimed is:
1. A semiconductor device comprising:
a wiring substrate including a first surface, a bonding lead formed on the first surface, a second surface opposite to the first surface, and a land formed on the second surface;
a semiconductor chip including a main surface, a bonding pad formed over the main surface, a pillar formed on the bonding pad, and a back surface opposite to the main surface, and mounted over the first surface of the wiring substrate such that the main surface of the semiconductor chip faces the first surface of the wiring substrate; and
a solder material arranged between the pillar of the semiconductor chip and the bonding lead of the wiring substrate,
wherein the bonding lead is extended along a first direction in plan view;
wherein the bonding lead has a first portion and a second portion;
wherein the second portion is adjacent to the first portion;
wherein, in the plan view, a width of the second portion is less than a width of the first portion;
wherein the width of each of the first and second portions is along a second direction crossing the first direction in the plan view; and
wherein the semiconductor chip is mounted over the wiring substrate such that the pillar overlaps with the second portion of the bonding lead.
2. The semiconductor device according to claim 1, wherein the pillar is comprised of copper as a principal component.
3. The semiconductor device according to claim 1, wherein the bonding lead is comprised of copper as a principal component.
4. The semiconductor device according to claim 1, wherein the semiconductor chip is mounted over the wiring substrate such that the pillar does not overlap with the first portion of the bonding lead.
5. The semiconductor device according to claim 1, wherein the wiring substrate includes an insulating film formed over the first surface such that the bonding lead is exposed from the insulating film; and
wherein one end portion of the bonding lead reaches a first boundary of an opening portion of the insulating film, and another end portion of the bonding lead is terminated between the first boundary and a second boundary of the opening portion facing the first boundary.
6. The semiconductor device according to claim 5, wherein the first portion of the bonding lead is further than the second portion of the bonding lead from the first boundary of the opening portion of the insulating film.
7. The semiconductor device according to claim 5, wherein the second portion of the bonding lead is further than the first portion of the bonding lead from the first boundary of the opening portion of the insulating film.
8. The semiconductor device according to claim 1, wherein the wiring substrate includes an insulating film formed over the first surface such that the bonding lead is exposed from the insulating film; and
wherein one end portion of the bonding lead reaches a first boundary of an opening portion of the insulating film, and another end portion of the bonding lead reaches a second boundary of the opening portion facing the first boundary.
9. The semiconductor device according to claim 1, wherein a sealing body is arranged between the semiconductor chip and the wiring substrate.
10. The semiconductor device according to claim 1, wherein the bonding pad of the semiconductor chip is electrically connected with the bonding lead of the wiring substrate via the pillar and the solder material.
11. A semiconductor device comprising:
a wiring substrate including a first surface, a bonding lead formed on the first surface, a second surface opposite to the first surface, and a land formed on the second surface;
a semiconductor chip including a main surface, a bonding pad formed over the main surface, a pillar formed on the bonding pad, and a back surface opposite to the main surface, and mounted over the first surface of the wiring substrate such that the main surface of the semiconductor chip faces the first surface of the wiring substrate; and
a solder material arranged between the pillar of the semiconductor chip and the bonding lead of the wiring substrate, wherein the bonding lead is extended along a first direction in plan view;

wherein the bonding lead has a first portion, a second portion, and a third portion;

wherein the second portion is arranged between the first portion and the third portion;

wherein, in the plan view, a width of the second portion is less than a width of each of the first and third portions;

wherein the width of each of the first, second and third portions is along a second direction crossing the first direction in the plan view; and wherein the semiconductor chip is mounted over the wiring substrate such that the pillar overlaps with the second portion of the bonding lead.

12. The semiconductor device according to claim 11, wherein the pillar is comprised of copper as a principal component.

13. The semiconductor device according to claim 11, wherein the bonding lead is comprised of copper as a principal component.

14. The semiconductor device according to claim 11, wherein the semiconductor chip is mounted over the wiring substrate such that the pillar does not overlap with the first portion of the bonding lead and does not overlap with the third portion of the bonding lead.

15. The semiconductor device according to claim 11, wherein the wiring substrate includes an insulating film formed over the first surface such that the bonding lead is exposed from the insulating film; and wherein one end portion of the bonding lead reaches a first boundary of an opening portion of the insulating film, and another end portion of the bonding lead is terminated between the first boundary and a second boundary of the opening portion facing the first boundary.

16. The semiconductor device according to claim 15, wherein the second portion of the bonding lead is further than the first portion of the bonding lead from the first boundary of the first opening portion of the insulating film; and wherein the third portion of the bonding lead is further than the second portion of the bonding lead from the first boundary of the opening portion of the insulating film.

17. The semiconductor device according to claim 16, wherein a length along the first direction of the third portion of the bonding lead is less than a length along the first direction of the first portion of the bonding lead in the plan view.

18. The semiconductor device according to claim 11, wherein a sealing body is arranged between the semiconductor chip and the wiring substrate.

19. The semiconductor device according to claim 11, wherein the bonding pad of the semiconductor chip is electrically connected with the bonding lead of the wiring substrate via the pillar and the solder material.

* * * * *